(12) United States Patent
Yamazaki et al.

(10) Patent No.: US 10,923,477 B2
(45) Date of Patent: Feb. 16, 2021

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yuta Endo, Kanagawa (JP); Shuhei Nagatsuka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/484,577

(22) PCT Filed: Feb. 6, 2018

(86) PCT No.: PCT/IB2018/050720
§ 371 (c)(1),
(2) Date: Aug. 8, 2019

(87) PCT Pub. No.: WO2018/150292
PCT Pub. Date: Aug. 23, 2018

(65) Prior Publication Data
US 2019/0371798 A1   Dec. 5, 2019

(30) Foreign Application Priority Data

Feb. 17, 2017  (JP) .................................. 2017-027571
Feb. 17, 2017  (JP) .................................. 2017-027739

(51) Int. Cl.
*H01L 29/786*   (2006.01)
*H01L 27/108*   (2006.01)
(Continued)

(52) U.S. Cl.
CPC .... *H01L 27/10805* (2013.01); *H01L 23/5226* (2013.01); *H01L 23/5283* (2013.01);
(Continued)

(58) Field of Classification Search
CPC ............. H01L 29/7869; H01L 21/8234; H01L 21/8242; H01L 27/1156; H01L 29/792
See application file for complete search history.

(56) References Cited

U.S. PATENT DOCUMENTS

| 8,384,080 B2 | 2/2013 | Taniguchi et al. |
| 8,455,868 B2 | 6/2013 | Yamazaki et al. |

(Continued)

FOREIGN PATENT DOCUMENTS

| CN | 102804360 A | 11/2012 |
| CN | 102812547 A | 12/2012 |

(Continued)

OTHER PUBLICATIONS

International Search Report (Application No. PCT/IB2018/050720) dated May 1, 2018.
(Continued)

*Primary Examiner* — Thomas L Dickey
(74) *Attorney, Agent, or Firm* — Fish & Richardson P.C.

(57) ABSTRACT

A semiconductor device including a first oxide including a first region and a second region adjacent to each other and a third region and a fourth region with the first region and the second region sandwiched between the third region and the fourth region, a second oxide over the first region, a first insulator over the second oxide, a first conductor over the first insulator, a second insulator over the second oxide and on side surfaces of the first insulator and the first conductor, a third insulator over the second region and on a side surface of the second insulator, a second conductor over the second region with the third insulator positioned between the sec-
(Continued)

ond region and the second conductor and on the side surface of the second insulator with the third insulator positioned between the side surface of the second insulator and the second conductor, and a fourth insulator covering the first oxide, the second oxide, the first insulator, the first conductor, the second insulator, the third insulator, and the second conductor and in contact with the third region and the fourth region.

21 Claims, 41 Drawing Sheets

(51) Int. Cl.
| | |
|---|---|
| H01L 23/522 | (2006.01) |
| H01L 23/528 | (2006.01) |
| H01L 49/02 | (2006.01) |
| H01L 29/08 | (2006.01) |
| H01L 29/24 | (2006.01) |
| H01L 29/66 | (2006.01) |
| H01L 21/02 | (2006.01) |
| H01L 21/027 | (2006.01) |
| H01L 21/465 | (2006.01) |

(52) U.S. Cl.
CPC .... *H01L 27/1085* (2013.01); *H01L 27/10873* (2013.01); *H01L 27/10897* (2013.01); *H01L 28/60* (2013.01); *H01L 29/0847* (2013.01); *H01L 29/24* (2013.01); *H01L 29/66969* (2013.01); *H01L 29/7869* (2013.01); *H01L 29/78648* (2013.01); *H01L 29/78696* (2013.01); *H01L 21/0274* (2013.01); *H01L 21/02178* (2013.01); *H01L 21/02266* (2013.01); *H01L 21/02565* (2013.01); *H01L 21/02631* (2013.01); *H01L 21/465* (2013.01)

(56) References Cited

U.S. PATENT DOCUMENTS

| | | | |
|---|---|---|---|
| 8,547,771 B2 | 10/2013 | Koyama | |
| 8,692,252 B2 | 4/2014 | Takata et al. | |
| 8,709,889 B2 | 4/2014 | Saito | |
| 8,946,709 B2 | 2/2015 | Kato et al. | |
| 9,029,929 B2 | 5/2015 | Saito | |
| 9,230,970 B2 | 1/2016 | Kato et al. | |
| 9,349,735 B2 | 5/2016 | Yamazaki et al. | |
| 9,472,680 B2 | 10/2016 | Yoneda et al. | |
| 9,515,082 B2* | 12/2016 | Arigane | H01L 29/40117 |
| 9,685,560 B2 | 6/2017 | Yamazaki et al. | |
| 9,947,800 B2 | 4/2018 | Yamazaki et al. | |
| 9,991,265 B2 | 6/2018 | Yamazaki et al. | |
| 10,461,101 B2 | 10/2019 | Endo | |
| 10,504,920 B2 | 12/2019 | Matsukura | |
| 2011/0156027 A1 | 6/2011 | Yamazaki et al. | |
| 2011/0227074 A1 | 9/2011 | Kato et al. | |
| 2012/0292615 A1 | 11/2012 | Saito | |
| 2016/0260835 A1* | 9/2016 | Yamazaki | H01L 21/02565 |
| 2018/0286864 A1 | 10/2018 | Yamazaki et al. | |

FOREIGN PATENT DOCUMENTS

| | | |
|---|---|---|
| JP | 2011-124360 A | 6/2011 |
| JP | 2011-138934 A | 7/2011 |
| JP | 2011-151383 A | 8/2011 |
| JP | 2011-216879 A | 10/2011 |
| JP | 2012-256877 A | 12/2012 |
| JP | 2012-257187 A | 12/2012 |
| JP | 2015-185613 A | 10/2015 |
| JP | 2016-174147 A | 9/2016 |
| KR | 2011-0105729 A | 9/2011 |
| KR | 2012-0094146 A | 8/2012 |
| TW | 201140808 | 11/2011 |
| TW | 201208043 | 2/2012 |
| WO | WO-2011/077967 | 6/2011 |
| WO | WO-2011/114919 | 9/2011 |

OTHER PUBLICATIONS

Written Opinion (Application No. PCT/IB2018/050720) dated May 1, 2018.

Tsuda.S et al., "First Demonstration of FinFET Split-Gate MONOS for High-Speed and Highly-Reliable Embedded Flash in 16/14nm-node and beyond", IEDM 16: Technical Digest of International Electron Devices Meeting, Dec. 3, 2016, pp. 280-283.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn—oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn—Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium.Gallium.Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn—Oxide TFTs Based on Variable Frame Frequency", SID Digest '10 : SID International Symposium Digest of Technical Papers, May 23, 2010, vol. 41, No. 1, pp. 626-629.

* cited by examiner

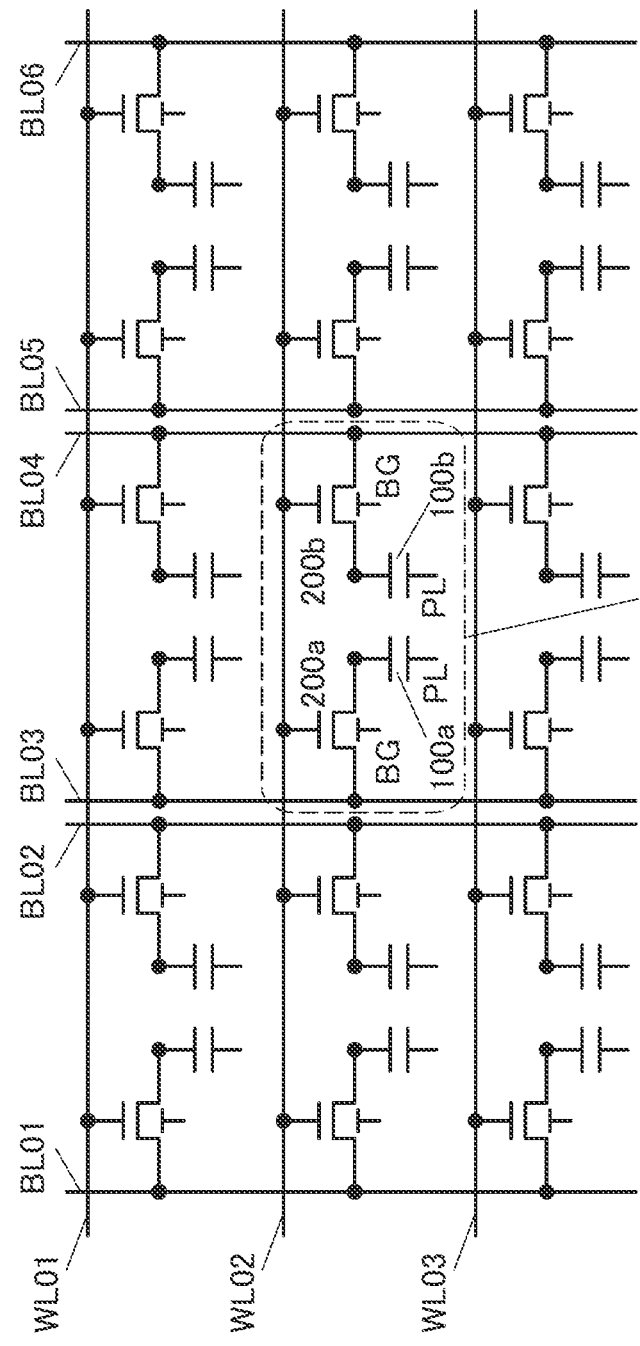
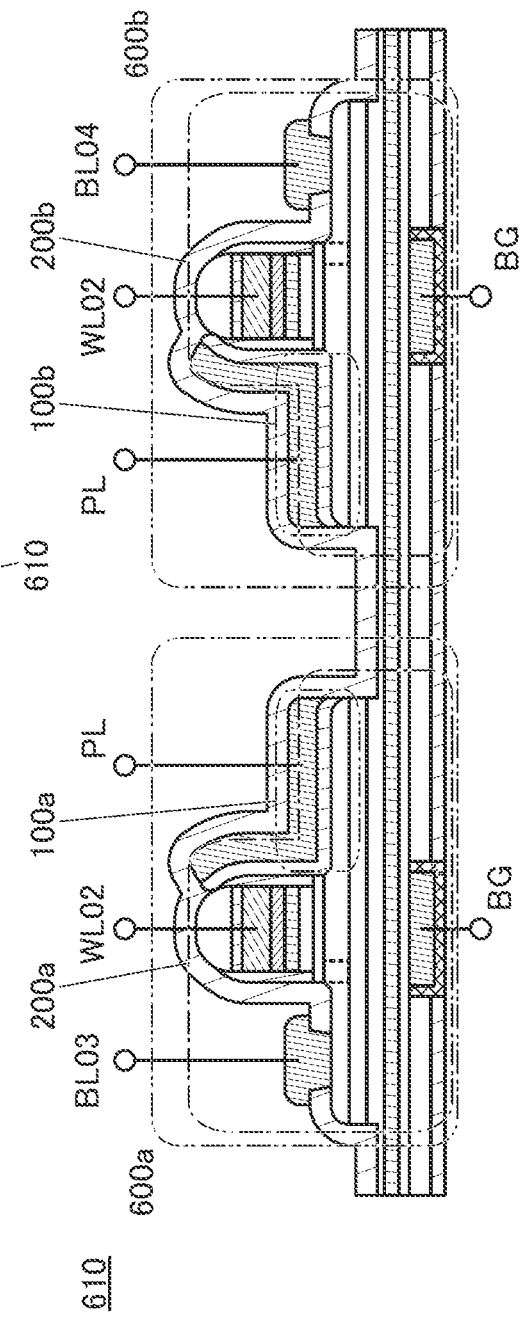
FIG. 24A
FIG. 24B

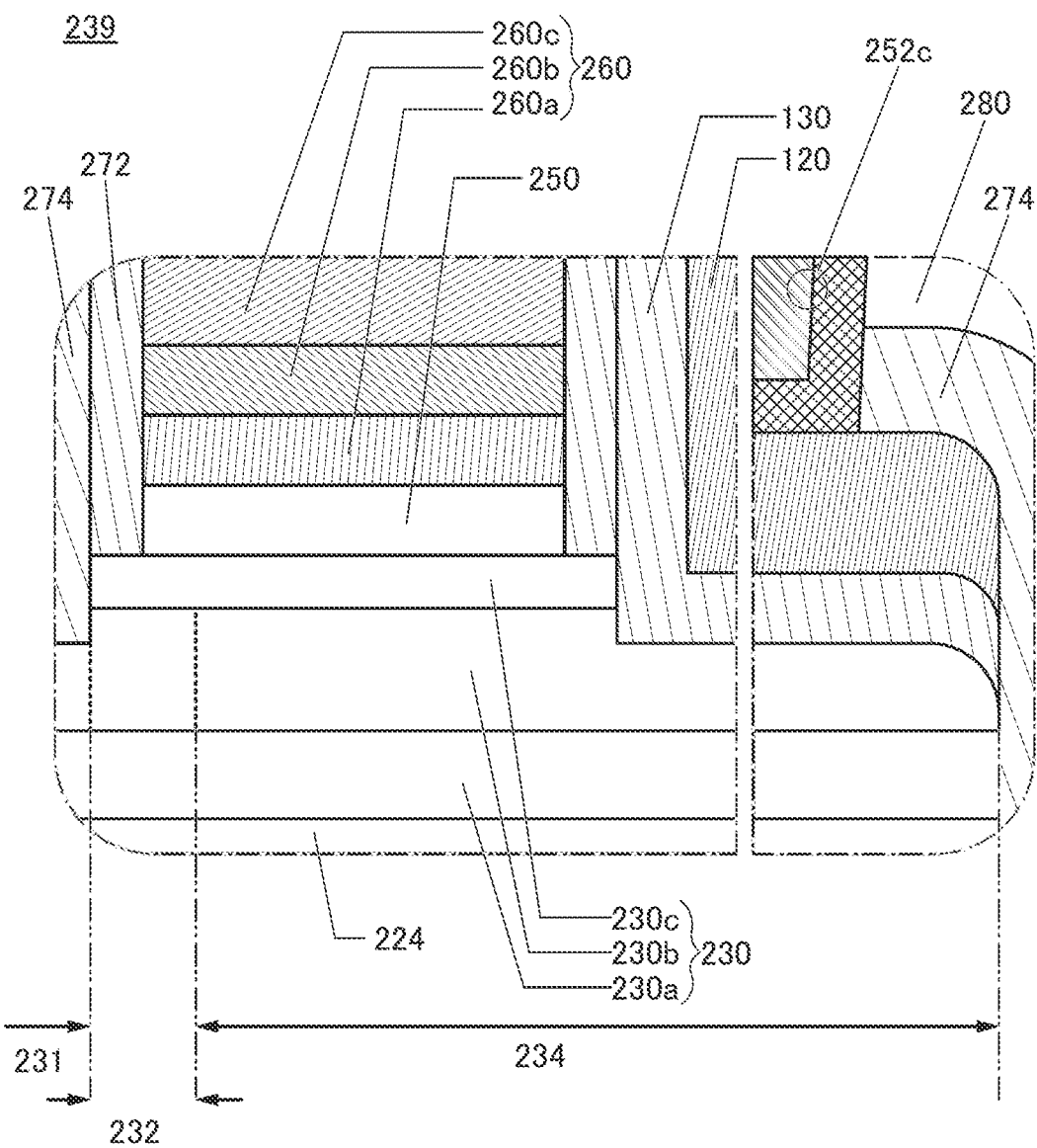

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2018/050720, filed on Feb. 6, 2018, which claims the benefit of foreign priority applications filed in Japan as Application Nos. 2017-027571 and 2017-027739 on Feb. 7, 2017, all of which are incorporated by reference.

TECHNICAL FIELD

One embodiment of the present invention relates to a semiconductor device and a manufacturing method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has attracted attention. The transistor is used in a wide range of electronic devices such as an integrated circuit (IC) or an image display device (also simply referred to as a display device). A silicon-based semiconductor material is widely known as a material for a semiconductor thin film which can be used in the transistor; in addition, an oxide semiconductor has attracted attention as another material.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

In addition, a technique in which oxide semiconductor layers with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the productivity of a semiconductor device including an integrated circuit is required to be improved.

Examples of oxide semiconductors include not only a single-component metal oxide, such as indium oxide or zinc oxide, but also a multi-component metal oxide. In the multi-component metal oxide, in particular, an In—Ga—Zn oxide (hereinafter also referred to as IGZO) has been actively studied.

From the studies on IGZO, in the oxide semiconductor, a c-axis aligned crystalline (CAAC) structure and a nanocrystalline (nc) structure, which are not single crystal nor amorphous, have been found (see Non-Patent Documents 1 to 3). In Non-Patent Documents 1 and 2, a technique for forming a transistor using an oxide semiconductor having a CAAC structure is disclosed. Moreover, Non-Patent Documents 4 and 5 disclose that even in an oxide semiconductor which has lower crystallinity than those of the CAAC structure and the nc structure, a fine crystal is included.

In addition, a transistor which includes IGZO as an active layer has extremely low off-state current (see Non-Patent Document 6), and LSI and display utilizing the characteristics have been reported (see Non-Patent Documents 7 and 8).

REFERENCES

Patent Documents

[Patent Document 1] Japanese Published Patent Application No. 2012-257187
[Patent Document 2] Japanese Published Patent Application No. 2011-124360
[Patent Document 3] Japanese Published Patent Application No. 2011-138934

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04 ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

DISCLOSURE OF INVENTION

An object of one embodiment of the present invention is to provide a semiconductor device that can be miniaturized or highly integrated. Another object of one embodiment of the present invention is to provide a semiconductor device with high productivity. Another object of one embodiment of the present invention is to provide a semiconductor device with high design flexibility. Another object of one embodiment of the present invention is to provide a low-power semiconductor device.

Another object of one embodiment of the present invention is to provide a semiconductor device whose manufacturing process is simplified and a method for manufacturing the same. Another object of one embodiment of the present invention is to provide a semiconductor device whose area is reduced and a method for manufacturing the same.

Another object of one embodiment of the present invention is to provide a semiconductor device having favorable electrical characteristics. Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first oxide including a first region and a second region adjacent to each other and a third region and a fourth region with the first region and the second region sandwiched between the third region and the fourth region, a second oxide over the first region, a first insulator over the second oxide, a first conductor over the first insulator, a second insulator over the second oxide and on side surfaces of the first insulator and the first conductor, a third insulator over the second region and on a side surface of the second insulator, a second conductor over the second region with the third insulator positioned between the second region and the second conductor and on the side surface of the second insulator with the third insulator positioned between the side surface of the second insulator and the second conductor, and a fourth insulator covering the first oxide, the second oxide, the first insulator, the first conductor, the second insulator, the third insulator, and the second conductor and in contact with the third region and the fourth region.

One embodiment of the present invention is a semiconductor device including a transistor, a capacitor, a first oxide including a first region and a second region adjacent to each other and a third region and a fourth region with the first region and the second region sandwiched between the third region and the fourth region, a second oxide over the first region, a first insulator over the second oxide, a first conductor over the first insulator, a second insulator over the second oxide and on side surfaces of the first insulator and the first conductor, a third insulator over the second region and on a side surface of the second insulator, a second conductor over the second region with the third insulator positioned between the second region and the second conductor and on the side surface of the second insulator with the third insulator positioned between the side surface of the second insulator and the second conductor, and a fourth insulator covering the first oxide, the second oxide, the first insulator, the first conductor, the second insulator, the third insulator, and the second conductor and in contact with the third region and the fourth region. Part of the first region serves as a channel formation region of the transistor. The first insulator serves as a gate insulating film of the transistor. The first conductor serves as a gate electrode of the transistor. The second region serves as a first electrode of the capacitor. The third insulator serves as a dielectric of the capacitor. The second conductor serves as a second electrode of the capacitor.

In the above, the fourth region is adjacent to the second region, the third region serves as one of a source and a drain of the transistor, and the second region and the fourth region serve as the other of the source and the drain of the transistor.

In the above, the first oxide is provided over a third conductor, and a bottom surface of the fourth region is in contact with a top surface of the third conductor.

One embodiment of the present invention is a semiconductor device including a first oxide including a first region and a second region and a third region with the first region sandwiched therebetween, a second oxide over the first region, a first insulator over the second oxide, a first conductor over the first insulator, a second insulator over the second oxide and on side surfaces of the first insulator and the first conductor, a third insulator over the second region and on a side surface of the second insulator, a second conductor over the second region with the third insulator positioned between the second region and the second conductor and on the side surface of the second insulator with the third insulator positioned between the side surface of the second insulator and the second conductor, and a fourth insulator covering the first oxide, the second oxide, the first insulator, the first conductor, the second insulator, the third insulator, and the second conductor and in contact with the third region.

One embodiment of the present invention is a semiconductor device including a transistor, a capacitor, a first oxide including a first region and a second region and a third region with the first region sandwiched therebetween, a second oxide over the first region, a first insulator over the second oxide, a first conductor over the first insulator, a second insulator over the second oxide and on side surfaces of the first insulator and the first conductor, a third insulator over the second region and on a side surface of the second insulator, a second conductor over the second region with the third insulator positioned between the second region and the second conductor and on the side surface of the second insulator with the third insulator positioned between the side surface of the second insulator and the second conductor, and a fourth insulator covering the first oxide, the second oxide, the first insulator, the first conductor, the second insulator, the third insulator, and the second conductor and in contact with the third region. Part of the first region serves as a channel formation region of the transistor. The first insulator serves as a gate insulating film of the transistor. The first conductor serves as a gate electrode of the transistor. The second region serves as a first electrode of the capacitor. The third insulator serves as a dielectric of the capacitor. The second conductor serves as a second electrode of the capacitor.

In the above, a carrier density of the first region is lower than a carrier density of the third region.

In the above, the first oxide includes In, an element M (M is Al, Ga, Y, or Sn), and Zn.

In the above, the second oxide includes In, an element M (M is Al, Ga, Y, or Sn), and Zn.

In the above, the second insulator includes an oxide containing one of or both aluminum and hafnium.

According to one embodiment of the present invention, a semiconductor device that can be miniaturized or highly integrated is provided. According to one embodiment of the present invention, a semiconductor device with high productivity is provided. A semiconductor device with high design flexibility is provided. A low-power semiconductor device is provided.

According to one embodiment of the present invention, a semiconductor device whose manufacturing process is simplified and a method for manufacturing the same are provided. According to one embodiment of the present invention, a semiconductor device whose area is reduced and a method for manufacturing the same are provided.

According to one embodiment of the present invention, a semiconductor device having favorable electrical characteristics is provided. A semiconductor device capable of retaining data for a long time is provided. A semiconductor device capable of high-speed data writing is provided. A novel semiconductor device is provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

In the accompanying drawings:

FIGS. 24A and 24B are a circuit diagram and a cross-sectional view of a semiconductor device of one embodiment of the present invention;

FIG. 27 is a cross-sectional view of a semiconductor device of one embodiment of the present invention;

BEST MODE FOR CARRYING OUT THE INVENTION

Figure 1A:
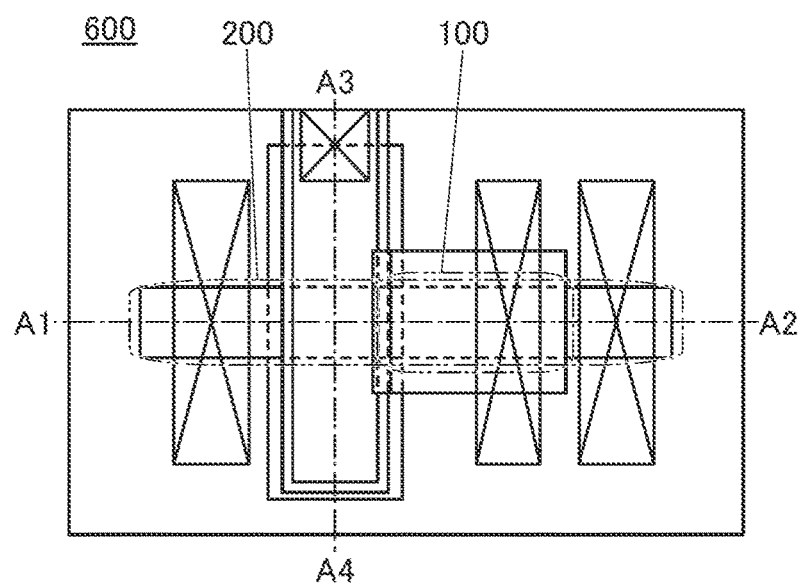
FIGS. 1A to 1C are a top view and cross-sectional views of a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. Furthermore, the same hatching pattern is applied to portions having similar functions, and the portions are not especially denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with the direction in which each component is described. Thus, there is no limitation on terms used in this specification, and description can be made appropriately depending on the situation.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allow a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows in a semiconductor layer of the transistor.

Furthermore, functions of a source and a drain might be switched when a transistor of opposite polarity is employed or the direction of current flow is changed in circuit operation, for example. Therefore, the terms "source" and "drain" can be switched in some cases in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering the side surface of a semiconductor, an effective channel width is greater than an apparent channel width, and its influence cannot be ignored in some cases. For example, in a miniaturized transistor having a gate electrode covering the side surface of a semiconductor, the proportion of a channel formation region formed in the side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer".

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that in this specification, a barrier film refers to a film having a function of inhibiting the penetration of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including an oxide or an oxide semiconductor.

Embodiment 1

An example of a semiconductor device including a transistor 200 of one embodiment of the present invention is described below.

<Structure Example 1 of Semiconductor Device>

Figure 1C:
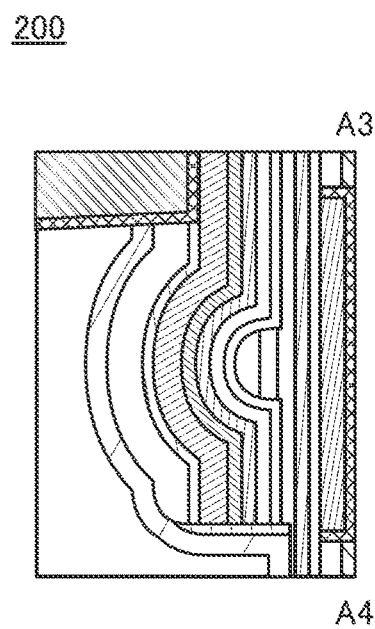
Figure 1B:
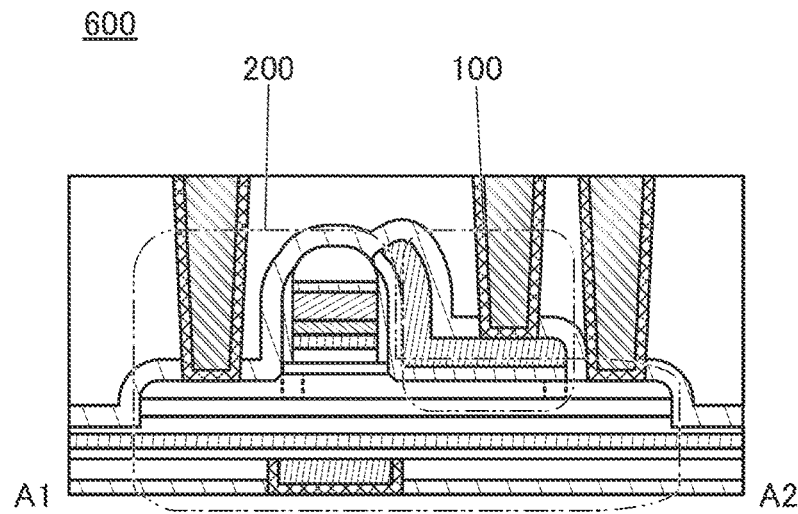

FIGS. 1A to 1C are a top view and cross-sectional views illustrating the transistor 200 and a capacitor 100 and the periphery of the transistor 200 of one embodiment of the present invention. Note that in this specification, a semiconductor device including one capacitor and at least one transistor is referred to as a cell.

FIG. 1A is a top view of a cell 600 including the transistor 200 and the capacitor 100. FIGS. 1B and 1C are cross-sectional views of the cell 600. FIG. 1B is a cross-sectional view taken along dashed-dotted line A1-A2 in FIG. 1A, which corresponds to a cross-sectional view in the channel length direction of the transistor 200. FIG. 1C is a cross-sectional view taken along dashed-dotted line A3-A4 in FIG. 1A, which corresponds to a cross-sectional view in the channel width direction of the transistor 200. For simplification of the drawing, some components are not illustrated in the top view in FIG. 1A. Note that for simplification of the drawing, only some components are denoted by reference numerals in FIGS. 1A to 1C. Furthermore, components of the cell 600 illustrated in FIGS. 1A to 1C are denoted by reference numerals in FIGS. 5A to 5C, and detailed description thereof is given below.

The transistor 200 and the capacitor 100 are provided on the same layer in the cell 600 of FIGS. 1A to 1C, whereby part of components in the transistor 200 can be used as part of components in the capacitor 100. That is, part of the components of the transistor 200 may function as part of the components of the capacitor 100.

Furthermore, part of the capacitor 100 or the entire capacitor 100 overlaps with the transistor 200, so that the total area of the projected area of the transistor 200 and the projected area of the capacitor 100 can be reduced.

Figure 2A:
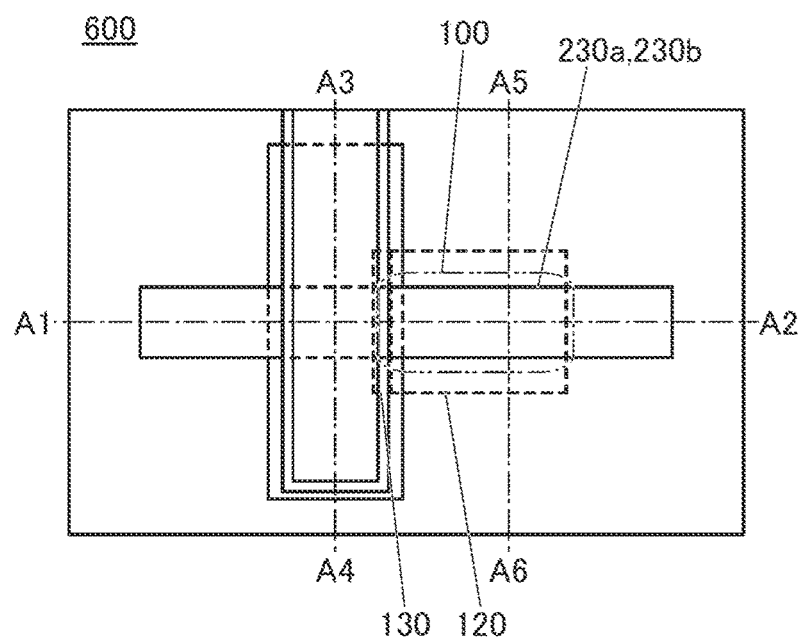
FIGS. 2A to 2D are top views and cross-sectional views of semiconductor devices of embodiments of the present invention.
Figure 2B:
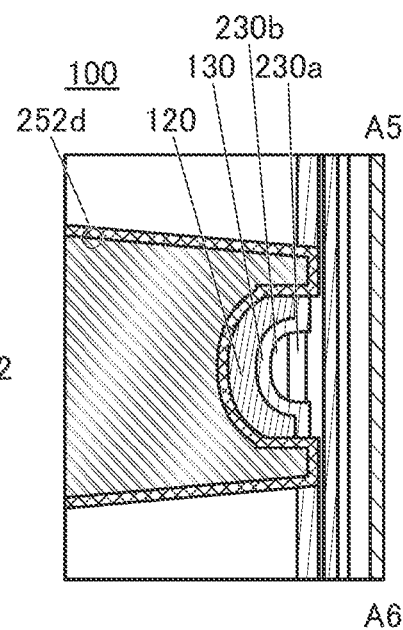
Figure 2C:
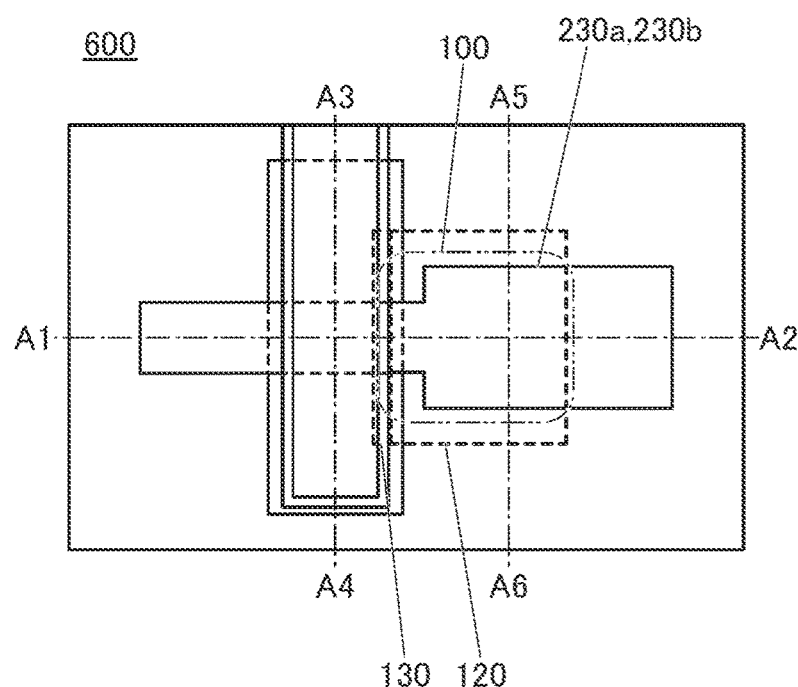
Figure 2D:
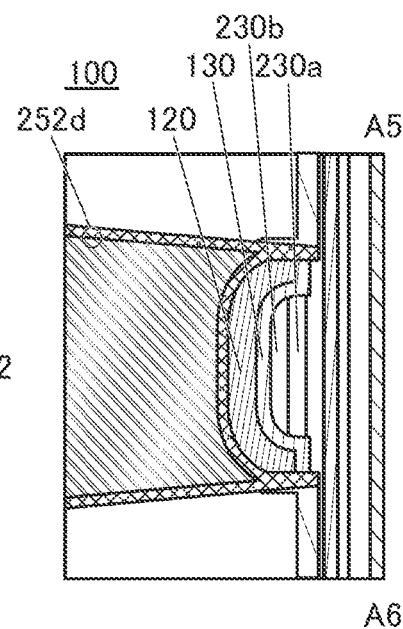

FIGS. 2A to 2D are top views and cross-sectional views illustrating the capacitor 100. FIG. 2B is a cross-sectional view taken along dashed-dotted line A5-A6 in the top view in FIG. 2A and FIG. 2D is a cross-sectional view taken along dashed-dotted line A5-A6 in the top view in FIG. 2C. Note that in FIGS. 2A and 2C, some components such as a conductor 252d in FIGS. 2B and 2D are not illustrated for description of the capacitor 100. A conductor 120 functioning as a second electrode of the capacitor 100 and an insulator 130 functioning as a dielectric are shown by dotted lines.

As illustrated in FIGS. 2A to 2D, the area of the capacitor 100 is determined by the widths of an oxide 230a and an oxide 230b in the A5-A6 direction and the width of the conductor 120 in the A1-A2 direction. That is, when the capacitance value needed for the cell 600 cannot be obtained by the capacitor 100 illustrated in FIGS. 2A and 2B, the widths of the oxide 230a and the oxide 230b in the A5-A6 direction can be increased as illustrated in FIGS. 2C and 2D to increase the capacitance value.

With this structure, miniaturization or high integration of the semiconductor device can be achieved. Moreover, the design flexibility of the semiconductor device can be increased. Furthermore, the transistor 200 and the capacitor 100 can be formed through the same process. Accordingly, the process can be shortened, leading to an improvement in productivity.

<Structure of Cell Array>

FIGS. 3A and 3B and FIGS. 4A and 4B illustrate examples of cell arrays of this embodiment. For example, the cells 600 each including the transistor 200 and the capacitor 100 illustrated in FIGS. 1A to 1C are arranged in a matrix, whereby a cell array can be formed.

Figure 3A:
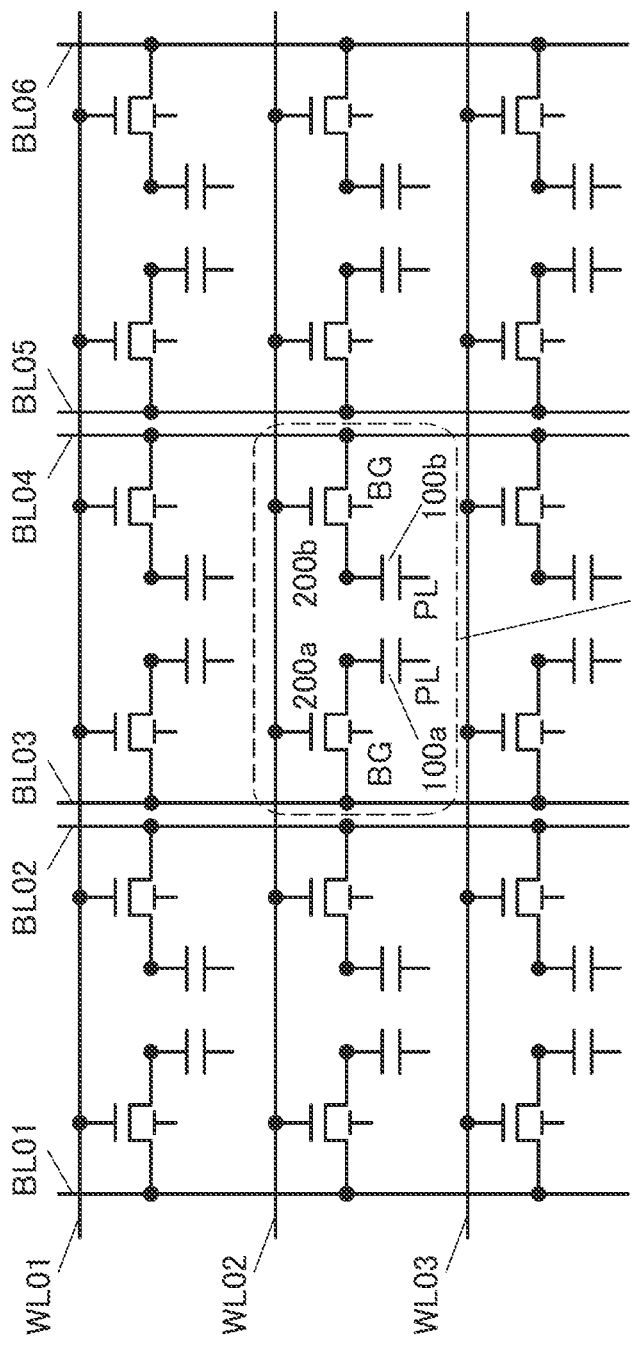
FIGS. 3A and 3B are a circuit diagram and a cross-sectional view of a semiconductor device of one embodiment of the present invention.

FIG. 3A is a circuit diagram showing an embodiment in which the cells 600 in FIGS. 1A to 1C are arranged in a matrix. In FIG. 3A, first gates of transistors included in the cells 600 arranged in a row direction are electrically connected to common WLs (WL01, WL02, and WL03). Furthermore, one of a source and a drain of each of the transistors included in the cells 600 arranged in a column direction are electrically connected to common BLs (BL01 to BL06). In addition, the transistors included in the cells 600 may each be provided with a second gate BG. The threshold voltage of the transistor can be controlled by a potential applied to the BG. The first electrode of the capacitor included in the cell 600 is electrically connected to the other of the source and the drain of the transistor. At this time, the first electrode of the capacitor is formed using part of components of the transistor. In addition, the second electrode of the capacitor included in the cell 600 is electrically connected to a PL.

Figure 3B:
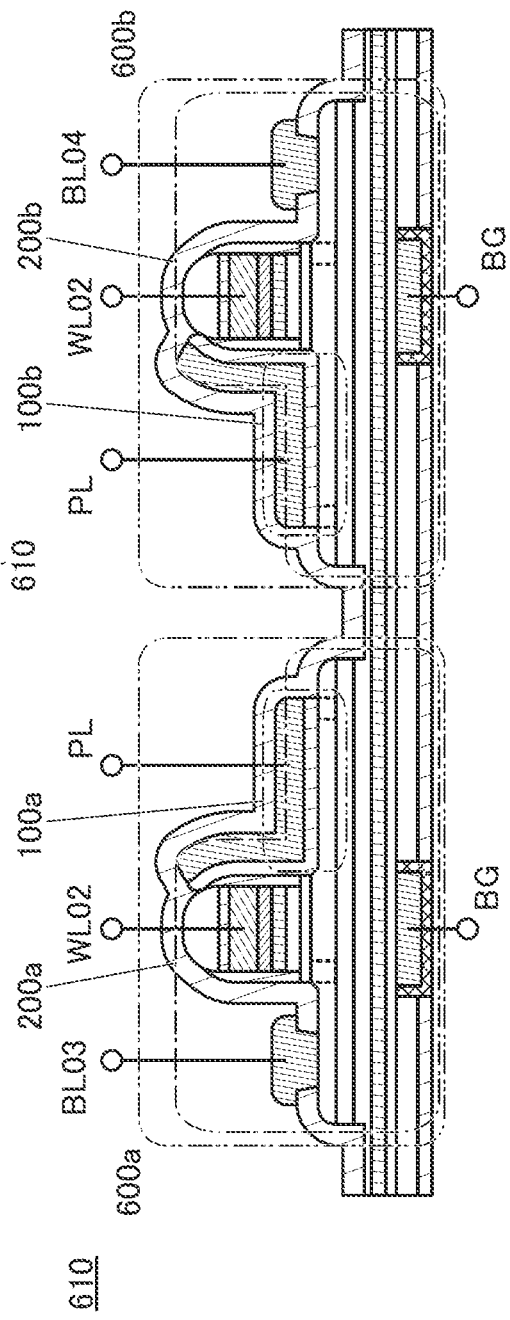

FIG. 3B is a cross-sectional view which illustrates part of a row including a circuit 610 including a cell 600a electrically connected to the WL02 and the BL03 and a cell 600b electrically connected to the WL02 and the BL04 in FIG. 3A. FIG. 3B illustrates a cross-sectional view of the cell 600a and the cell 600b.

The cell 600a includes a transistor 200a and a capacitor 100a. The cell 600b includes a transistor 200b and a capacitor 100b.

Figure 4A:
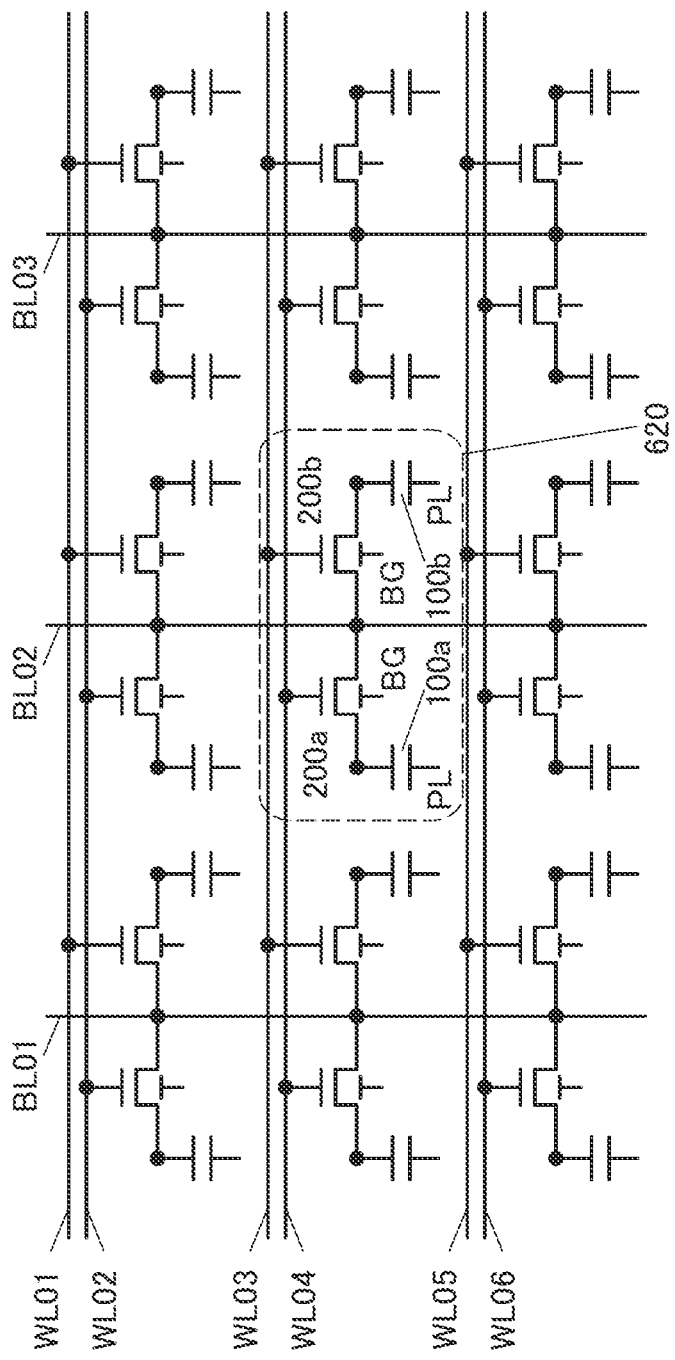
FIGS. 4A and 4B are a circuit diagram and a cross-sectional view of a semiconductor device of one embodiment of the present invention.

FIG. 4A is a circuit diagram showing an embodiment, which is different from that in FIG. 3A, in which the cells 600 in FIGS. 1A to 1C are arranged in a matrix. In FIG. 4A, one of the source and the drain of each of the transistors included in the cells 600 which are adjacent in the row direction are electrically connected to common BLs (BL01, BL02, and BL03). Furthermore, the BLs are also electrically connected to one of the source and the drain of each of the transistors included in the cells 600 arranged in the column direction. In contrast, the first gates of transistors included in the cells 600 which are adjacent in the row direction are electrically connected to different WLs (WL01 to WL06). In addition, the transistors included in the cells 600 may each be provided with a second gate BG. The threshold voltage of the transistor can be controlled by a potential applied to the BG. The first electrode of the capacitor included in the cell 600 is electrically connected to the other of the source and the drain of the transistor. At this time, the first electrode of the capacitor is formed using part of components of the transistor. In addition, the second electrode of the capacitor included in the cell 600 is electrically connected to a PL.

Figure 4B:
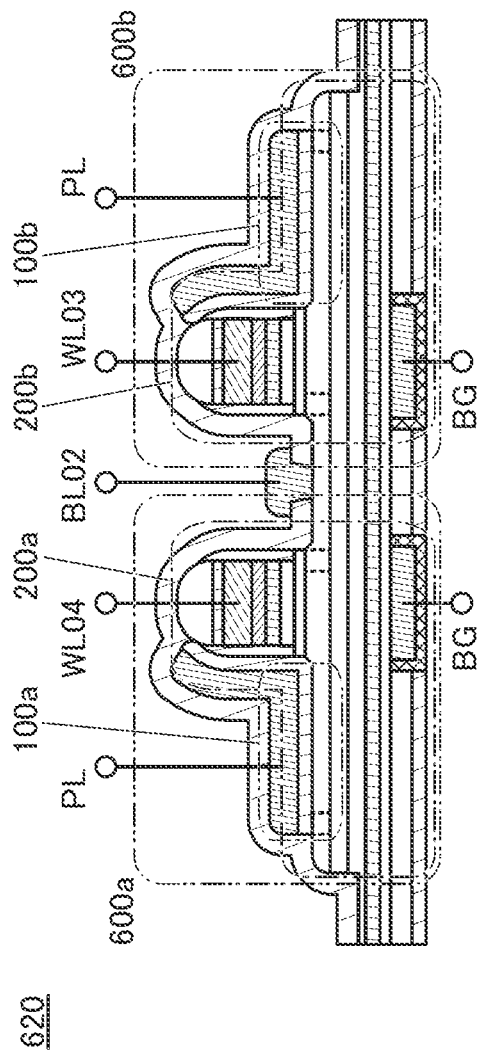

FIG. 4B is a cross-sectional view which illustrates part of a row including a circuit 620 including a cell 600a electrically connected to a WL04 and the BL02 and a cell 600b electrically connected to the WL03 and the BL02 in FIG. 4A. FIG. 4B illustrates a cross-sectional view of the cell 600a and the cell 600b.

The cell 600a includes a transistor 200a and a capacitor 100a. The cell 600b includes a transistor 200b and a capacitor 100b.

One of a source and a drain of the transistor 200a and one of a source and a drain of the transistor 200b are both electrically connected to the BL02.

[Cell 600]

The semiconductor device of one embodiment of the present invention includes the transistor 200, the capacitor 100, and the insulator 280 functioning as an interlayer film. Furthermore, a conductor 252 (a conductor 252a, a conductor 252b, a conductor 252c, and a conductor 252d) functioning as a plug that is electrically connected to the transistor 200 is included.

The conductors 252 are in contact with inner walls of an opening in the insulator 280. Here, the top surface of the conductor 252 can be substantially level with the top surface of the insulator 280. Note that although the conductors 252 in the transistor 200 each have a two-layer structure, one embodiment of the present invention is not limited thereto. For example, the conductors 252 may have a single-layer structure or a stacked-layer structure of three or more layers.

[Transistor 200]

As illustrated in FIGS. 1A to 1C and FIGS. 5A to 5C, the transistor 200 includes insulators 214 and 216 provided over a substrate (not illustrated); a conductor 205 provided to be embedded in the insulators 214 and 216; an insulator 220 provided over the insulator 216 and the conductor 205; an insulator 222 provided over the insulator 220; an insulator 224 provided over the insulator 222; an oxide 230 (an oxide 230a, an oxide 230b, and an oxide 230c) provided over the insulator 224; an insulator 250 provided over the oxide 230; a conductor 260 (a conductor 260a, a conductor 260b, and a conductor 260c) provided over the insulator 250; an insulator 270 and an insulator 271 provided over the conductor 260; an insulator 272 provided in contact with at least side surfaces of the insulator 250 and the conductor 260; and an insulator 274 provided in contact with the oxide 230 and the insulator 272.

Figure 5A:
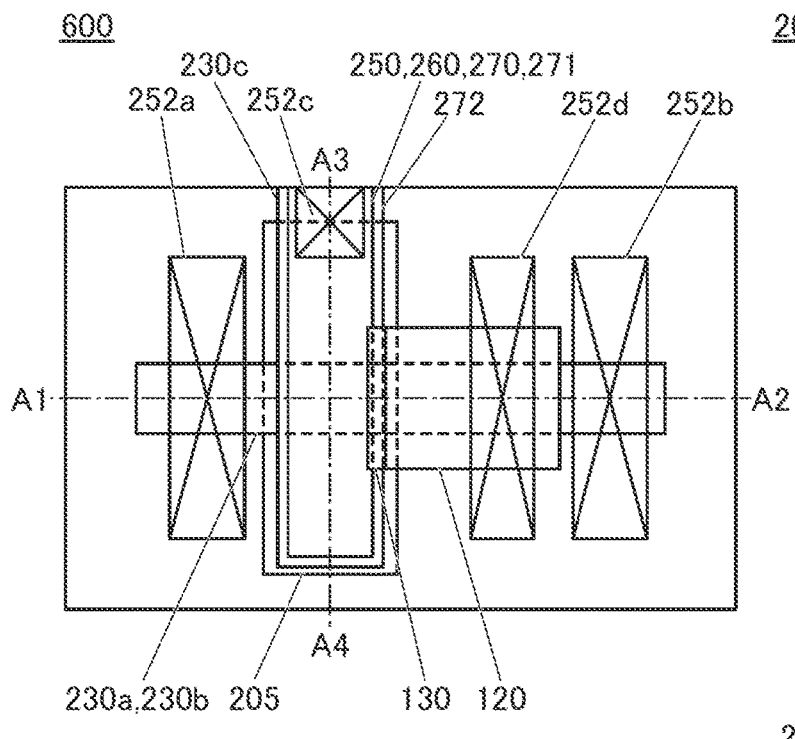
FIGS. 5A to 5C are a top view and cross-sectional views of a semiconductor device of one embodiment of the present invention.
Figure 5C:
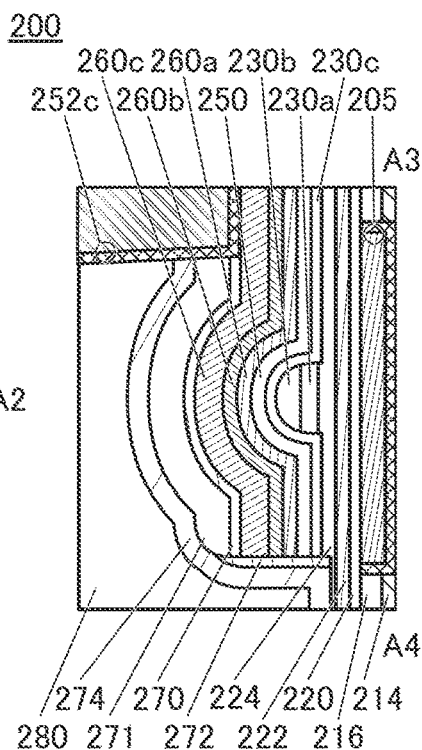
Figure 5B:
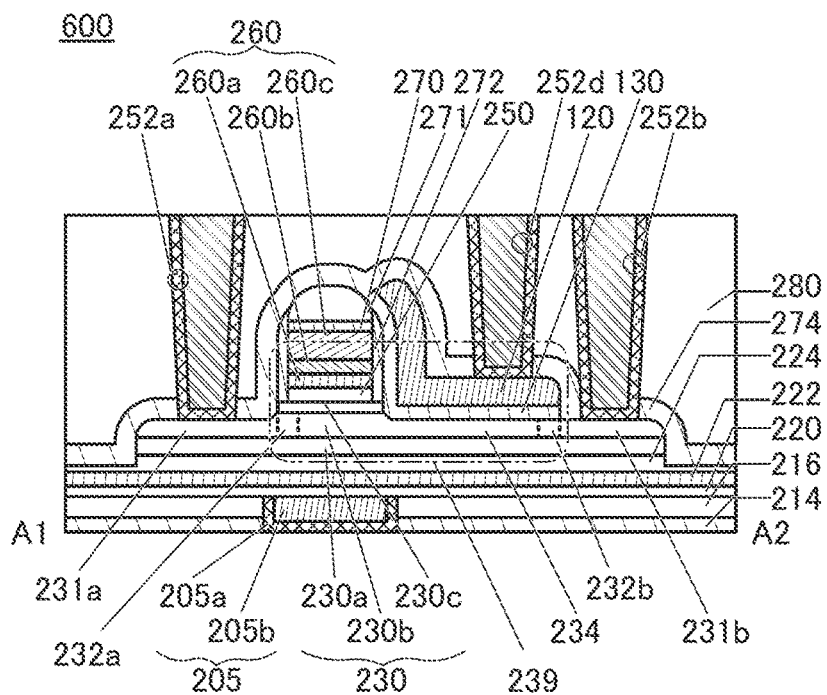

Although the transistor 200 has, as illustrated in FIGS. 5A to 5C, a structure in which the oxide 230a, the oxide 230b, and the oxide 230c are stacked, the present invention is not limited to this structure. For example, the transistor 200 may have a two-layer structure of the oxide 230a and the oxide 230b or may have a stacked-layer structure of four or more layers. Alternatively, the transistor 200 may have a structure in which only the oxide 230b is provided as an oxide or only the oxide 230b and the oxide 230c are provided as an oxide. Although the conductor 260a, the conductor 260b, and the conductor 260c are stacked in the transistor 200, the present invention is not limited to this structure. For example, the transistor 200 may have a single-layer structure, a two-layer structure, or a stacked-layer structure of four or more layers.

Figure 6:
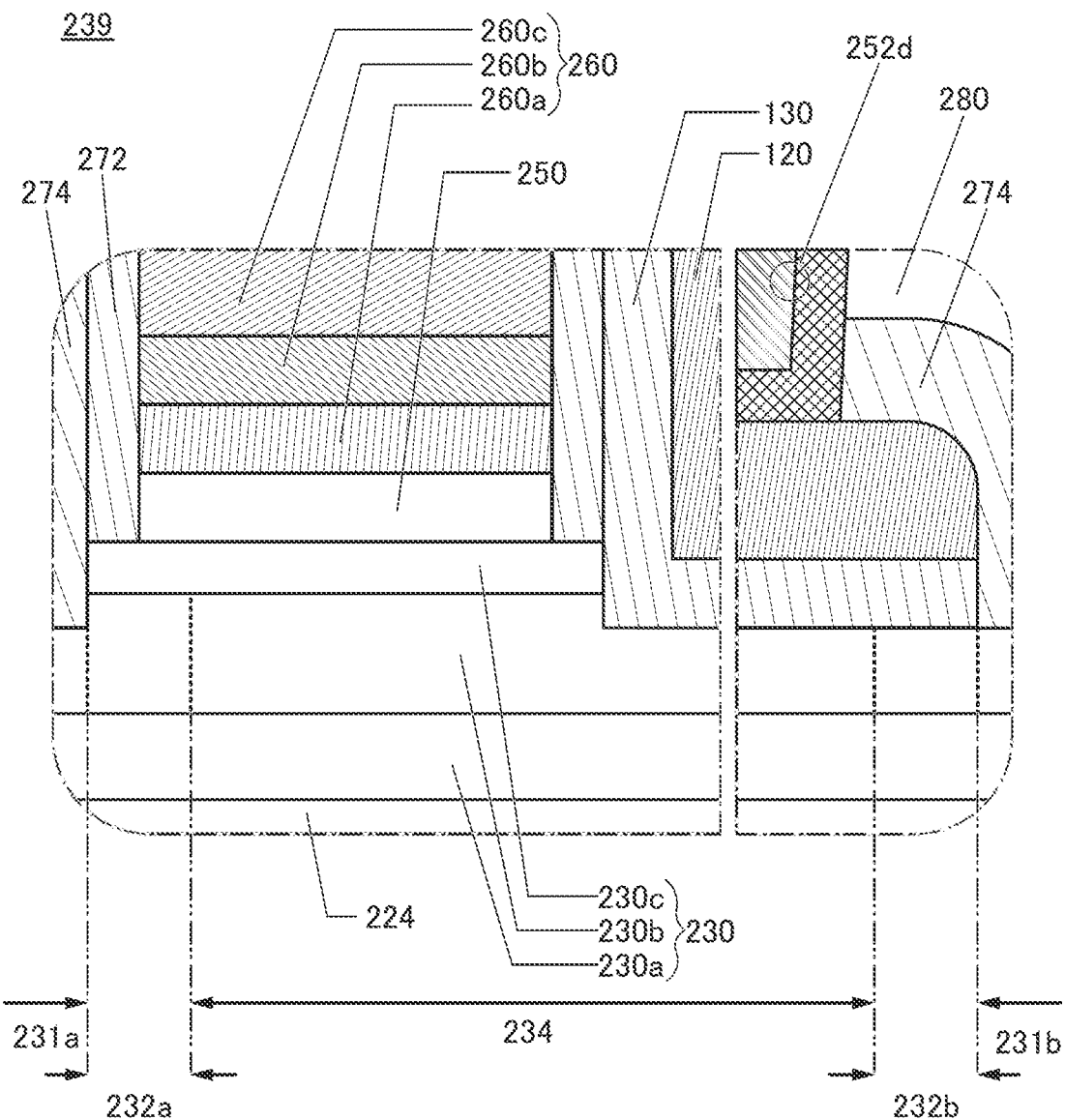
FIG. 6 is a cross-sectional view of a semiconductor device of one embodiment of the present invention.

FIG. 6 is an enlarged view illustrating a region 239 including a channel and the vicinity thereof, which is surrounded by a dashed line in FIG. 5B.

As illustrated in FIG. 5B and FIG. 6, the oxide 230 includes a junction region 232 (a junction region 232a and a junction region 232b) between a region 234 functioning as a channel formation region of the transistor 200 and the first electrode of the capacitor 100 described below and regions 231 (a region 231a and a region 231b) functioning as a source region and a drain region. The region 231 functioning as the source region or the drain region has a high carrier density and reduced resistance. The region 234 functioning as the channel formation region has a lower carrier density than the region 231 functioning as the source region or the drain region. The junction region 232 has a lower carrier density than the region 231 functioning as the source region or the drain region and has a higher carrier density than the region 234 functioning as the channel formation region. That is, the junction region 232 functions as a junction region between the channel formation region and the source region or the drain region.

The junction region 232 prevents a high-resistance region from being formed between the region 231 functioning as the source region or the drain region and the region 234 functioning as the channel formation region, thereby increasing on-state current of the transistor.

The junction region 232 includes a region overlapping with the conductor 260 serving as a gate electrode and the conductor 120 serving as an electrode of the capacitor. In particular, the region overlapping with the conductor 260 serving as a gate electrode in the junction region 232 sometimes functions as a so-called overlap region (also referred to as an Lov region).

Note that the region 231 is preferably in contact with the insulator 274. The concentration of at least one of a metal element such as indium and impurity elements such as hydrogen and nitrogen in the region 231 is preferably higher than that in each of the junction region 232 and the region 234.

The junction region 232 includes a region overlapping with the insulator 272. The concentration of at least one of a metal element such as indium and impurity elements such as hydrogen and nitrogen in the junction region 232 is preferably higher than that in the region 234. On the other hand, the concentration of at least one of a metal element such as indium and impurity elements such as hydrogen and nitrogen in the junction region 232 is preferably lower than that in the region 231.

The region 234 overlaps with the conductor 260. The region 234 is provided between the junction region 232a and the junction region 232b, and the concentration of at least one of a metal element such as indium and impurity elements such as hydrogen and nitrogen in the region 234 is preferably lower than that in each of the regions 231 and 232.

In the oxide 230, a boundary between the region 231, the junction region 232, and the region 234 cannot be observed clearly in some cases. The concentration of at least one of a metal element such as indium and impurity elements such as hydrogen and nitrogen, which is detected in each region, may be gradually changed (such a change is also referred to as gradation) not only between the regions but also in each region. That is, the region closer to the region 234 preferably has a lower concentration of a metal element such as indium and impurity elements such as hydrogen and nitrogen. The concentration of impurity elements in the region 232 is lower than that in the region 231.

Furthermore, in FIG. 5B and FIG. 6, the region 234, the region 231, and the junction region 232 are formed in the oxide 230b; however, the present invention is not limited thereto. For example, these regions may be formed in the oxide 230a or the oxide 230c. Although the boundaries between the regions are indicated substantially perpendicularly to the top surface of the oxide 230 in FIG. 5B and FIG. 6, this embodiment is not limited thereto. For example, the junction region 232 may project to the conductor 260 side in the vicinity of the surface of the oxide 230b, and the junction region 232 may recede to the conductor 252a or 252b side in the vicinity of the bottom surface of the oxide 230b.

In the transistor 200, the oxide 230 is preferably formed using a metal oxide functioning as an oxide semiconductor (hereinafter, the metal oxide is also referred to as an oxide semiconductor). A transistor formed using an oxide semiconductor has an extremely low leakage current (off-state current) in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Accordingly, a transistor including an oxide semiconductor containing oxygen vacancies in a channel formation region is likely to have normally-on characteristics. Thus, it is preferable that oxygen vacancies in the channel formation region be reduced as much as possible.

When oxygen vacancies exist at an interface between the region 234 in the oxide 230 where a channel is formed and the insulator 250 functioning as a gate insulating film, a variation in the electrical characteristics is likely to occur and the reliability is reduced in some cases.

In view of the above, the insulator 250 in contact with the region 234 of the oxide 230 preferably contains oxygen at a higher proportion than oxygen in the stoichiometric composition (also referred to as "excess oxygen"). That is, excess oxygen contained in the insulator 250 is diffused into the region 234, whereby oxygen vacancies in the region 234 can be reduced.

The insulator 272 is preferably provided in contact with the insulator 250. For example, the insulator 272 preferably has a function of suppressing diffusion of oxygen (e.g., oxygen atoms and oxygen molecules). That is, it is preferable that the above oxygen be less likely to pass through the insulator 272. When the insulator 272 has a function of suppressing diffusion of oxygen, oxygen in an excess-oxygen region is not diffused to the insulator 274 side and thus is supplied to the region 234 efficiently. Thus, the formation of oxygen vacancies at the interface between the oxide 230 and the insulator 250 can be inhibited, leading to an improvement in the reliability of the transistor 200.

Furthermore, the transistor 200 is preferably covered with an insulator which has a barrier property and prevents entry of impurities such as water and hydrogen. The insulator having a barrier property is formed using an insulating material having a function of suppressing diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom, that is, an insulating material having a barrier property through which the above impurities are less likely to pass. Alternatively, the insulator having a barrier property is preferably formed using an insulating material having a function of suppressing diffusion of oxygen (e.g., oxygen atoms and oxygen molecules), that is, an insulating material having a barrier property through which the above oxygen is less likely to pass.

The structure of a semiconductor device including the transistor 200 of one embodiment of the present invention is described in detail below.

The conductor 205 functioning as a second gate electrode is provided to overlap with the oxide 230 and the conductor 260.

The conductor 205 is preferably provided so that the length in the channel width direction is larger than that of the region 234 in the oxide 230. It is particularly preferable that the conductor 205 extend to a region on an outer side of the region 234 in the oxide 230 in the channel width direction. That is, it is preferable that the conductor 205 and the conductor 260 overlap with each other with the insulator provided therebetween in the region on an outer side of the oxide 230 in the channel width direction.

Here, the conductor 260 functions as a first gate electrode in some cases. The conductor 205 functions as a second gate electrode in some cases. In that case, by changing a potential applied to the conductor 205 independently of a potential applied to the conductor 260, the threshold voltage of the transistor 200 can be controlled. In particular, by applying a negative potential to the conductor 205, the threshold voltage of the transistor 200 can be higher than 0 V, and the off-state current can be reduced. Accordingly, a drain current when a voltage applied to the conductor 260 is 0 V can be reduced.

As illustrated in FIGS. 5A to 5C, the conductor 205 is provided to overlap with the oxide 230 and the conductor 260. The conductor 205 is preferably provided to overlap with the conductor 260 even in a region on an outer side of the oxide 230 in the channel width direction. That is, the conductor 205 and the conductor 260 preferably overlap with each other with the insulator therebetween on an outer side than the side surface of the oxide 230.

With the above structure, in the case where potentials are applied to the conductor 260 and the conductor 205, an electric field generated from the conductor 260 and an electric field generated from the conductor 205 are connected, so that a closed circuit which covers the channel formation region in the oxide 230 can be formed.

That is, the channel formation region in the region 234 can be electrically surrounded by the electric field of the conductor 260 functioning as the first gate electrode and the electric field of the conductor 205 functioning as the second gate electrode. In this specification, such a transistor structure in which the channel formation region is electrically surrounded by the electric fields of the first gate electrode and the second gate electrode is referred to as a surrounded channel (s-channel) structure.

In the conductor 205, a conductor 205a is formed in contact with an inner wall of an opening of the insulators 214 and 216 and a conductor 205b is formed on an inner side than the conductor 205a. Here, top surfaces of the conductors 205a and 205b can be at substantially the same level as the top surface of the insulator 216. Note that although the conductor 205a and the conductor 205b are stacked in the transistor 200, the structure of the present invention is not limited to this structure. For example, a structure in which only the conductor 205b is provided may be employed.

The conductor 205a is preferably formed using a conductive material having a function of suppressing diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom, that is, a conductive material through which the above impurities are less likely to pass. Alternatively, the conductor 205a is preferably formed using a conductive material having a function of suppressing diffusion of oxygen (e.g., at least one of oxygen atoms, oxygen molecules, or the like), that is, a conductive material through which the above oxygen is less likely to pass. Note that in this specification, a function of inhibiting diffusion of impurities or oxygen means a function of inhibiting diffusion of any one or all of the above impurities or the above oxygen.

When the conductor 205a has a function of suppressing diffusion of oxygen, the conductivity of the conductor 205b can be prevented from being lowered because of oxidation. As a conductive material having a function of suppressing diffusion of oxygen, for example, tantalum, tantalum nitride, ruthenium, ruthenium oxide, or the like is preferably used. Accordingly, the conductor 205a may be a single layer or a stacked layer of the above conductive materials. Thus, impurities such as hydrogen and water can be prevented from being diffused to the transistor 200 side of the through from the conductor 205 from the substrate side of the insulator 214.

Furthermore, the conductor 205b is preferably formed using a conductive material including tungsten, copper, or aluminum as its main component. Note that the conductor 205b is a single layer in the drawing but may have a stacked-layer structure, for example, a stacked layer of titanium, titanium nitride, and any of the above conductive materials.

The insulator 214 preferably functions as a barrier insulating film for preventing impurities such as water and hydrogen from entering the transistor from the substrate side. Accordingly, the insulator 214 is preferably formed using an insulating material having a function of suppressing diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom, that is, an insulating material through which the above impurities are less likely to pass. Alternatively, the insulator 214 is preferably formed using an insulating material having a function of suppressing diffusion of oxygen (e.g., at least one of oxygen atoms or oxygen molecules), that is, an insulating material through which the above oxygen is less likely to pass.

For example, aluminum oxide, silicon nitride, or the like is preferably used for the insulator 214. Thus, impurities such as hydrogen and water can be prevented from being diffused to the transistor side from the insulator 214. In addition, oxygen contained in the insulator 224 and the like can be prevented from being diffused to the substrate side from the insulator 214.

The permittivity of each of the insulators 216 and 280 functioning as an interlayer film is preferably lower than that of the insulator 214. In the case where a material with a low permittivity is used as an interlayer film, the parasitic capacitance between wirings can be reduced.

For example, the insulators 216 and 280 can be formed to have a single layer or a stacked layer using any of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and (Ba,Sr)$TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

The insulators 220, 222, and 224 have a function of a gate insulator.

Here, as the insulator 224 in contact with the oxide 230, an oxide insulator that contains more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced, leading to an improvement in reliability.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 224 includes an excess-oxygen region, the insulator 222 preferably has a function of suppressing diffusion of oxygen (e.g., at least one of oxygen atoms or oxygen molecules). That is, it is preferable that the above oxygen be less likely to pass through the insulator 222.

When the insulator 222 has a function of suppressing diffusion of oxygen, oxygen in the excess-oxygen region is not diffused to the insulator 220 side and thus can be supplied to the oxide 230 efficiently. The conductor 205 can be inhibited from reacting with oxygen in the excess-oxygen region of the insulator 224.

The insulator 222 preferably has a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST). When a high-k material is used for the insulator functioning as a gate insulator, miniaturization and high integration of the transistor becomes possible. It is particularly preferable to use an insulating material (through which oxygen is unlikely to pass) having a function of suppressing diffusion of impurities such as aluminum oxide and hafnium oxide, oxygen, and the like. The insulator 222 formed of such a material serves as a layer that prevents release of oxygen from the oxide 230 and entry of impurities such as hydrogen from the periphery of the transistor 200.

Alternatively, aluminum oxide, bismuth oxide, germanium oxide, niobium oxide, silicon oxide, titanium oxide, tungsten oxide, yttrium oxide, or zirconium oxide may be added to these insulators, for example. These insulators may be subjected to nitriding treatment. A layer of silicon oxide, silicon oxynitride, or silicon nitride may be stacked over the insulator.

It is preferable that the insulator 220 be thermally stable. Because silicon oxide and silicon oxynitride have thermal stability, combination of silicon oxide or silicon oxynitride with an insulator which is a high-k material allows the stacked-layer structure to be thermally stable and have a high relative permittivity, for example.

Note that the insulators 220, 222, and 224 each may have a stacked-layer structure of two or more layers. In this case, the stacked layers are not necessarily formed of the same material but may be formed of different materials. The insulators 220, 222, and 224 functioning as a gate insulator in the transistor 200 are described; however this embodiment is not limited to this. For example, a structure of two layers or one layer of any of the insulators 220, 222, and 224 may be formed as a gate insulator.

The oxide 230 includes the oxide 230a, the oxide 230b over the oxide 230a, and the oxide 230c over the oxide 230b. The oxide 230 includes the region 231, the junction region 232, and the region 234. Note that at least part of the region 231 is preferably in contact with the insulator 274. Note that it is preferable that the concentration of at least one of a metal element such as indium, hydrogen, and nitrogen in at least part of the region 231 be higher than that of the region 234.

When the transistor 200 is turned on, the region 231a or 231b functions as the source region or the drain region. At least part of the region 234 functions as a channel formation region.

As illustrated in FIG. 6, the oxide 230 preferably includes the junction region 232. With this structure, the transistor 200 can have a high on-state current and a low leakage current (off-state current) in an off state.

When the oxide 230b is provided over the oxide 230a, impurities can be prevented from being diffused into the oxide 230b from the components formed below the oxide 230a. Moreover, when the oxide 230b is provided under the oxide 230c, impurities can be prevented from being diffused into the oxide 230b from the components formed above the oxide 230c.

The oxide 230 has a curved surface between the side surface and the top surface. That is, an end portion of the side surface and an end portion of the top surface are preferably curved (hereinafter such a curved shape is also referred to as a rounded shape). The radius of curvature of the curved surface at an end portion of the oxide 230b is greater than or equal to 3 nm and less than or equal to 10 nm, preferably greater than or equal to 5 nm and less than or equal to 6 nm.

The oxide 230 is preferably formed using a metal oxide functioning as an oxide semiconductor (hereinafter, the metal oxide is also referred to as an oxide semiconductor). For example, the metal oxide to be the region 234 preferably has an energy gap of 2 eV or more, preferably 2.5 eV or more. With the use of a metal oxide having such a wide energy gap, the off-state current of the transistor can be reduced.

Note that in this specification and the like, a metal oxide including nitrogen is also called a metal oxide in some cases. Moreover, a metal oxide including nitrogen may be called a metal oxynitride.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

For example, as the oxide 230, a metal oxide such as an In-M-Zn oxide (M is one or a plurality of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) is used. In—Ga oxide or In—Zn oxide may be used as the oxide 230.

Here, the region 234 in the oxide 230 is described.

The region 234 preferably has a stacked-layer structure of metal oxides which differ in the atomic ratio of metal elements. Specifically, in the case where the region 234 has the stacked-layer structure of the oxide 230a and 230b, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of the element In to M in the metal oxide used as the oxide 230b is preferably greater than that in the metal oxide used as the oxide 230a. The oxide 230c can be formed using a metal oxide which can be used for the oxide 230a or 230b.

Next, the region 231 and the junction region 232 which are included in the oxide 230 are described.

The region 231 and the junction region 232 are low-resistance regions which are obtained by adding a metal atom such as indium or impurities to a metal oxide formed as the oxide 230. Note that each of the regions has higher conductivity than at least the oxide 230b in the region 234. For addition of impurities to the region 231 and junction region 232, for example, a dopant which is at least one of a metal element such as indium and impurities can be added by plasma treatment, an ion implantation method by which an ionized source gas is subjected to mass separation and then added, an ion doping method by which an ionized source gas is added without mass separation, a plasma immersion ion implantation method, or the like.

That is, when the content of a metal atom such as indium in the region 231 and the junction region 232 in the oxide 230 is increased, the electron mobility can be increased and the resistance can be decreased.

When the insulator 274 containing impurity elements is formed in contact with the oxide 230, impurities can be added to the region 231 and the junction region 232.

That is, when an element that forms an oxygen vacancy or an element trapped by an oxygen vacancy is added to the region 231 and the junction region 232, the resistances of the region 231 and the junction region 232 are reduced. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. Accordingly, the region 231 and the junction region 232 are made to include one or more of the above elements.

In addition, as the insulator 274, a film which extracts and absorbs oxygen contained in the region 231 and the junction region 232 may be used. When oxygen is extracted, oxygen vacancies are generated in the region 231 and the junction region 232. Hydrogen, boron, carbon, nitrogen, fluorine, phosphorus, sulfur, chlorine, titanium, a rare gas, or the like is trapped by oxygen vacancies, whereby the resistance of the region 231 and the junction region 232 is reduced.

When the junction region 232 is provided in the transistor 200, high-resistance regions are not formed between the region 231 functioning as the source region and the drain region and the region 234 where a channel is formed, so that the on-state current and the carrier mobility of the transistor can be increased. Since the gate does not overlap with the source and drain regions in the channel length direction by including the junction region 232, formation of unnecessary capacitance can be suppressed. Furthermore, leakage current in an off state can be reduced owing to the junction region 232.

Thus, by appropriately selecting the areas of the junction region 232, a transistor having electrical characteristics necessary for the circuit design can be easily provided.

The insulator 250 functions as a gate insulating film. The insulator 250 is preferably provided in contact with the top surface of the oxide 230c. The insulator 250 is preferably formed using an insulator from which oxygen is released by heating. The insulator 250 is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

When as the insulator 250, an insulator from which oxygen is released by heating is provided in contact with the top surface of the oxide 230c, oxygen can be efficiently supplied to the region 234 of the oxide 230b. Furthermore, like the insulator 224, the concentration of impurities such as water and hydrogen in the insulator 250 is preferably lowered. The thickness of the insulator 250 is preferably greater than or equal to 1 nm and less than or equal to 20 nm.

The conductor 260 functioning as the first gate electrode includes the conductor 260a, the conductor 260b over the conductor 260a, and the conductor 260c over the conductor 260b. The conductor 260a is preferably formed using a conductive oxide. For example, the metal oxide that can be used for the oxide 230a or 230b can be used. In particular, an In—Ga—Zn-based oxide with an atomic ratio of In:Ga:Zn=4:2:3 to 4:1 or in the neighborhood thereof, which has high conductivity, is preferably used. When the conductor 260a is formed using such a material, oxygen can be prevented from entering the conductor 260b, and an increase in electric resistance value of the conductor 260b due to oxidation can be prevented.

When such a conductive oxide is formed by a sputtering method, oxygen can be added to the insulator 250, so that oxygen can be supplied to the oxide 230b. Thus, oxygen vacancies in the region 234 of the oxide 230 can be reduced.

As the conductor 260b, a conductor that can add impurities such as nitrogen to the conductor 260a to improve the conductivity of the conductor 260a may be used. For example, titanium nitride or the like is preferably used for the conductor 260b. The conductor 260c can be formed using a metal with high conductivity such as tungsten, for example.

In the case where the conductor 205 extends to a region on an outer side of the oxide 230 in the channel width direction as illustrated in FIG. 5C, the conductor 260 preferably overlaps with the conductor 205 with the insulator 250 positioned therebetween. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that a closed circuit which covers the channel formation region in the oxide 230 can be formed.

That is, the channel formation region in the region 234 can be electrically surrounded by the electric field of the conductor 260 functioning as the first gate electrode and the electric field of the conductor 205 functioning as the second gate electrode.

The insulator 270 functioning as a barrier film may be provided over the conductor 260c. The insulator 270 is preferably formed using an insulating material that has a function of inhibiting the penetration of oxygen and impurities such as water and hydrogen. For example, an insulator containing oxides of one of or both aluminum and hafnium can be used. As the insulator containing oxides of one of or both aluminum and hafnium, aluminum oxide, hafnium oxide, an oxide containing aluminum and hafnium (hafnium aluminate), or the like is preferably used. Thus, oxidation of the conductor 260 can be prevented. This can prevent entry of impurities such as water or hydrogen into the oxide 230 through the conductor 260 and the insulator 250.

Furthermore, the insulator 271 functioning as a hard mask is preferably provided over the insulator 270. By provision of the insulator 270, the conductor 260 can be processed to have a side surface that is substantially perpendicular. Specifically, an angle formed by the side surface of the conductor 260 and a surface of the substrate can be greater than or equal to 75° and less than or equal to 100°, preferably greater than or equal to 80° and less than or equal to 95°. When the conductor is processed into such a shape, the insulator 272 that is subsequently formed can be formed into a desired shape.

The insulator 272 functioning as a barrier film is provided in contact with the side surface of the insulator 250, the side surface of the conductor 260, and the side surface of the insulator 270.

Here, the insulator 272 is preferably formed using an insulating material that has a function of inhibiting the penetration of oxygen and impurities such as water and hydrogen. For example, an insulator containing oxides of one of or both aluminum and hafnium can be used. As the insulator containing oxides of one of or both aluminum and hafnium, aluminum oxide, hafnium oxide, an oxide containing aluminum and hafnium (hafnium aluminate), or the like is preferably used. In this manner, oxygen in the insulator 250 can be prevented from diffusing outward. In addition, impurities such as hydrogen and water can be prevented from entering the oxide 230 through the end portion of the insulator 250 or the like.

By provision of the insulator 272, the top surface and the side surface of the conductor 260 and the side surface of the insulator 250 can be covered with an insulator having a function of inhibiting the penetration of oxygen and impurities such as water and hydrogen. This can prevent entry of impurities such as water and hydrogen into the oxide 230 through the conductor 260 and the insulator 250. Thus, the insulator 272 functions as a side barrier for protecting the side surfaces of the gate electrode and the gate insulating film.

In the case where the transistor is miniaturized and has a channel length of approximately greater than or equal to 10 nm and less than or equal to 30 nm, impurity elements contained in the structure bodies provided in the vicinity of the transistor 200 might be diffused, and the region 231a and the region 231b, or the junction region 232a and the junction region 232b might be electrically connected to each other.

In view of the above, when the insulator 272 is formed as described in this embodiment, impurities such as hydrogen and water can be prevented from entering the insulator 250 and the conductor 260, and oxygen in the insulator 250 can be prevented from being diffused to the outside. Accordingly, when a first gate voltage is 0 V, the source region and the drain region can be prevented from being electrically connected to each other directly or through the junction region 232.

The insulator 274 is provided to cover the insulator 270, the insulator 272, the oxide 230, and the insulator 224.

Moreover, the insulator 274 is preferably formed using an insulating material having a function of inhibiting the penetration of impurities such as water and hydrogen and oxygen. For example, as the insulator 274, silicon nitride, silicon nitride oxide, silicon oxynitride, aluminum nitride, aluminum nitride oxide, or the like is preferably used. When the insulator 274 is formed using any of the above materials, entry of oxygen through the insulator 274 to be supplied to oxygen vacancies in the regions 231a and 231b, which decreases the carrier density, can be prevented. Furthermore, impurities such as water and hydrogen can be prevented from passing through the insulator 274 and excessively enlarging the region 231a and the region 231b to the region 234 side.

Note that in the case where the region 231 and the junction region 232 are provided with formation of the insulator 274, the insulator 274 preferably includes at least one of hydrogen and nitrogen. When an insulator including impurities such as hydrogen and nitrogen is used as the insulator 274, impurities such as hydrogen and nitrogen are added to the oxide 230, so that the region 231, the junction region 232 can be formed in the oxide 230.

The insulator 280 functioning as the interlayer film is preferably provided over the insulator 274. Like the insulator 224 or the like, the concentration of impurities such as water or hydrogen in the insulator 280 is preferably lowered. Note that the insulator 280 may have a stacked-layer structure of such insulators.

Furthermore, the conductors 252a, 252b, 252c, and 252d are provided in the opening formed in the insulators 280 and 274. Note that top surfaces of the conductors 252a, 252b, 252c, and 252d may be at the same level as the top surface of the insulator 280.

The conductor 252c is in contact with the conductor 260 functioning as the first gate electrode of the transistor 200 through the opening formed in the insulators 270 and 271. The conductor 252d is in contact with a conductor 120 serving as one of electrodes of the capacitor 100 described later.

Here, the conductor 252a is in contact with the region 231a functioning as one of a source region and a drain region of the transistor 200, and the conductor 252b is in contact with the region 231b functioning as the other of the source region and the drain region of the transistor 200. Because the region 231a and the region 231b are reduced in resistance, the contact resistance between the conductor 252a and the region 231a and the contact resistance between the conductor 252b and the region 231b are reduced, leading to a large on-state current of the transistor 200.

The conductor 252a (the conductor 252b) is in contact with at least the top surface of the oxide 230. It is preferable that the conductor 252a (the conductor 252b) be in contact with the top surface and the side surface of the oxide 230. It is particularly preferable that the conductor 252a (the conductor 252b) be in contact with one of or both the side surface of the oxide 230 on the A3 side and the side surface of the oxide 230 on the A4 side. The conductor 252a (the conductor 252b) may be in contact with the side surface of the oxide 230 on the A1 side (the A2 side). When the conductor 252a (the conductor 252b) is in contact with not only the top surface of the oxide 230 but also the side surface of the oxide 230, the area where the conductor 252a (the conductor 252b) and the oxide 230 are in contact with each other can be increased without an increase in the area of the top surface of the contact portion, so that the contact resistance between the conductor 252a (the conductor 252b) and the oxide 230 can be reduced. Accordingly, miniaturization of the source electrode and the drain electrode of the transistor can be achieved and, in addition, the on-state current can be increased.

The conductor 252 is preferably formed using a conductive material including tungsten, copper, or aluminum as its main component. Although not shown, the conductor 252 may have a stacked-layer structure, and for example, a stacked layer of titanium, titanium nitride, and any of the above conductive materials may be used.

In the case where the conductor 252 has a stacked-layer structure, a conductive material having a function of inhibiting the penetration of impurities such as water and hydrogen is preferably used for a conductor in contact with the insulators 274 and 280, as in the conductor 205a or the like. For example, tantalum, tantalum nitride, titanium, titanium nitride, ruthenium, ruthenium oxide, or the like is preferably used. The conductive material having a function of inhibiting the penetration of impurities such as water and hydrogen may be used for forming a single layer or a stacked layer. When the conductive material is used, impurities such as hydrogen and water can be prevented from entering the oxide 230 through the conductor 252 from a layer above the insulator 280.

An insulator which has a function of inhibiting the passage of impurities such as water and hydrogen may be provided in contact with the inner wall of the opening in the insulators 274 and 280 in which the conductor 252 is embedded. As for such an insulator, an insulator which can be used for the insulator 214, such as aluminum oxide is preferably used. Accordingly, the insulator prevents impurities such as hydrogen and water from entering the oxide 230 through the conductor 252 from the insulator 280. The insulator can be formed with good coverage by using an ALD method, a CVD method, or the like.

Although not illustrated, conductors functioning as wirings may be provided in contact with the top surface of the conductor 252. A conductive material containing tungsten, copper, or aluminum as its main component is preferably used for the conductors functioning as the wirings.

[Capacitor 100]

As illustrated in FIGS. 1A to 1C and FIGS. 5A to 5C, the capacitor 100 and the transistor 200 have the same components. In this embodiment, an example of the capacitor 100 in which part of the region 234 provided in the oxide 230 of the transistor 200 serves as one electrode of the capacitor 100 is shown.

The capacitor 100 includes part of the region 234 and the junction region 232b of the oxide 230, the insulator 130 over the part of the region 234 and the junction region 232b, and the conductor 120 over the insulator 130. Furthermore, the conductor 120 is preferably provided over the insulator 130 to at least partly overlap with the part of the region 234 and the junction region 232b.

The part of the region 234 and the junction region 232b of the oxide 230 serve as one electrode of the capacitor 100 and the conductor 120 serves as the other electrode of the capacitor 100. That is, in the region 234, a first region serving as a channel of the transistor 200 and a second region serving as one electrode of the capacitor 100 are provided to be adjacent to each other. The insulator 130 functions as a dielectric of the capacitor 100.

The insulator 280 and the insulator 274 are preferably provided to cover the insulator 130 and the conductor 120.

The insulator 130 may be, for example, a single layer or a stacked layer using aluminum oxide or silicon oxynitride.

Like the conductor 120, the conductor 120 is preferably formed with a conductive material containing tungsten, copper, or aluminum as its main component. Although not illustrated, the conductor 120 may have a stacked-layer structure, and for example, may be a stacked layer of titanium, titanium nitride, and the above-described conductive material.

Furthermore, the conductor 252d is in contact with the conductor 120 functioning as one electrode of the capacitor 100. The conductor 252d can be formed at the same time as the conductors 252a, 252b, and 252c; thus, the manufacturing process can be shortened.

<Material for Semiconductor Device>

Materials that can be used for a semiconductor device will be described below. Note that an insulating material for forming an insulator, a conductive material for forming a conductor, a metal oxide serving as an oxide semiconductor, and the like can be formed by a sputtering method, a chemical vapor deposition (CVD) method, a molecular beam epitaxy (MBE) method, a pulsed laser deposition (PLD) method, an atomic layer deposition (ALD) method, or the like as appropriate.

<<Substrate>>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate due to dropping or the like can be reduced. That is, a durable semiconductor device can be provided.

For the substrate which is a flexible substrate, metal, an alloy, resin, glass, or fiber thereof can be used, for example. As the substrate, a sheet, a film, or a foil containing a fiber may be used. The flexible substrate preferably has a lower coefficient of linear expansion because deformation due to an environment is suppressed. The flexible substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

When a high-k material having a high relative permittivity is used for the insulator functioning as the gate insulator, miniaturization and high integration of the transistor can be achieved. In contrast, when a material having a low relative permittivity is used for the insulator functioning as an interlayer film, the parasitic capacitance between the wirings can be reduced. In this manner, a material is preferably selected depending on the function of an insulator.

As the insulator having a high relative permittivity, aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given.

As the insulator having a low relative permittivity, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low relative permittivity can be obtained by combination with a resin, for example. Examples of the resin include polyester, polyolefin, polyamide (e.g., nylon or aramid), polyimide, polycarbonate, and acrylic. Furthermore, combination of silicon oxide or silicon oxynitride with an insulator with a high relative permittivity allows the stacked-layer structure to be thermally stable and have a high relative permittivity, for example.

Note that when the transistor including an oxide semiconductor is surrounded by an insulator that has a function of inhibiting the penetration of oxygen and impurities such as hydrogen, the electrical characteristics of the transistor can be stabilized.

The insulator that has a function of inhibiting the penetration of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the penetration of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, or the like can be used.

For example, an insulator that has a function of inhibiting the penetration of oxygen and impurities such as hydrogen is used as each of the insulators 222 and 214. For example, an insulator containing oxides of one of or both aluminum and hafnium can be used as each of the insulators 222 and 214. As the insulator containing oxides of one of or both aluminum and hafnium, aluminum oxide, hafnium oxide, an oxide containing aluminum and hafnium (hafnium aluminate), or the like is preferably used.

For example, the insulators 216, 220, 224, 250, and 271 are formed using a single layer or a stacked layer of an insulator containing one kind of or two kinds or more of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum. Specifically, the insulators 216, 220, 224, 250, and 271 preferably contain silicon oxide, silicon oxynitride, or silicon nitride.

For example, when aluminum oxide, gallium oxide, hafnium aluminate, or hafnium oxide in each of the insulators 224 and 250 functioning as a gate insulator is in contact with the oxide 230, entry of silicon included in silicon oxide or silicon oxynitride into the oxide 230 can be suppressed. When silicon oxide or silicon oxynitride in each of the insulators 224 and 250 is in contact with the oxide 230, for example, trap centers might be formed at the interface between aluminum oxide, gallium oxide, hafnium aluminate, or hafnium oxide and silicon oxide or silicon oxynitride. The trap centers can shift the threshold voltage of the transistor in the positive direction by trapping electrons in some cases.

The insulator 130 functioning as a dielectric has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or hafnium aluminate. For example, a stacked-layer structure of a high-k material such as aluminum oxide and a material with high dielectric strength such as silicon oxynitride is preferably used. The structure enables the capacitor 100 to include a high-k material and a material with high dielectric strength; thus, the required capacitance can be provided, the dielectric strength can be increased, and the electrostatic breakdown of the capacitor 100 can be prevented, which leads to improvement in the reliability of the capacitor 100.

The insulator 216 and the insulator 280 preferably include an insulator with a low relative permittivity. For example, the insulator 216 and the insulator 280 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulator 216 and the insulator 280 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

As the insulators 270 and 272, an insulator having a function of inhibiting the penetration of impurities such as hydrogen and oxygen may be used. For the insulator 270 and the insulator 272, a metal oxide such as aluminum oxide, hafnium oxide, hafnium aluminate, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

<<Conductor>>

The conductors can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When oxide is used for the channel formation region of the transistor, a stacked-layer structure formed using a material containing the above-described metal element and a conductive material containing oxygen is preferably used for the conductor functioning as the gate electrode. In this case, the conductive material containing oxygen is preferably formed on the channel formation region side. In that case, the conductive material including oxygen is preferably provided on the channel formation region side so that oxygen released from the conductive material is easily supplied to the channel formation region.

It is particularly preferable to use a conductive material containing oxygen and a metal element contained in the metal oxide forming a channel for the conductor functioning as the gate electrode. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide forming a channel can be captured in some cases. Alternatively, hydrogen entering from an external insulator or the like can be captured in some cases.

The conductors 260, 205, 120, and 252 can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

<<Metal Oxide>>

The oxide 230 is preferably formed using a metal oxide functioning as an oxide semiconductor (hereinafter, the metal oxide is also referred to as an oxide semiconductor). A metal oxide that can be used as the oxide 230 of one embodiment of the present invention is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

An oxide semiconductor is classified into a single-crystal oxide semiconductor and a non-single-crystal oxide semiconductor. Examples of a non-single-crystal oxide semiconductor include a polycrystalline oxide semiconductor and an amorphous oxide semiconductor.

An oxide semiconductor used for a semiconductor of a transistor is preferably formed using a thin film having high crystallinity. With the thin film, the stability and the reliability of the transistor can be improved. As the thin film, for example, a thin film of a single-crystal oxide semiconductor, a thin film of a polycrystalline oxide semiconductor, or the like can be used. However, for forming the thin film of a single-crystal oxide semiconductor or the thin film of a polycrystalline oxide semiconductor, a high-temperature process or a laser heating process is needed. Thus, the manufacturing cost is increased, and moreover, the throughput is decreased.

Non-Patent Documents 1 and 2 have reported that, in 2009, an In—Ga—Zn oxide having a CAAC structure (referred to as CAAC-IGZO) was found. Here, it has been reported that CAAC-IGZO has c-axis alignment, a grain boundary is not clearly observed in CAAC-IGZO, and CAAC-IGZO can be formed on a substrate at a low temperature. It has also been reported that a transistor including CAAC-IGZO has excellent electrical characteristics and reliability.

In addition, in 2013, an In—Ga—Zn oxide having an nc structure (referred to as nc-IGZO) was found (see Non-Patent Document 3). Here, it has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Documents 4 and 5 have shown a change in average crystal size due to electron beam irradiation to thin films of CAAC-IGZO, nc-IGZO, and IGZO having low crystallinity. In the thin film of IGZO having low crystallinity, crystalline IGZO with a thickness of approximately 1 nm was observed even before the electron beam irradiation. Thus, here, it has been reported that in IGZO, a complete amorphous structure was not observed. In addition, it has been shown that the thin films of CAAC-IGZO and nc-IGZO each have higher stability against electron beam irradiation than the thin film of IGZO having low crystallinity. Thus, the semiconductor of the transistor is preferably formed using the thin film of CAAC-IGZO or the thin film of nc-IGZO.

Non-Patent Document 6 discloses that a transistor including an oxide semiconductor has an extremely low leakage current in an off state; specifically, the off-state current per micrometer of the channel width of the transistor is in the order of yA/μm ($10^{-24}$ A/μm). For example, a CPU or the like with low-power consumption utilizing a characteristic of low leakage current of the transistor including an oxide semiconductor has been disclosed (see Non-Patent Document 7).

Furthermore, the use of the transistor for the display device which utilizes a characteristic of low leakage current of the transistor including an oxide semiconductor has been reported (see Non-Patent Document 8). In the display device, a displayed image is changed several tens of times per second. The number of times an image is changed per second is called a refresh rate. The refresh rate is also referred to as driving frequency. Such high-speed screen switching that is hard for human eyes to recognize is considered as a cause of eye strain. Thus, Non-Patent Document 8 has proposed that the refresh rate of a display device is lowered to reduce the number of image rewriting operations. Moreover, driving with a lowered refresh rate enables the power consumption of the display device to be reduced. Here, such a driving method is referred to as idling stop (IDS) driving.

The CAAC structure and the nc structure contribute to an improvement in electrical characteristics and reliability of the transistor including an oxide semiconductor having the CAAC structure or the nc structure, a reduction in manufacturing cost, and an improvement in throughput. Furthermore, studies of applications of the transistor to the display device and LSI utilizing a low leakage current of the transistor have been developed.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, the CAC-OS or the CAC metal oxide can be called a matrix composite or a metal matrix composite.

[Structure of Metal Oxide]

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Containing Oxide Semiconductor]

Next, the case where the oxide semiconductor is used for a transistor will be described.

When the oxide semiconductor is used in a transistor, the transistor can have high field-effect mobility. In addition, the transistor can have high reliability.

Moreover, an oxide semiconductor with low carrier density is preferably used for the transistor. In order to reduce the carrier density of the oxide semiconductor film, the concentration of impurities in the oxide semiconductor film is reduced so that the density of defect states can be reduced. In this specification and the like, a state with a low impurity concentration and a low density of defect states is referred to as a highly purified intrinsic or substantially highly purified intrinsic state. The oxide semiconductor has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

A highly purified intrinsic or substantially highly purified intrinsic oxide semiconductor film has a low density of defect states and accordingly has a low density of trap states in some cases.

Charges trapped by the trap states in the oxide semiconductor takes a long time to be released and may behave like fixed charges. Thus, a transistor whose channel formation region is formed in the oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. As examples of the impurities, hydrogen, nitrogen, alkali metal, alkaline earth metal, iron, nickel, silicon, and the like are given.

[Impurity]

Here, the influence of impurities in the oxide semiconductor is described.

When silicon or carbon that is one of Group 14 elements is contained in the oxide semiconductor, defect states are formed. Thus, the concentration of silicon or carbon (the concentration is measured by secondary ion mass spectrometry (SIMS)) in the oxide semiconductor and the concentration of silicon or carbon in the vicinity of an interface with the oxide semiconductor (the concentration is measured by SIMS) is set to be lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; for example, the concentration of nitrogen in the oxide semiconductor measured by SIMS is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. For this reason, hydrogen in the oxide semiconductor is preferably reduced as much as possible. Specifically, the hydrogen concentration of the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

<Structure Example 2 of Semiconductor Device>

An example of a semiconductor device including the cell 600 of one embodiment of the present invention is described below with reference to FIGS. 7A to 7C.

Figure 7A:
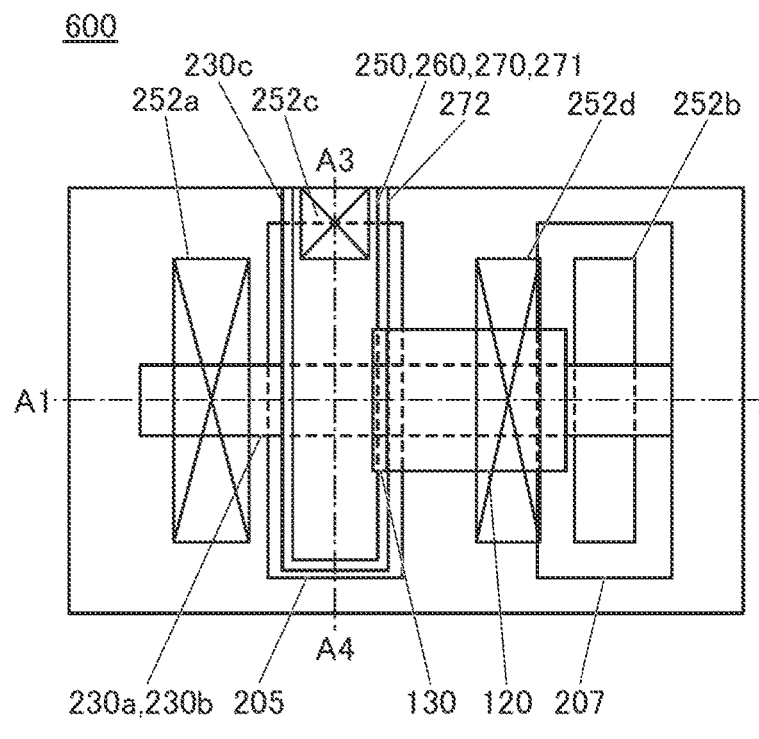
FIGS. 7A to 7C are a top view and cross-sectional views of a semiconductor device of one embodiment of the present invention.

FIG. 7A is a top view of the cell 600. Furthermore, FIGS. 7B and 7C are cross-sectional views of the cell 600. FIG. 7B is a cross-sectional view taken along dashed-dotted line A1-A2 in FIG. 7A, which corresponds to a cross-sectional view in the channel length direction of the transistor 200. FIG. 7C is a cross-sectional view taken along dashed-dotted line A3-A4 in FIG. 7A, which corresponds to a cross-sectional view in the channel width direction of the transistor 200. For simplification of the drawing, some components are not illustrated in the top view in FIG. 7A.

Figure 7C:
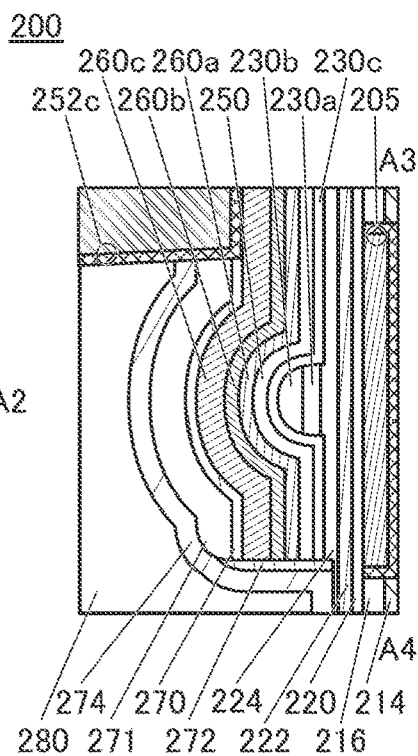
Figure 7B:
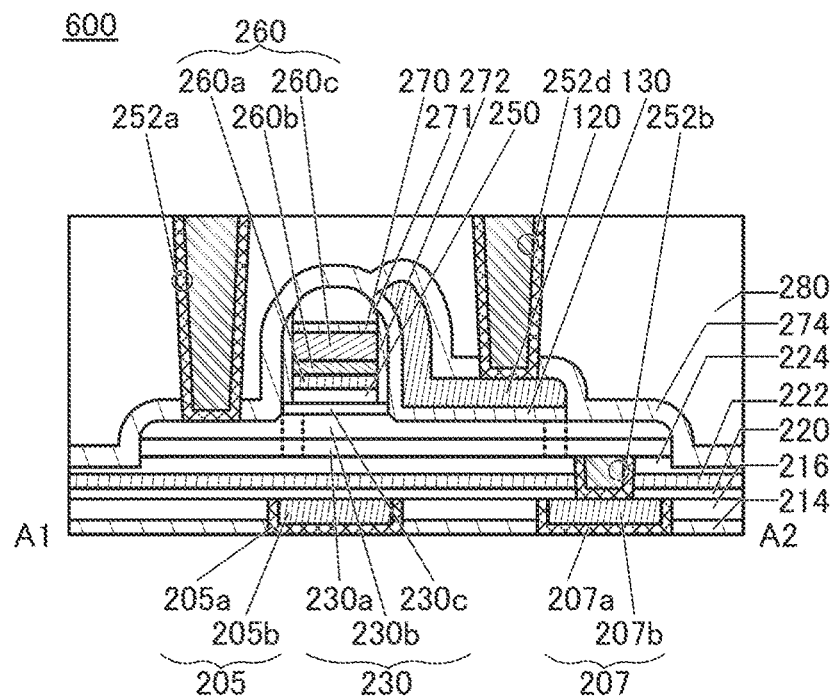

Note that in the semiconductor device illustrated in FIGS. 7A to 7C, components having the same functions as the components included in the semiconductor device described in <Structure example 1 of semiconductor device> are denoted by the same reference numerals.

A structure of the cell 600 is described with reference to FIGS. 7A to 7C below. Note that also in this section, the materials described in detail in <Structure example 1 of semiconductor device> can be used as materials of the cell 600.

[Cell 600]

The cell 600 illustrated in FIGS. 7A to 7C differs from the semiconductor device described in <Structure example 1 of semiconductor device> at least in the shape of the conductor 252b which is electrically connected to the transistor 200.

Figure 8A:
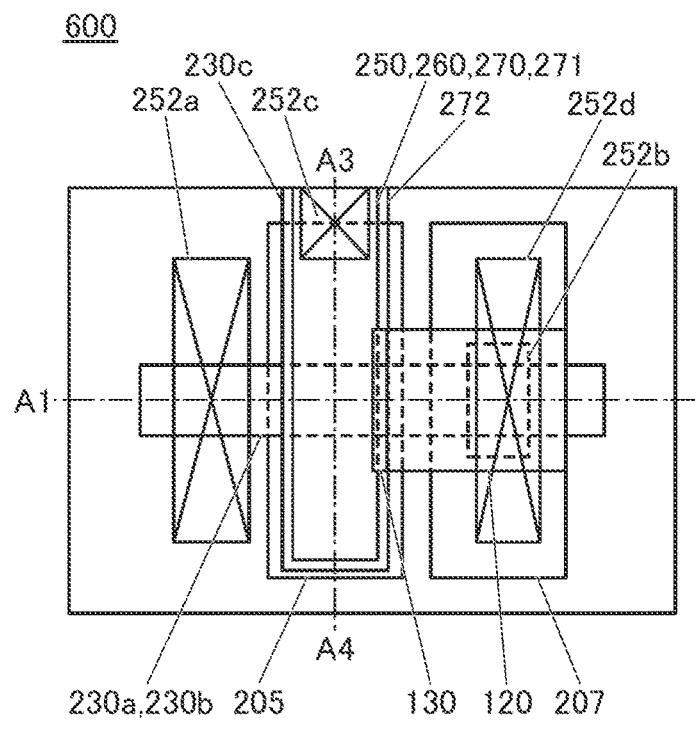
FIGS. 8A to 8C are a top view and cross-sectional views of a semiconductor device of one embodiment of the present invention.
Figure 8C:
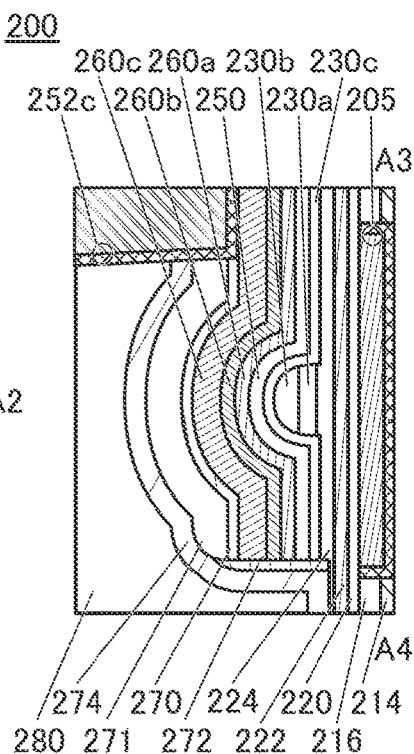
Figure 8B:
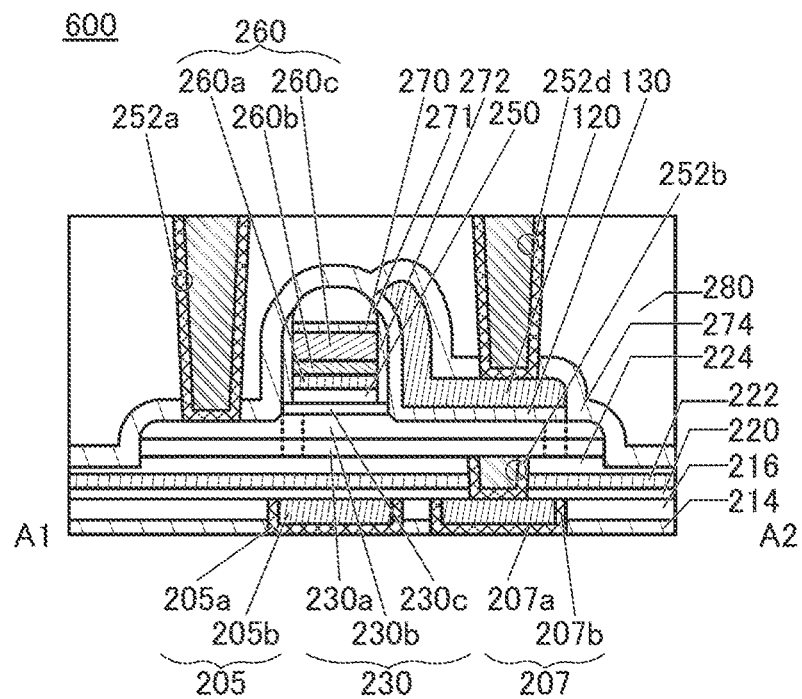
Figure 9A:
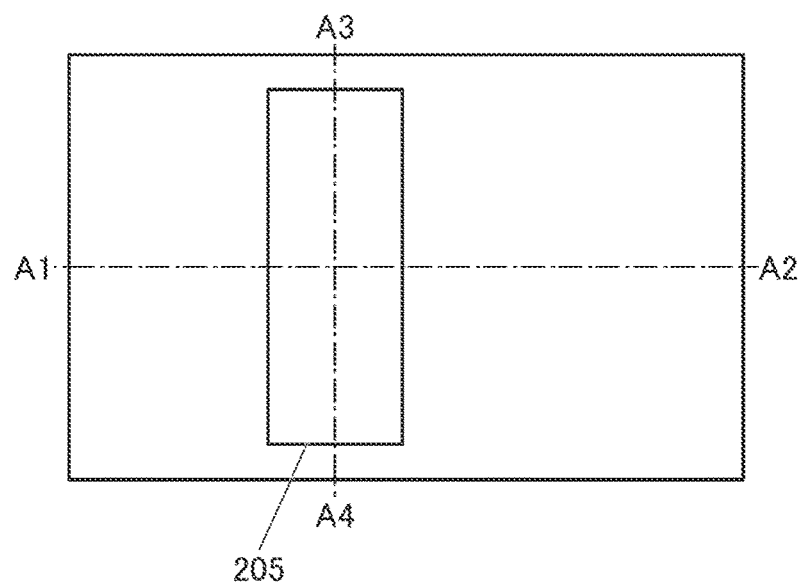
FIGS. 9A to 9C are a top view and cross-sectional views illustrating a method for manufacturing a semiconductor device of one embodiment of the present invention.
Figure 9C:
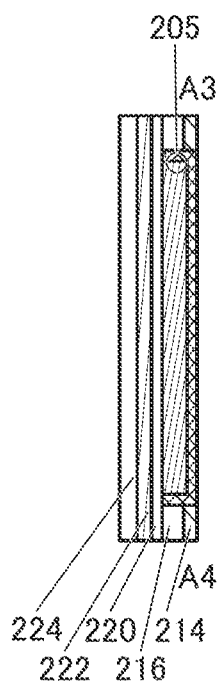
Figure 9B:
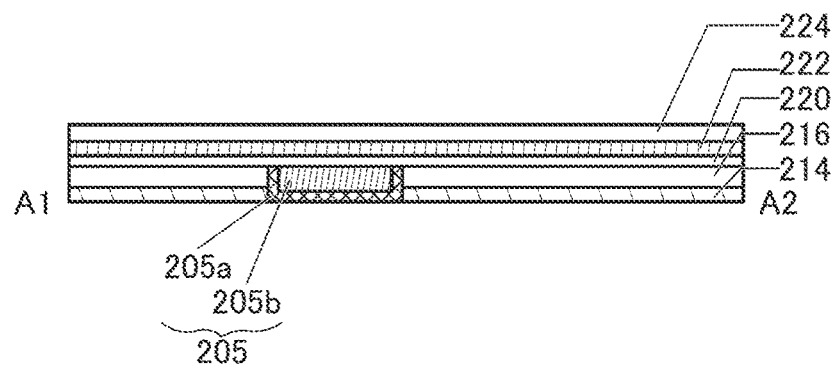

Specifically, as illustrated in FIGS. 7A to 7C, the conductor 252b which is electrically connected to the region 231b of the transistor 200 illustrated in FIGS. 5A to 5C may be in contact with the bottom portion of the oxide 230a. Furthermore, in the case where the cell 600 is electrically connected to the another structure body provided below the cell 600, a lead wiring above the cell 600 which is electrically connected to the conductor 252b, a plug which electrically connects the lead wiring to the structure body provided below the cell 600, and the like are unnecessary. Thus, the area of the cell 600 can be reduced, and the process can be shortened. Note that in FIGS. 7A to 7C, the conductor 252b is in contact with a bottom portion of the region 231b of the oxide 230; however, this embodiment is not limited thereto. As illustrated in FIGS. 8A to 8C, the conductor 252b may be in contact with a bottom portion of the region 234. With such a structure, the conductors 207 and 252b and the conductor 252d can overlap with each other with the capacitor 100 provided therebetween to further reduce the area of the cell 600.

For example, the conductor 207 can be formed in the same step as the conductor 205.

<Method 1 for Manufacturing Semiconductor Device>

Next, a method for manufacturing a semiconductor device including the transistor 200 of one embodiment of the present invention is described with reference to FIGS. 9A to 9C to FIGS. 21A to 21C. FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A are top views. FIG. 9B, FIG. 10B, FIG. 11B, FIG. 12B, FIG. 13B, FIG. 14B, FIG. 15B, FIG. 16B, FIG. 17B, FIG. 18B, FIG. 19B, FIG. 20B, and FIG. 21B are cross-sectional views taken along dashed-dotted lines A1-A2 in FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A. FIG. 9C, FIG. 10C, FIG. 11C, FIG. 12C, FIG. 13C, FIG. 14C, FIG. 15C, FIG. 16C, FIG. 17C, FIG. 18C, FIG. 19C, FIG. 20C, and FIG. 21C are cross-sectional views taken along dashed-dotted lines A3-A4 in FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A.

First, a substrate (not illustrated) is prepared, and the insulator 214 is formed over the substrate. The insulator 214 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity in some cases.

In this embodiment, aluminum oxide is formed as the insulator 214 by a sputtering method. The insulator 214 may have a multilayer structure. For example, the multilayer structure may be formed in such a manner that an aluminum oxide is formed by a sputtering method and an aluminum oxide is formed over the aluminum oxide by an ALD method. Alternatively, the multilayer structure may be formed in such a manner that an aluminum oxide is formed by an ALD method and an aluminum oxide is formed over the aluminum oxide by a sputtering method.

Next, the insulator 216 is formed over the insulator 214. The insulator 216 can be formed by a sputtering method, a CVD method, an MBE method, a PLD method, an ALD method, or the like. In this embodiment, as the insulator 216, silicon oxide is formed by a CVD method.

Then, an opening is formed in the insulators 214 and 216. Examples of the opening include grooves and slits. A region where the opening is formed may be referred to as an opening portion. The opening can be formed by wet etching; however, dry etching is preferable for microfabrication. In the case where an opening is formed in the insulator 216, the insulator 214 may be used as an etching stopper film used in forming the groove by etching the insulator 216. For example, in the case where a silicon oxide film is used as the insulator 216 in which the groove is to be formed, the insulator 214 is preferably formed using a silicon nitride film, an aluminum oxide film, or a hafnium oxide film as an insulating film serving as an etching stopper film.

After formation of the opening, a conductive film to be the conductor 205a is formed. The conductive film preferably includes a conductor that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. A conductor to be the conductor 205a is formed by a sputtering method, a CVD method, an MBE method, a PLD method, an ALD method, or the like.

In this embodiment, as the conductive film to be the conductor 205a, tantalum nitride or a stacked film of tantalum nitride and titanium nitride formed over the tantalum nitride is formed by a sputtering method. Even when a metal that is easily diffused, such as copper, is used for the conductor 205b to be described later, the use of such a metal nitride as the conductor 205a can prevent the metal from being diffused to the outside of the conductor 205a.

Next, a conductive film to be the conductor 205b is formed over the conductive film to be the conductor 205a. The conductive film can be formed by a sputtering method, a CVD method, an MBE method, a PLD method, an ALD method, or the like. In this embodiment, as the conductive film to be the conductor 205b, a low-resistant conductive material such as tungsten and copper is formed.

Next, by CMP treatment, the conductive film to be the conductor 205a and the conductive film to be the conductor 205b are partly removed to expose the insulator 216. As a result, the conductive film to be the conductor 205a and the conductive film to be the conductor 205b remain only in the opening. Thus, the conductor 205 including the conductors 205a and 205b, which has a flat top surface, can be formed (see FIGS. 9A to 9C). Note that the insulator 216 is partly removed by the CMP treatment in some cases.

Next, the insulator 220 is formed over the insulator 216 and the conductor 205. The insulator 220 can be formed by a sputtering method, a CVD method, an MBE method, a PLD method, an ALD method, or the like.

Then, the insulator 222 is formed over the insulator 220. The insulator 222 can be formed by a sputtering method, a CVD method, an MBE method, a PLD method, an ALD method, or the like.

In particular, an insulator containing oxides of one of or both aluminum and hafnium is preferably used as the insulator 222. As the insulator containing oxides of one of or both aluminum and hafnium, aluminum oxide, hafnium oxide, an oxide containing aluminum and hafnium (hafnium aluminate), or the like is preferably used. The insulator 222 is preferably formed by an ALD method. The insulator 222 formed by an ALD method has a barrier property against oxygen, hydrogen, and water. When the insulator 222 has a barrier property against hydrogen and water, hydrogen and water contained in structure bodies provided around the transistor 200 are not diffused into the transistor 200, and generation of oxygen vacancies in the oxide 230 can be inhibited.

Then, the insulator 224 is formed over the insulator 222. The insulator 224 can be formed by a sputtering method, a CVD method, an MBE method, a PLD method, an ALD method, or the like (see FIGS. 9A to 9C).

Subsequently, heat treatment is preferably performed. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in a nitrogen atmosphere, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

By the above heat treatment, impurities such as hydrogen and water included in the insulator 224 can be removed, for example.

Alternatively, in the heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 224. Alternatively, after plasma treatment using an inert gas with the apparatus, plasma treatment using oxygen in order to compensate for released oxygen may be performed. Note that the first heat treatment is not necessarily performed in some cases.

This heat treatment can also be performed after the formation of the insulator 220 and after the formation of the insulator 222. Although the heat treatment can be performed under the conditions for the heat treatment, heat treatment after the formation of the insulator 220 is preferably performed in an atmosphere containing nitrogen.

In this embodiment, the heat treatment is performed in a nitrogen atmosphere at 400° C. for one hour after formation of the insulator 224.

Figure 10A:
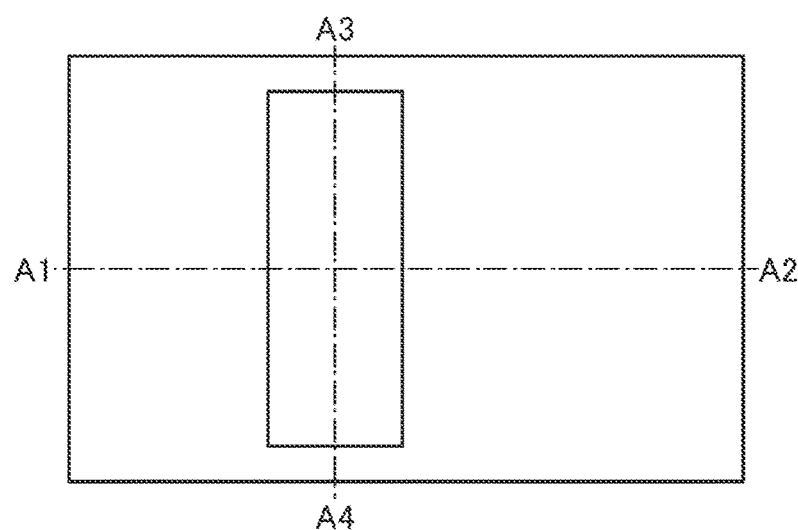
FIGS. 10A to 10C are a top view and cross-sectional views illustrating a method for manufacturing a semiconductor device of one embodiment of the present invention.
Figure 10C:
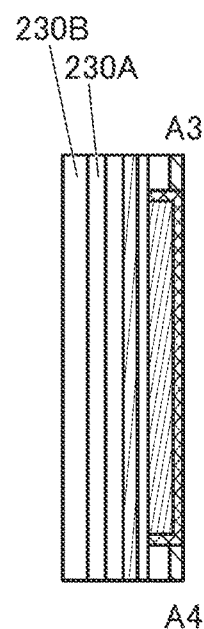
Figure 10B:
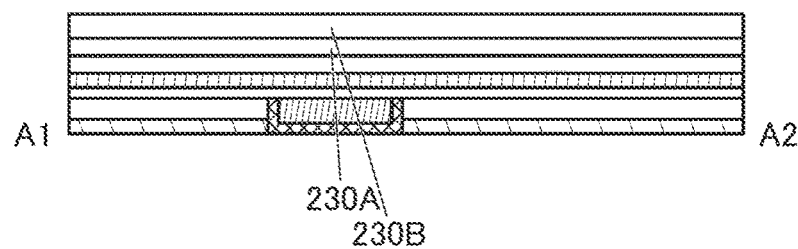

Next, an oxide film 230A to be the oxide 230a, and an oxide film 230B to be the oxide 230b are sequentially formed over the insulator 224 (see FIGS. 10A to 10C). Note that the oxide films are preferably formed successively without exposure to the air. When the oxide films are formed without exposure to the air, impurities or moisture from the air can be prevented from being attached to the oxide films 230A and 230B, so that an interface between the oxide films 230A and 230B and the vicinity of the interface can be kept clean.

The oxide films 230A and 230B can be formed by a sputtering method, a CVD method, an MBE method, a PLD method, an ALD method, or the like.

In the case where the oxide films 230A and 230B are formed by a sputtering method, for example, oxygen or a mixed gas of oxygen and a rare gas is used as a sputtering gas. By increasing the proportion of oxygen in the sputtering gas, the amount of excess oxygen in the oxide films to be formed can be increased. In the case where the above oxide films are formed by a sputtering method, the above In-M-Zn oxide target can be used.

In particular, when the oxide film 230A is formed, part of oxygen contained in the sputtering gas is supplied to the insulator 224 in some cases. Note that the proportion of oxygen in the sputtering gas for formation of the oxide film 230A is preferably 70% or higher, further preferably 80% or higher, and still further preferably 100%.

In the case where the oxide film 230B is formed by a sputtering method, when the proportion of oxygen in the sputtering gas is higher than or equal to 1% and lower than or equal to 30%, preferably higher than or equal to 5%, and lower than or equal to 20%, an oxygen-deficient oxide semiconductor is formed. A transistor including an oxygen-deficient oxide semiconductor can have relatively high field-effect mobility.

In this embodiment, the oxide film 230A is formed using a target with an atomic ratio of In:Ga:Zn=1:3:4 by a sputtering method. The oxide film 230B is formed using a target with an atomic ratio of In:Ga:Zn=4:2:4.1 by a sputtering method. Note that each of the oxide films is preferably formed by appropriate selection of film formation conditions and an atomic ratio to have characteristics required for the oxide 230.

Next, heat treatment may be performed. For the heat treatment, the conditions for the heat treatment can be used. By the heat treatment, impurities such as hydrogen and water contained in the oxide films 230A and 230B can be removed, for example. In this embodiment, treatment is performed in a nitrogen atmosphere at 400° C. for one hour, and successively another treatment is performed in an oxygen atmosphere at 400° C. for one hour.

Figure 11A:
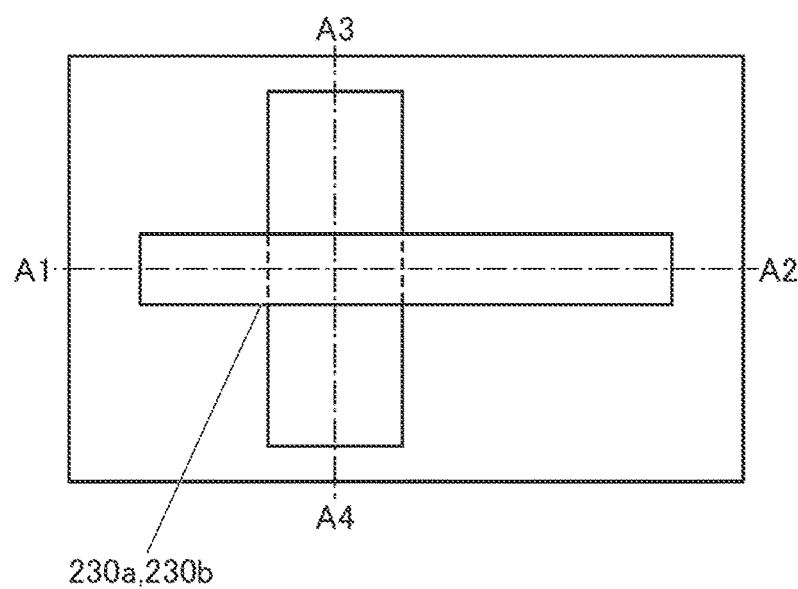
FIGS. 11A to 11C are a top view and cross-sectional views illustrating a method for manufacturing a semiconductor device of one embodiment of the present invention.
Figure 11C:
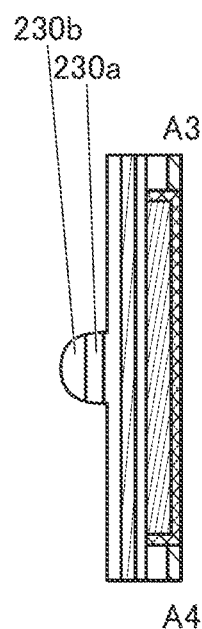
Figure 11B:
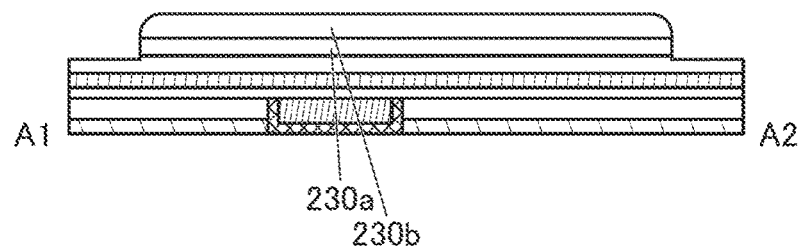

Then, the oxide films 230A and 230B are processed into island shapes to form the oxides 230a and 230b (see FIGS. 11A to 11C).

Note that in the above step, the insulator 224 may be processed into an island shape. Furthermore, the insulator 224 may be subjected to half-etching. The insulator 224 may be subjected to half-etching, in which case the insulator 224 remains under the oxide 230c to be formed in a later step. Note that the insulator 224 can be processed into island shapes when an insulating film 272A is processed in a later step. In this case, the insulator 222 may be used as an etching stopper film, for example.

The oxides 230a and 230b are formed to at least partly overlap with the conductors 205. It is preferable that the side surfaces of the oxides 230a and 230b be substantially perpendicular to the insulator 222, in which case a smaller area and higher density can be achieved when the plurality of transistors 200 are provided. Note that an angle formed by the side surfaces of the oxides 230a and 230b and the top surface of the insulator 222 may be an acute angle. In that case, the angle formed by the side surfaces of the oxides 230a and 230b and the top surface of the insulator 222 is preferably larger.

The oxide 230 has a curved surface between the side surfaces of the oxides 230a and 230b and the top surface of the oxide 230b. That is, an end portion of the side surface and an end portion of the top surface are preferably curved (hereinafter such a curved shape is also referred to as a rounded shape). The radius of curvature of the curved surface at end portions of the oxides 230a and 230b is greater than or equal to 3 nm and less than or equal to 10 nm, preferably greater than or equal to 5 nm and less than or equal to 6 nm.

Note that when the end portions are not angular, the coverage with films formed later in the film formation process can be improved.

Note that the oxide films may be processed by a lithography method. The processing can be performed by a dry etching method or a wet etching method. A dry etching method is suitable for microfabrication.

In the lithography method, first, a resist is exposed to light through a mask. Next, a region exposed to light is removed or left using a developing solution, so that a resist mask is formed. Then, etching through the resist mask is conducted. As a result, a conductor, a semiconductor, an insulator, or the like can be processed in to a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the oxide film 230B, a resist mask is formed thereover, and then the material of the hard mask is etched. The etching of the oxide films 230A and 230B may be performed after or without removal of the resist mask. In the latter case, the resist mask may be removed during the etching. The hard mask may be removed by etching after the etching of the oxide films. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, heat treatment may be performed. For the heat treatment, the conditions for the above heat treatment can be used.

Figure 12A:
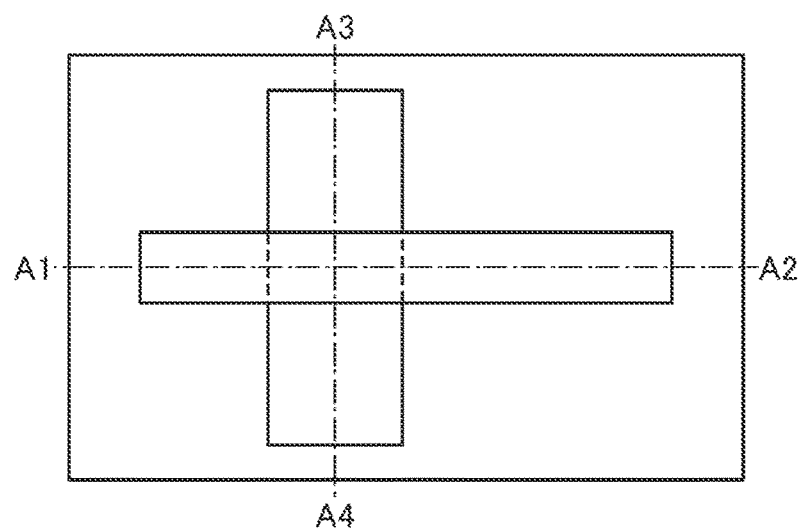
FIGS. 12A to 12C are a top view and cross-sectional views illustrating a method for manufacturing a semiconductor device of one embodiment of the present invention.
Figure 12C:
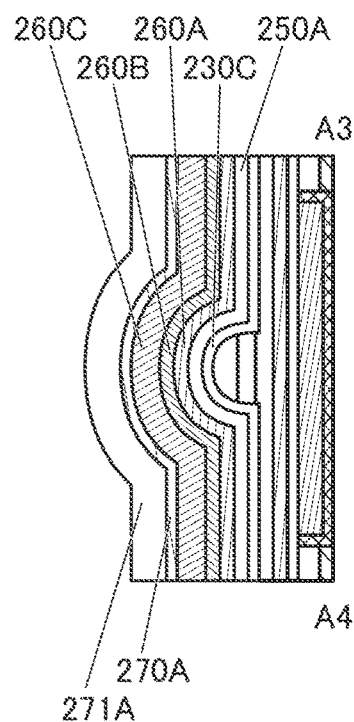
Figure 12B:
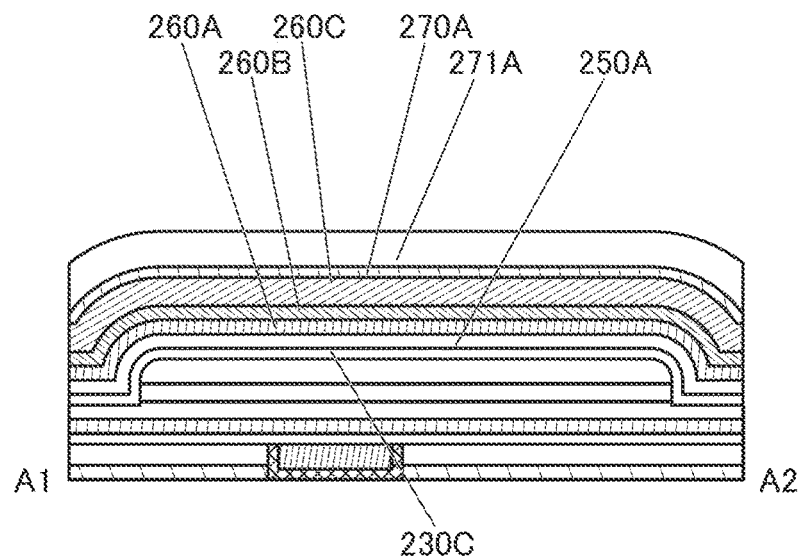
Figure 13A:
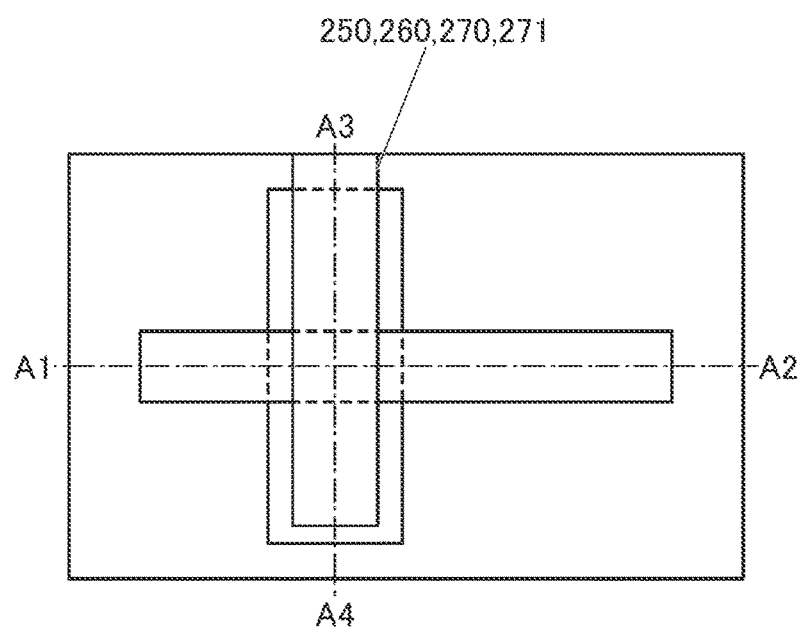
FIGS. 13A to 13C are a top view and cross-sectional views illustrating a method for manufacturing a semiconductor device of one embodiment of the present invention.
Figure 13C:
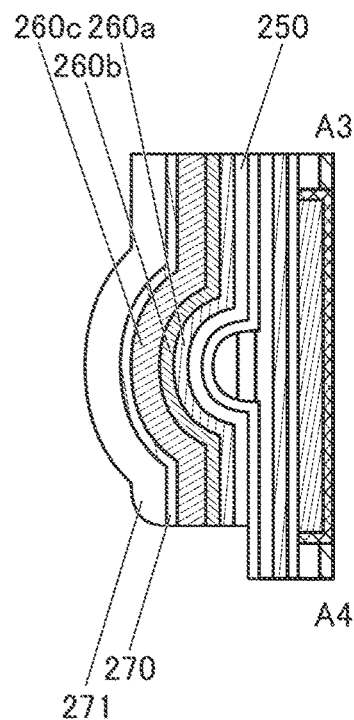
Figure 13B:
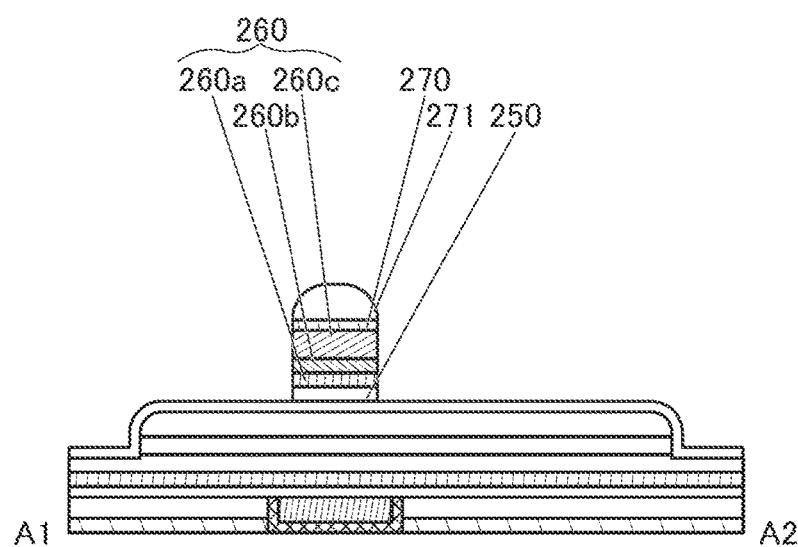

Then, an oxide film 230C, an insulating film 250A, a conductive film 260A, a conductive film 260B, a conductive film 260C, an insulating film 270A, and the insulating film 271A are formed in this order over the insulator 224, the oxide 230a, and the oxide 230b (see FIGS. 12A to 12C).

The oxide film 230C can be formed by a sputtering method, a CVD method, an MBE method, a PLD method, an ALD method, or the like. The oxide film 230C may be formed by a method similar to that of the oxide film 230A or the oxide film 230B in accordance with characteristics required for the oxide 230c. In this embodiment, the oxide film 230C is formed using a target with an atomic ratio of In:Ga:Zn=1:3:4 by a sputtering method.

The insulating film 250A can be formed by a sputtering method, a CVD method, an MBE method, a PLD method, an ALD method, or the like.

Note that oxygen is excited by microwaves to generate high-density oxygen plasma, and the insulating film 250A is exposed to the oxygen plasma, whereby oxygen can be supplied to the insulating film 250A, the oxide 230a, the oxide 230b, and the oxide film 230C.

Furthermore, heat treatment may be performed. For the heat treatment, the conditions for the above heat treatment can be used. The heat treatment can reduce the moisture concentration and the hydrogen concentration in the insulating film 250A.

The conductive film 260A can be formed by a sputtering method, a CVD method, an MBE method, a PLD method, an ALD method, or the like. Here, when an oxide semiconductor that can be used as the oxide 230 is subjected to treatment for reducing resistance, for example, the oxide semiconductor becomes a conductive oxide. Accordingly, an oxide that can be used as the oxide 230 may be formed as the conductive film 260A and the resistance of the oxide may be reduced in a later step. Note that when an oxide that can be used as the oxide 230 is formed as the conductive film 260A in an atmosphere containing oxygen by a sputtering method, oxygen can be added to the insulating film 250A. When oxygen is added to the insulating film 250A, the added oxygen can be supplied to the oxide 230 through the insulating film 250A.

The conductive film 260B can be formed by a sputtering method, a CVD method, an MBE method, a PLD method, an ALD method, or the like. In the case where an oxide semiconductor that can be used as the oxide 230 is used for the conductive film 260A, the conductive film 260B is formed by a sputtering method, whereby the conductive film 260A can have reduced an electric resistance value and become a conductor. Such a conductor can be called an oxide conductor (OC) electrode. A conductor may be further formed over the conductor over the OC electrode by a sputtering method or the like.

Furthermore, when a low-resistance metal film is stacked as the conductive film 260C, a transistor with a low driving voltage can be provided.

Subsequently, heat treatment can be performed. For the heat treatment, the conditions for the above heat treatment can be used. Note that the heat treatment is not necessarily performed in some cases. In this embodiment, the heat treatment is performed in a nitrogen atmosphere at 400° C. for one hour.

The insulating film 270A can be formed by a sputtering method, a CVD method, an MBE method, a PLD method, an ALD method, or the like. The insulating film 270A which serves as a barrier film is formed using an insulating material having a function of inhibiting the penetration of oxygen and impurities such as water and hydrogen. For example, aluminum oxide or hafnium oxide is preferably used. Thus, oxidation of the conductor 260 can be prevented. This can prevent entry of impurities such as water or hydrogen into the oxide 230 through the conductor 260 and the insulator 250.

The insulating film 271A can be formed by a sputtering method, a CVD method, an MBE method, a PLD method, an ALD method, or the like. Here, the thickness of the insulating film 271A is preferably larger than that of the insulating film 272A to be formed in a later step. In that case, when the insulator 272 is formed in the following process, the insulator 271 can remain easily over the conductor 260.

The insulator 271 functions as a hard mask. The provision of the insulator 271 makes it possible for the side surface of the insulator 250, the side surface of the conductor 260a, the side surface of the conductor 260b, the side surface of the conductor 260c, and the side surface of the insulator 270 to be formed substantially perpendicular to the substrate.

Next, the insulating film 271A is etched to form the insulator 271. Then, using the insulator 271 as a mask, the insulating film 250A, the conductive film 260A, the conductive film 260B, the conductive film 260C, and the insulating film 270A are etched to form the insulator 250, the conductor 260 (the conductor 260a, the conductor 260b, and the conductor 260c), and the insulator 270 (see FIGS. 13A to 13C). Note that after the processing, the following process may be performed without removal of the hard mask. The hard mask can also function as a hard mask used in a step of adding a dopant, which is to be performed later.

The side surface of the insulator 250, a side surface of the conductor 260a, a side surface of the conductor 260b, and the side surface of the insulator 270 are preferably on the same surface. It is preferable that the surface shared by the side surfaces of the insulator 250, the conductor 260a, the conductor 260b, and the insulator 270 be substantially perpendicular to the substrate. That is, in a cross section, an angle between the top surface of the oxide 230 and the side surfaces of the insulator 250, the conductor 260a, the conductor 260b, and the insulator 270 is preferably an acute angle and larger. Note that in the cross section, the angle formed by the top surface of the oxide 230 and the side surfaces of the insulator 250, the conductor 260a, the conductor 260b, and the insulator 270 may be an acute angle. In that case, the angle formed by the top surface of the oxide 230 and the side surfaces of the insulator 250, the conductor 260a, the conductor 260b, and the insulator 270 is preferably as large as possible.

The insulator 250, the conductor 260, and the insulator 270 are formed to at least partly overlap with the conductor 205 and the oxide 230.

Note that an upper portion of the oxide film 230C in a region not overlapping with the insulator 250 may be etched by the above etching. In that case, the oxide film 230C may be thicker in the region overlapping with the insulator 250 than in the region not overlapping with the insulator 250.

Figure 14A:
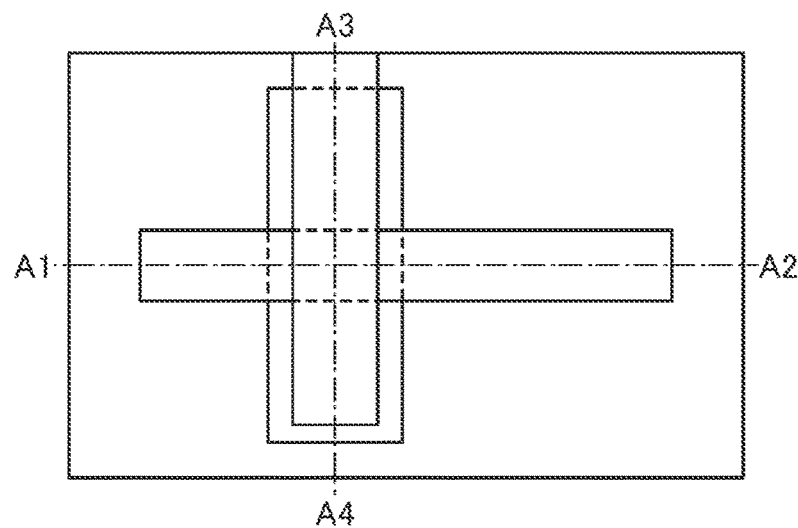
FIGS. 14A to 14C are a top view and cross-sectional views illustrating a method for manufacturing a semiconductor device of one embodiment of the present invention.
Figure 14C:
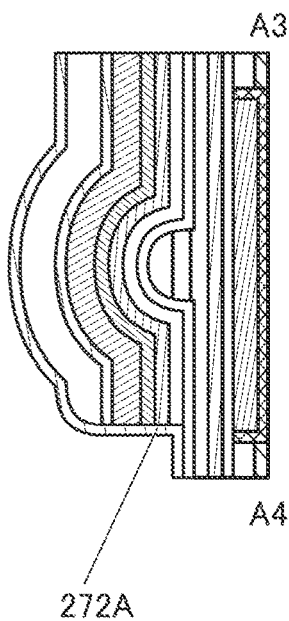
Figure 14B:
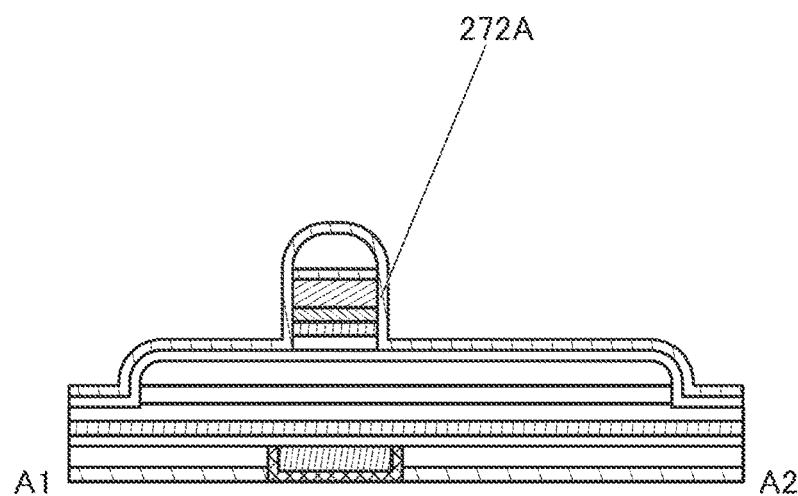

Next, the insulating film 272A is formed to cover the oxide film 230C, the insulator 250, the conductor 260, the insulator 270, and the insulator 271 (see FIGS. 14A to 14C). The insulating film 272A is preferably formed by an ALD method, which enables good coverage. By using an ALD method, the insulating film 272A having a uniform thickness can be formed on the side surfaces of the insulator 250, the conductor 260, and the insulator 270 even in a step portion formed by the conductor 260 and the like.

Figure 15A:
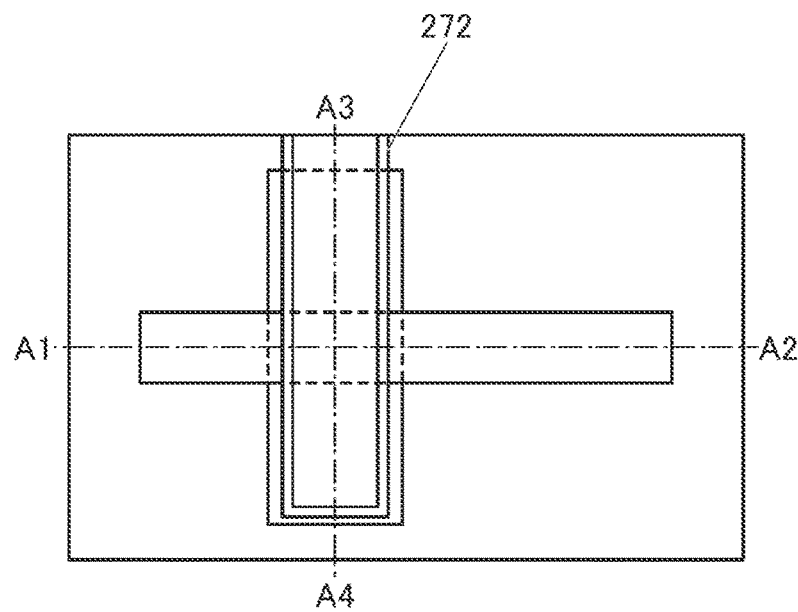
FIGS. 15A to 15C are a top view and cross-sectional views illustrating a method for manufacturing a semiconductor device of one embodiment of the present invention.
Figure 15C:
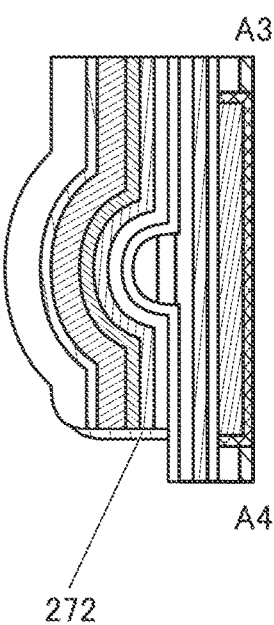
Figure 15B:
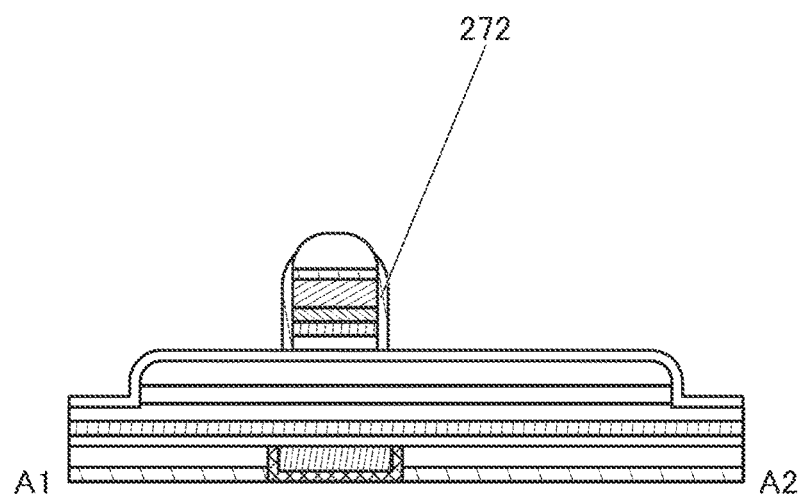

Next, the insulating film 272A is subjected to anisotropic etching, whereby the insulator 272 is formed in contact with side surfaces of the insulator 250, the conductor 260, and the insulator 270 (see FIGS. 15A to 15C). Dry etching is preferably performed as the anisotropic etching. In this manner, the insulating film in a region on a plane substantially parallel to the substrate can be removed, so that the insulator 272 can be formed in a self-aligned manner.

Here, the insulator 271 is formed over the insulator 270, whereby the insulator 270 can be left even when portions of the insulating film 272A that are over the insulator 270 are removed. The height of a structure body composed of the insulator 250, the conductor 260, the insulator 270, and the insulator 271 is larger than the total height of the oxide 230a, the oxide 230b, and the oxide film 230C, whereby the insulating film 272A on the side surfaces of the oxide 230a and the oxide 230b with the oxide film 230C provided therebetween can be removed. Furthermore, when the end portions of the oxides 230a and 230b each have a rounded shape, time taken to remove the insulating film 272A formed on the side surfaces of the oxides 230a and 230b with the oxide film 230C provided therebetween can be shortened, leading to easier formation of the insulator 272.

Figure 16A:
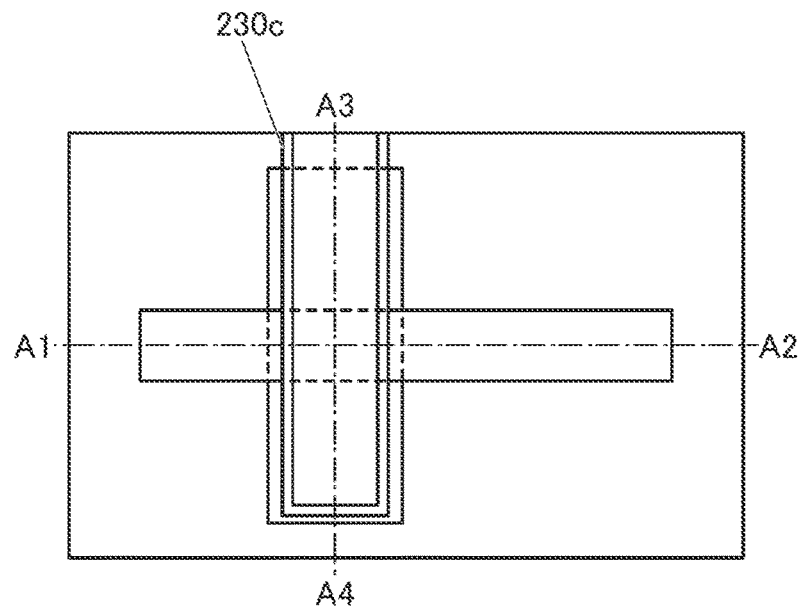
FIGS. 16A to 16C are a top view and cross-sectional views illustrating a method for manufacturing a semiconductor device of one embodiment of the present invention.
Figure 16C:
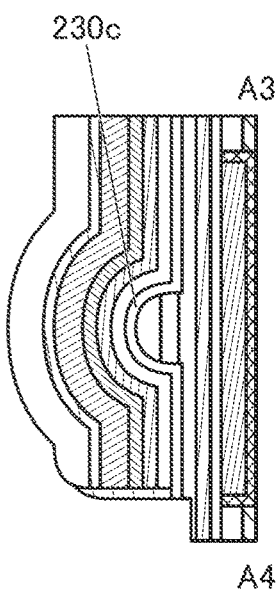
Figure 16B:
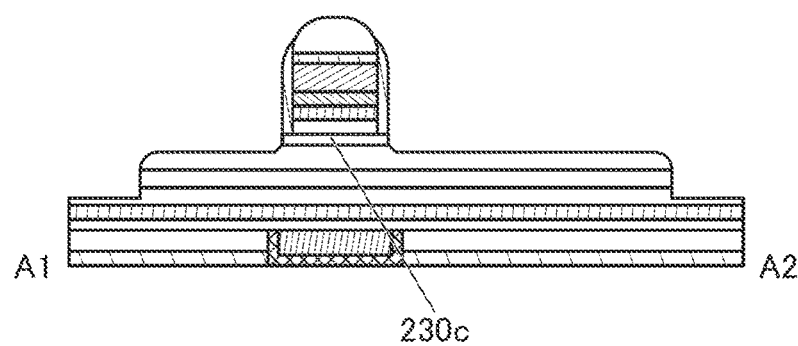

Next, the oxide film 230C is etched with the insulator 250, the conductor 260, the insulator 270, the insulator 271, and the insulator 272 as masks to remove part of the oxide film 230C, so that the oxide 230c is formed (see FIGS. 16A to 16C). Note that through the present process, the top surface and the side surfaces of the oxide 230b and part of the side surfaces of the oxide 230a are removed in some cases.

Figure 17A:
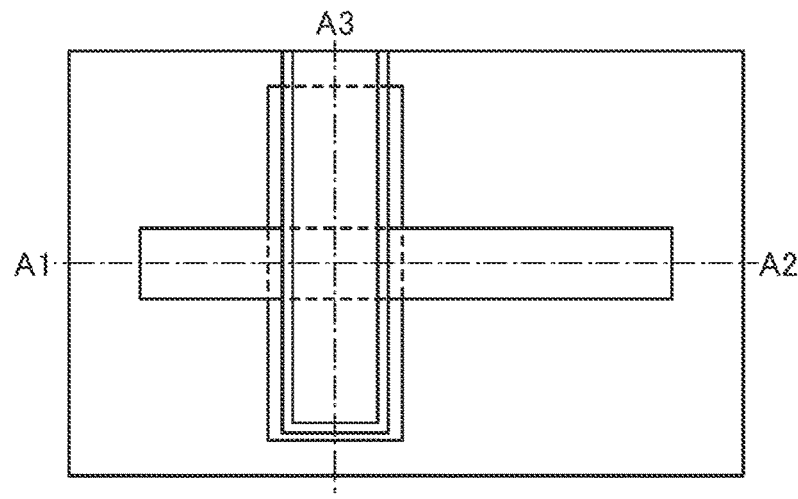
FIGS. 17A to 17C are a top view and cross-sectional views illustrating a method for manufacturing a semiconductor device of one embodiment of the present invention.
Figure 17C:
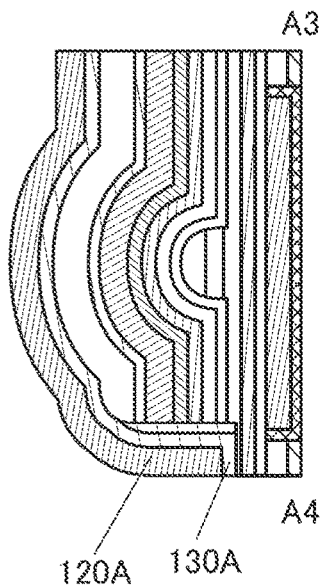
Figure 17B:
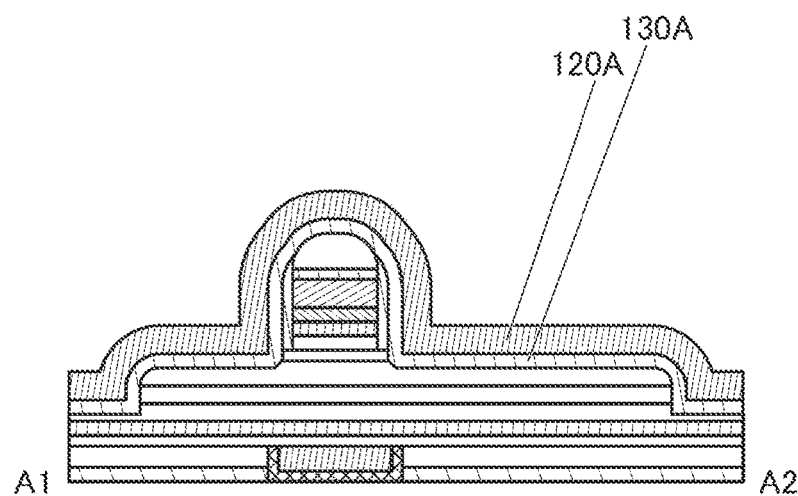

Next, an insulating film 130A and a conductive film 120A are formed to cover the insulator 224, the oxide 230, the insulator 272, and the insulator 271 (see FIGS. 17A to 17C).

The insulating film 130A has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, a stacked-layer structure of a high-k material such as aluminum oxide and a material with high dielectric strength such as silicon oxynitride is preferably used. The structure enables the capacitor 100 to include a high-k material and a material with high dielectric strength; thus, the required capacitance can be provided, the dielectric strength can be increased, and the electrostatic breakdown of the capacitor 100 can be prevented, which leads to improvement in the reliability of the capacitor 100.

The conductive film 120A can be formed by a sputtering method, a CVD method, an MBE method, a PLD method, an ALD method, or the like.

Figure 18A:
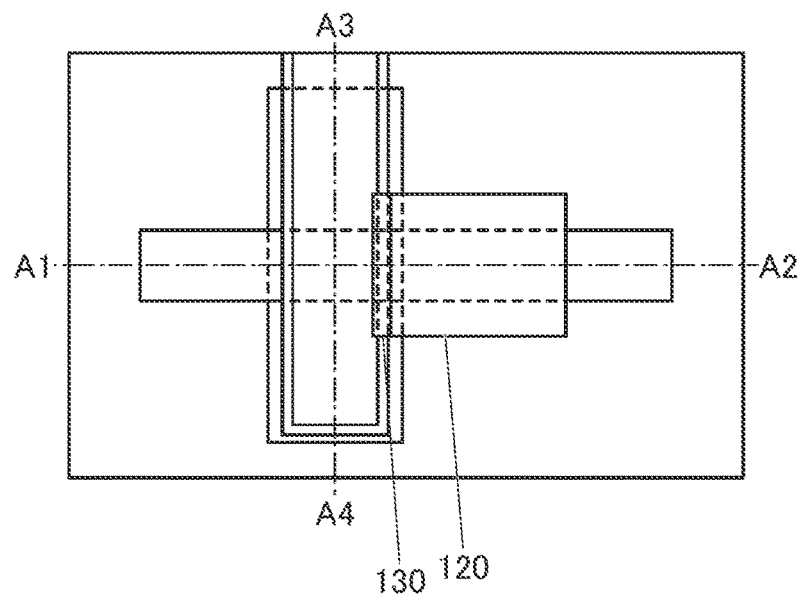
FIGS. 18A to 18C are a top view and cross-sectional views illustrating a method for manufacturing a semiconductor device of one embodiment of the present invention.
Figure 18C:
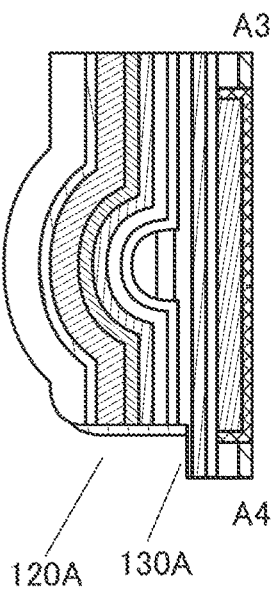
Figure 18B:
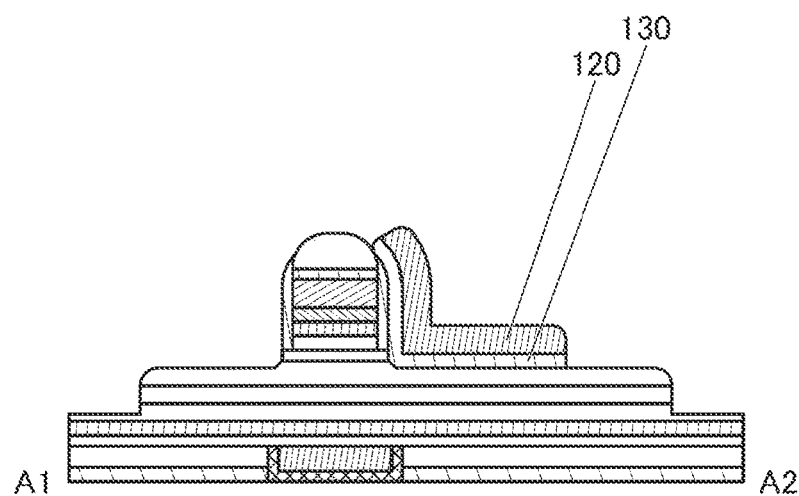

Next, the conductive film 120A and the insulating film 130A are processed by a lithography method to form the conductor 120 and the insulator 130 (see FIGS. 18A to 18C). For the processing of the conductive film 120A and the insulating film 130A, a dry etching method, a wet etching method, or a combination of these methods can be used. A dry etching method in which anisotropic etching can be achieved is preferable because of its excellent microfabrication. In contrast, by using a wet etching, which allows isotropic etching, the conductive film 120A and the insulating film 130A on the side surfaces of the oxide 230, the side surfaces of the insulator 250, and the side surfaces of the insulator 272 are easily removed. Thus, processing in which the dry etching method and the wet etching method are combined is preferable because the conductor 120 and the insulator 130 with favorable shapes can be formed.

Here, the region 231, the junction region 232, and the region 234 may be formed in the oxide 230a, the oxide 230b, and the oxide 230c. The region 231 and the junction region 232 are low-resistance regions which are obtained by adding a metal atom such as indium or impurities to a metal oxide formed as the oxide 230a, the oxide 230b, and the oxide 230c. Note that each of the regions has higher conductivity than at least the oxide 230b in the region 234.

In order to reduce the resistance of the region 231 and the junction region 232, a dopant which is at least one of the metal element such as indium and the impurities is added, for example.

For the addition of the dopant, an ion implantation method by which an ionized source gas is subjected to mass separation and then added, an ion doping method by which an ionized source gas is added without mass separation, a plasma immersion ion implantation method, or the like can be used. In the case of performing mass separation, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant," the term "ion," "donor," "acceptor," "impurity," "element," or the like may be used.

A dopant may be added by plasma treatment. In this case, the plasma treatment is performed with a plasma CVD apparatus, a dry etching apparatus, or an ashing apparatus, so that a dopant can be added to the oxide 230a, the oxide 230b, and the oxide 230c.

Furthermore, in the case where impurities are added as dopants, a film containing a dopant may be formed in contact with the region 231. For example, the insulator 274 containing hydrogen, boron, carbon, nitrogen, fluorine, phosphorus, or the like as a dopant is formed in contact with the region 231 of the oxide 230 (see FIGS. 19A to 19C). Due to the formation of the insulator 274 and the heat treatment after the formation, the resistance of the region 231 is reduced, and the junction region 232 is formed. It is considered that the dopants contained in the insulator 274 are diffused into the region 231 and the junction region 232 to reduce the resistance of the region.

When the indium content in the oxide 230a, the oxide 230b, and the oxide 230c is increased, the carrier density can be increased and the resistance can be decreased. Accordingly, as a dopant, a metal element that improves the carrier density of the oxide 230a, the oxide 230b, and the oxide 230c, such as indium, can be used.

That is, when the content of a metal atom such as indium in the oxide 230a, the oxide 230b, and the oxide 230c is increased in the region 231 and the junction region 232, the electron mobility can be increased and the resistance can be decreased.

Accordingly, the atomic ratio of indium to the element M at least in the region 231 is larger than the atomic ratio of indium to the element M in the region 234.

As the dopant, the element forming an oxygen vacancy, the element trapped by an oxygen vacancy, or the like may be used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

When the junction region 232 is provided in the transistor 200, high-resistance regions are not formed between the region 231 functioning as the source region and the drain region and the region 234 where a channel is formed, so that the on-state current and the carrier mobility of the transistor can be increased. Since the gate does not overlap with the source and drain regions in the channel length direction owing to the junction region 232, formation of unnecessary capacitance can be suppressed. A leakage current in an off state can be reduced owing to the junction region 232.

Thus, by appropriately selecting the areas of the region 231a and the region 231b, a transistor having electrical characteristics necessary for the circuit design can be easily provided.

Figure 19A:
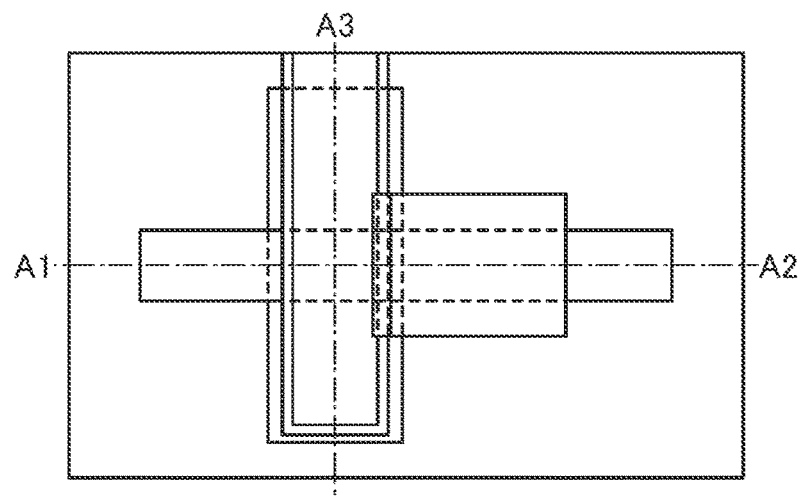
FIGS. 19A to 19C are a top view and cross-sectional views illustrating a method for manufacturing a semiconductor device of one embodiment of the present invention.
Figure 19C:
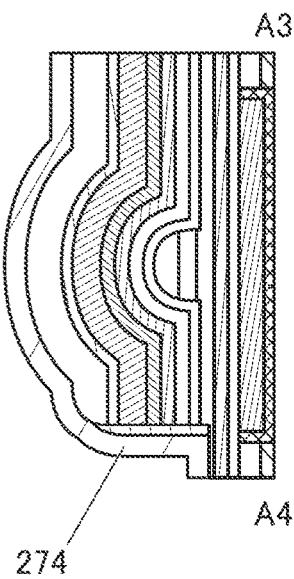
Figure 19B:
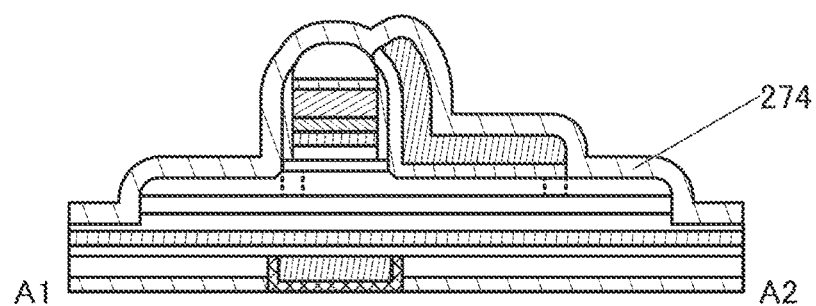

In this embodiment, the insulator 274 is formed to cover the insulator 224, the oxide 230, the insulator 271, the insulator 272, the insulator 130, and the conductor 120 (see FIGS. 19A to 19C).

For the insulator 274, silicon nitride, silicon nitride oxide, silicon oxynitride, or the like which is formed by a CVD method can be used. In this embodiment, silicon nitride oxide is used for the insulator 274.

When the insulator 274 containing an element serving as an impurity such as nitrogen is formed in contact with the oxide 230, impurity elements such as hydrogen and nitrogen, which are contained in a deposition atmosphere of the insulator 274, are added to the regions 231a and 231b. Oxygen vacancies are formed because of the added impurity elements, and the impurity elements enter the oxygen vacancies mainly in a region of the oxide 230 which is in contact with the insulator 274, thereby increasing the carrier density and reducing the resistance. At this time, the impurities are diffused also into the junction region 232 that is not in contact with the insulator 274, whereby the resistance of the region 232 is reduced.

Therefore, the region 231a and the region 231b preferably have a higher concentration of at least one of hydrogen and nitrogen than the region 234. The concentration of hydrogen or nitrogen is measured by SIMS or the like. Here, the concentration of hydrogen or nitrogen in the middle of the region of the oxide 230b that overlaps with the insulator 250 (e.g., a portion in the oxide 230b which is located equidistant from both side surfaces in the channel length direction of the insulator 250) is measured as the concentration of hydrogen or nitrogen in the region 234.

The region 231 and the junction region 232 are reduced in resistance when an element forming an oxygen vacancy or an element trapped by an oxygen vacancy is added thereto. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. Accordingly, the region 231 and the junction region 232 are made to include one or more of the above elements.

In addition, as the insulator 274, a film which extracts and absorbs oxygen contained in the region 231 and the junction region 232 may be used. When oxygen is extracted, oxygen vacancies are generated in the region 231 and the junction region 232. Hydrogen, boron, carbon, nitrogen, fluorine, phosphorus, sulfur, chlorine, titanium, a rare gas, or the like is trapped by oxygen vacancies, whereby the resistance of the region 231 and the junction region 232 is reduced.

To form the insulator 274 as an insulator containing an element serving as an impurity or an insulator extracting oxygen from the oxide 230, a sputtering method, a CVD method, an MBE method, a PLD method, an ALD method, or the like can be used.

The insulator 274 containing an element serving as an impurity is preferably formed in an atmosphere containing at least one of nitrogen and hydrogen. In that case, oxygen vacancies are formed mainly in the region of the oxides 230b and 230c not overlapping with the insulator 250 and the oxygen vacancies and impurity elements such as nitrogen and hydrogen are bonded to each other, leading to an increase in carrier density. In this manner, the regions 231a and 231b with reduced resistance can be formed. For the insulator 274, for example, silicon nitride, silicon nitride oxide, or silicon oxynitride can be formed by a CVD method. In this embodiment, silicon nitride oxide is used for the insulator 274.

Accordingly, a source region and a drain region can be formed in a self-aligned manner owing to the formation of the insulator 274. Thus, minute or highly integrated semiconductor devices can be manufactured with high yield.

Here, the top and side surfaces of the conductor 260 and the insulator 250 are covered with the insulators 270 and 272, whereby impurity elements such as nitrogen and hydrogen can be prevented from entering the conductor 260 and the insulator 250. Thus, impurity elements such as nitrogen and hydrogen can be prevented from entering the region 234 functioning as the channel formation region of the transistor 200 through the conductor 260 and the insulator 250. Accordingly, the transistor 200 having favorable electrical characteristics can be provided.

Note that although the region 231, the junction region 232, and the region 234 are formed by the reduction in the resistance of the oxide 230 due to the formation of the insulator 274 in the above, this embodiment is not limited thereto. For example, these regions and the like may be formed by dopant addition treatment or plasma treatment, or the combination of these treatments.

For example, plasma treatment may be performed on the oxide 230 using the insulator 250, the conductor 260, the insulator 272, the insulator 270, the insulator 271, the insulator 130, and the conductor 120 as masks. The plasma treatment is performed in an atmosphere containing the above-described element forming an oxygen vacancy or the above-described element trapped by an oxygen vacancy. For example, the plasma treatment is performed using an argon gas and a nitrogen gas.

Subsequently, heat treatment can be performed. For the heat treatment, the conditions for the above heat treatment can be used. The heat treatment allows diffusion of the added dopant into the junction region 232 in the oxide 230, resulting in an increase in on-state current.

Figure 20A:
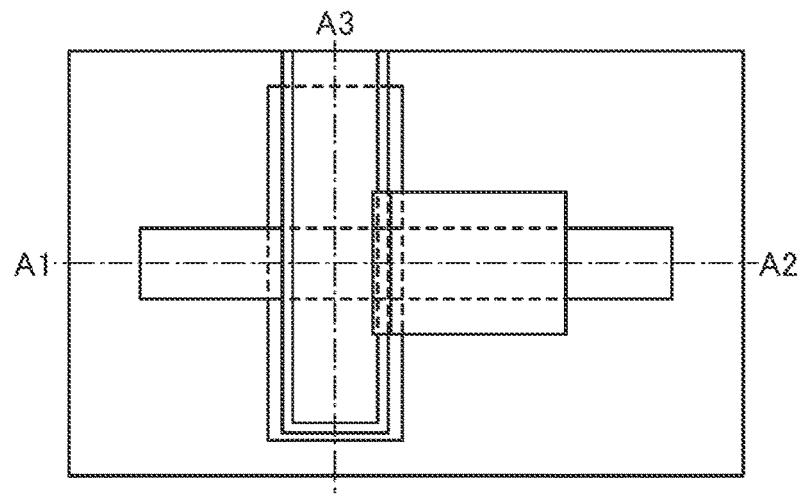
FIGS. 20A to 20C are a top view and cross-sectional views illustrating a method for manufacturing a semiconductor device of one embodiment of the present invention.
Figure 20C:
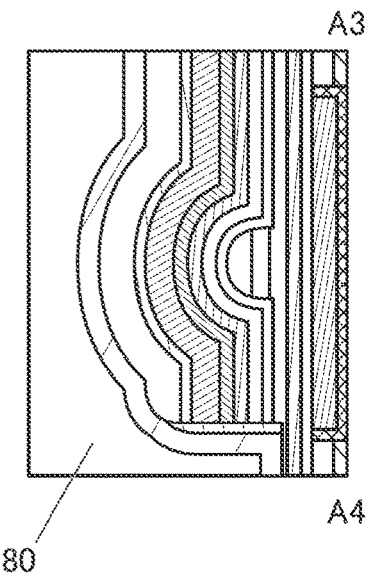
Figure 20B:
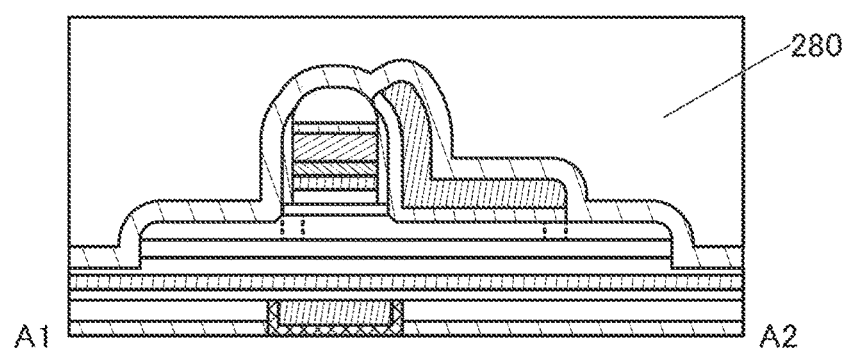
Figure 21A:
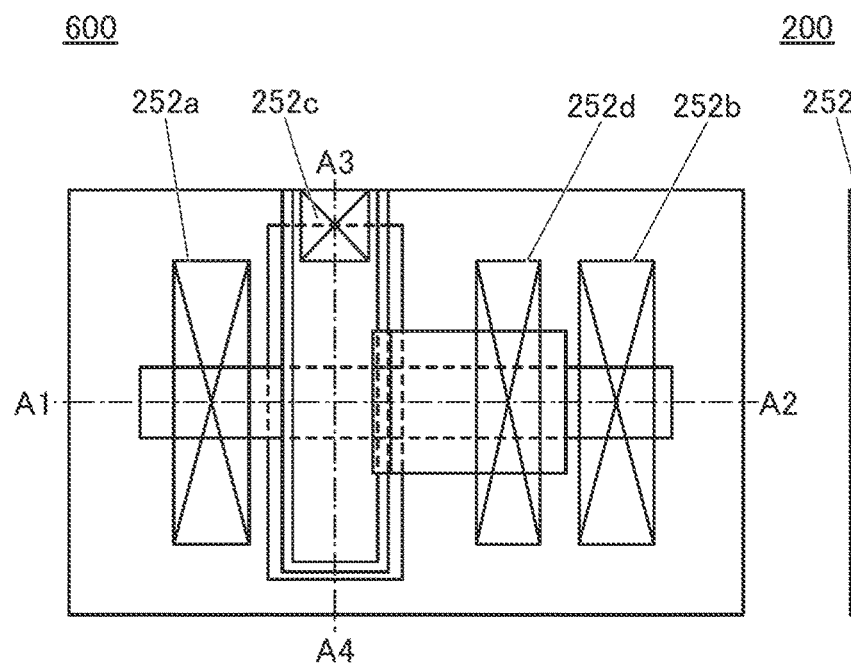
FIGS. 21A to 21C are a top view and cross-sectional views illustrating a method for manufacturing a semiconductor device of one embodiment of the present invention.
Figure 21C:
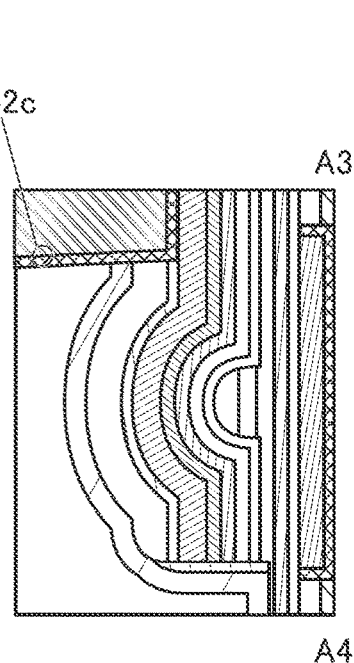
Figure 21B:
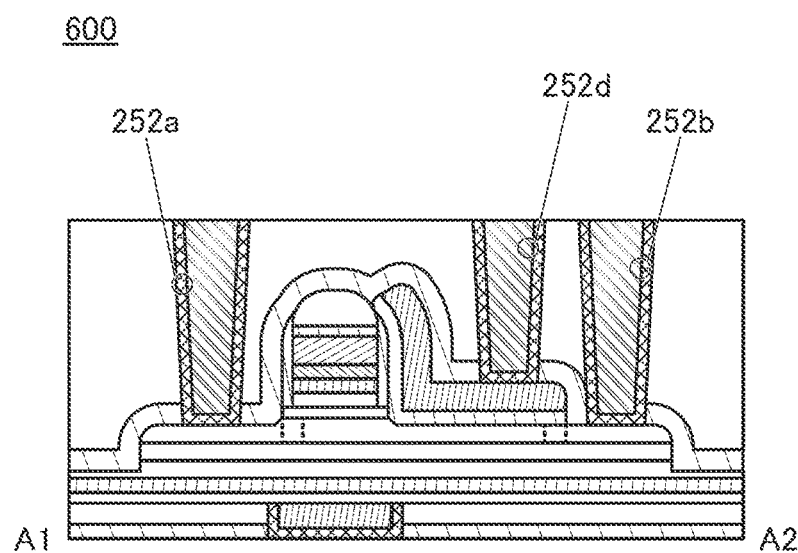

Then, the insulator 280 is formed over the insulator 274 (see FIGS. 20A to 20C). The insulator 280 can be formed by a sputtering method, a CVD method, an MBE method, a PLD method, an ALD method, or the like. Alternatively, the insulator 280 can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulating film.

Note that the insulator 280 is preferably formed to have a flat top surface. For example, the insulator 280 may have a flat top surface right after the formation of the insulating film to be the insulator 280. Alternatively, for example, the insulator 280 may have a flat top surface by removing the insulator or the like from the top surface after the formation so that the top surface becomes parallel to a reference surface such as a rear surface of the substrate. Such treatment is referred to as planarization treatment. As the planarization treatment, for example, CMP treatment, dry etching treatment, or the like can be performed. In this embodiment, CMP treatment is performed as the planarization treatment. Note that the top surface of the insulator 280 does not necessarily have planarity.

Then, openings reaching the region 231 of the oxide 230, the conductor 260, and the conductor 120 are formed in the insulator 280, the insulator 274, the insulator 271, and the insulator 270. The openings are formed by using a lithography method.

Note that in order that the conductors 252a and 252b are provided in contact with a side surface of the oxide 230, the openings are formed to reach the oxide 230 such that the side surface of the oxide 230 is exposed.

Next, a conductive film to be the conductor 252 is formed. The conductive film can be formed by a sputtering method, a CVD method, an MBE method, a PLD method, an ALD method, or the like.

Then, the conductive film to be the conductor 252 is partly removed by CMP treatment to expose the insulator 280. As a result, the conductive film remains only in the openings, so that the conductor 252 having a flat top surface can be formed (see FIGS. 21A to 21C).

Through the above process, the semiconductor device including the transistor 200 can be manufactured. As illustrated in FIGS. 9A to 9C to FIGS. 21A to 21D, the method for manufacturing a semiconductor device in this embodiment allows fabrication of the transistor 200.

According to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device with low off-state current can be provided. Alternatively, according to one embodiment of the present invention, a transistor with high on-state current can be provided. Alternatively, according to one embodiment of the present invention, a highly reliable semiconductor device can be provided. Alternatively, according to one embodiment of the present invention, a semiconductor device with low power consumption can be provided. Alternatively, according to one embodiment of the present invention, a semiconductor device that can be manufactured with high producibility can be provided.

As described above, the structures, methods, and the like described in this embodiment can be combined as appropriate with any of the structures, methods, and the like described in the other embodiments.

Embodiment 2

An example of a semiconductor device of one embodiment of the present invention including the transistor 200, which is different from the above embodiment, is described below. Note that in this embodiment, the same materials or components having the same functions as the above embodiment are denoted by the same reference numerals, and the description thereof is omitted in some cases.

<Structure Example 2 of Semiconductor Device>

Figure 22A:
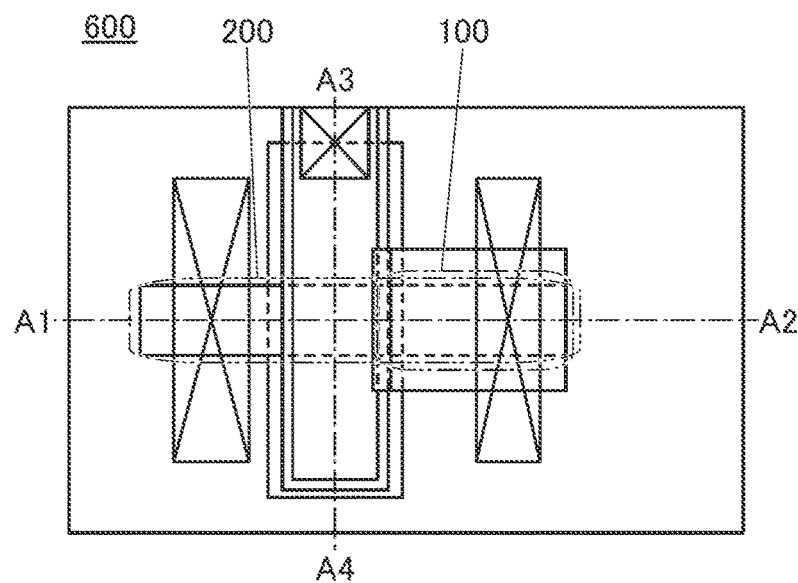
FIGS. 22A to 22C are a top view and cross-sectional views of a semiconductor device of one embodiment of the present invention.
Figure 22C:
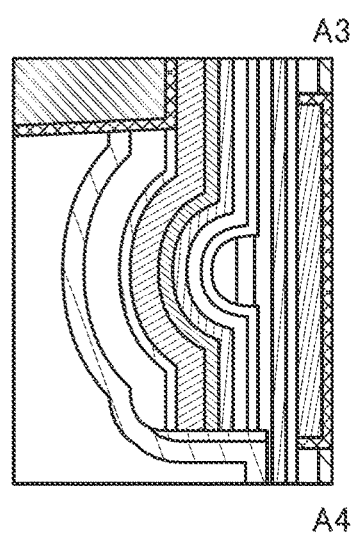
Figure 22B:
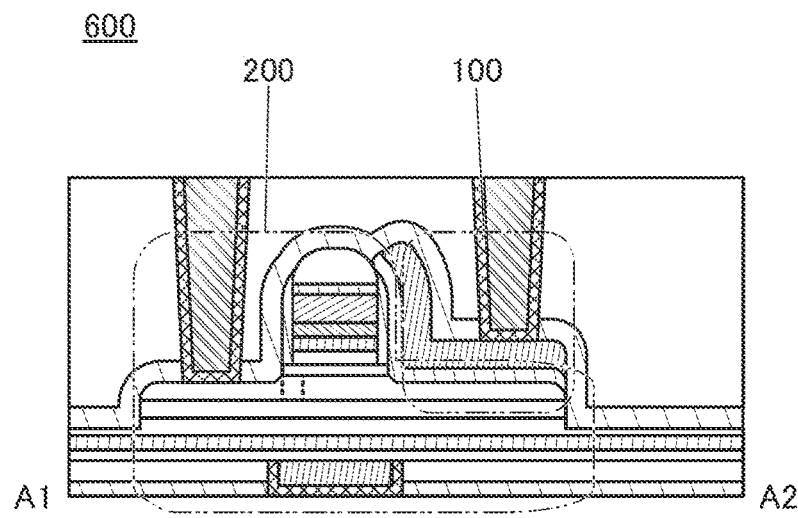

FIGS. 22A to 22C are a top view and cross-sectional views illustrating the transistor 200 and the capacitor 100 and the periphery of the transistor 200 of one embodiment of the present invention. Note that in this specification, a semiconductor device including one capacitor and at least one transistor is referred to as a cell.

FIG. 22A is a top view of a cell 600 including the transistor 200 and the capacitor 100. FIGS. 22B and 22C are cross-sectional views of the cell 600. FIG. 22B is a cross-sectional view taken along dashed-dotted line A1-A2 in FIG. 22A, which corresponds to a cross-sectional view in the channel length direction of the transistor 200. FIG. 22C is a cross-sectional view taken along dashed-dotted line A3-A4 in FIG. 22A, which corresponds to a cross-sectional view in the channel width direction of the transistor 200. For simplification of the drawing, some components are not illustrated in the top view in FIG. 22A. Note that for simplification of the drawing, only some components are denoted by reference numerals in FIGS. 22A to 22C. Furthermore, components of the cell 600 illustrated in FIGS. 22A to 22C are denoted by reference numerals in FIGS. 26A to 26C, and detailed description thereof is given below.

The transistor 200 and the capacitor 100 are provided on the same layer in the cell 600 of FIGS. 22A to 22C, whereby part of components in the transistor 200 can be used as part of components in the capacitor 100. That is, part of the components of the transistor 200 may function as part of the components of the capacitor 100.

Furthermore, part of the capacitor 100 or the entire capacitor 100 overlaps with the transistor 200, so that the total area of the projected area of the transistor 200 and the projected area of the capacitor 100 can be reduced.

Figure 23A:
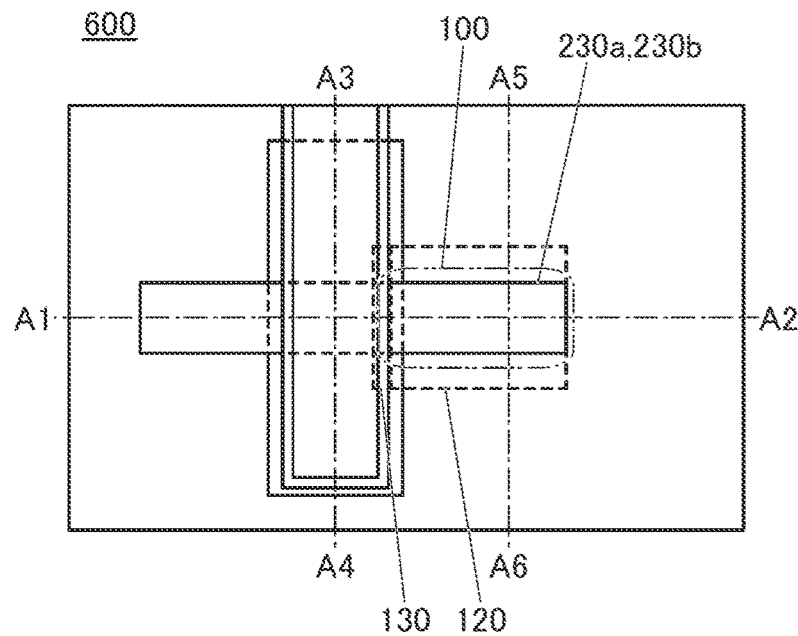
FIGS. 23A to 23D are top views and cross-sectional views of semiconductor devices of embodiments of the present invention.
Figure 23B:
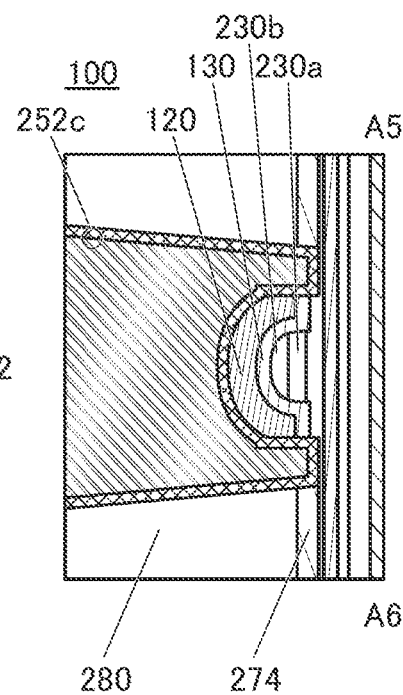
Figure 23C:
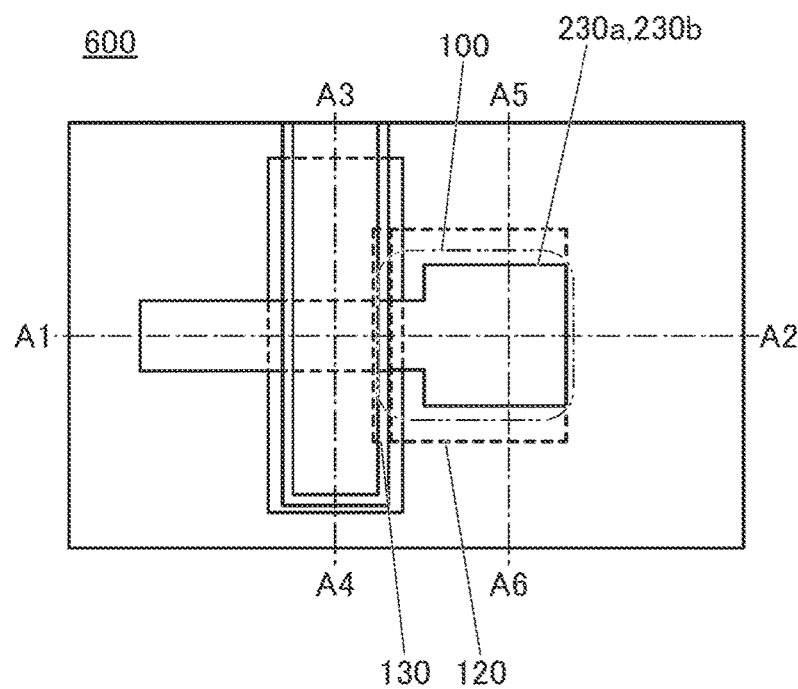
Figure 23D:
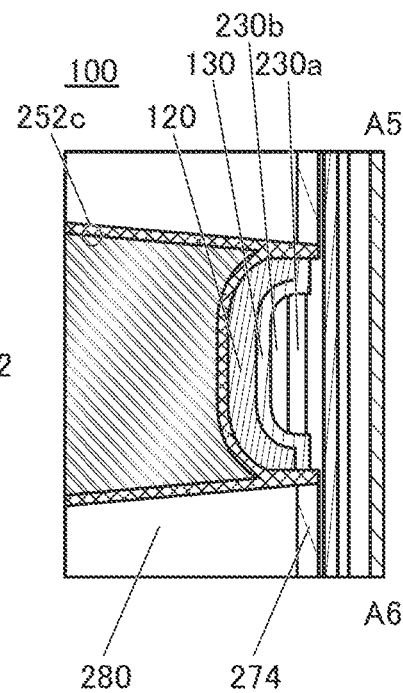

FIGS. 23A to 23D are top views and cross-sectional views illustrating the capacitor 100. FIG. 23B is a cross-sectional view taken along dashed-dotted line A5-A6 in the top view in FIG. 23A and FIG. 23D is a cross-sectional view taken along dashed-dotted line A5-A6 in the top view in FIG. 23C. Note that in FIGS. 23A and 23C, some components such as a conductor 252c in FIGS. 23B and 23D are not illustrated for description of the capacitor 100. A conductor 120 functioning as a second electrode of the capacitor 100 and an insulator 130 functioning as a dielectric are shown by dotted lines.

As illustrated in FIGS. 23A to 23D, the area of the capacitor 100 is determined by the widths of an oxide 230a and an oxide 230b in the A5-A6 direction and the width of the conductor 120 in the A1-A2 direction. That is, when the capacitance value needed for the cell 600 cannot be obtained by the capacitor 100 illustrated in FIGS. 23A and 23B, the widths of the oxide 230a and the oxide 230b in the A5-A6 direction can be increased to increase the capacitance value.

With this structure, miniaturization or high integration of the semiconductor device can be achieved. Moreover, the design flexibility of the semiconductor device can be increased. Furthermore, the transistor 200 and the capacitor 100 can be formed through the same process. Accordingly, the process can be shortened, leading to an improvement in productivity.

<Structure of Cell Array>

FIGS. 24A and 24B and FIGS. 25A and 25B illustrate examples of cell arrays of this embodiment. For example, the cells 600 each including the transistor 200 and the capacitor 100 illustrated in FIGS. 22A to 22C are arranged in a matrix, whereby a cell array can be formed.

FIG. 24A is a circuit diagram showing an embodiment in which the cells 600 in FIGS. 22A to 22C are arranged in a matrix. In FIG. 24A, first gates of transistors included in the cells 600 arranged in a row direction are electrically connected to common WLs (WL01, WL02, and WL03). Furthermore, one of a source and a drain of each of the transistors included in the cells 600 arranged in a column direction are electrically connected to common BLs (BL01 to BL06). In addition, the transistors included in the cells 600 may each be provided with a second gate BG. The threshold voltage of the transistor can be controlled by a potential applied to the BG. The first electrode of the capacitor included in the cell 600 is electrically connected to the other of the source and the drain of the transistor. At this time, the first electrode of the capacitor is formed using part of components of the transistor. In addition, the second electrode of the capacitor included in the cell 600 is electrically connected to a PL.

FIG. 24B is a cross-sectional view which illustrates part of a row including a circuit 610 including a cell 600a electrically connected to the WL02 and the BL03 and a cell 600b electrically connected to the WL02 and the BL04 in FIG. 24A. FIG. 24B illustrates a cross-sectional view of the cell 600a and the cell 600b.

The cell 600a includes a transistor 200a and a capacitor 100a. The cell 600b includes a transistor 200b and a capacitor 100b.

Figure 25A:
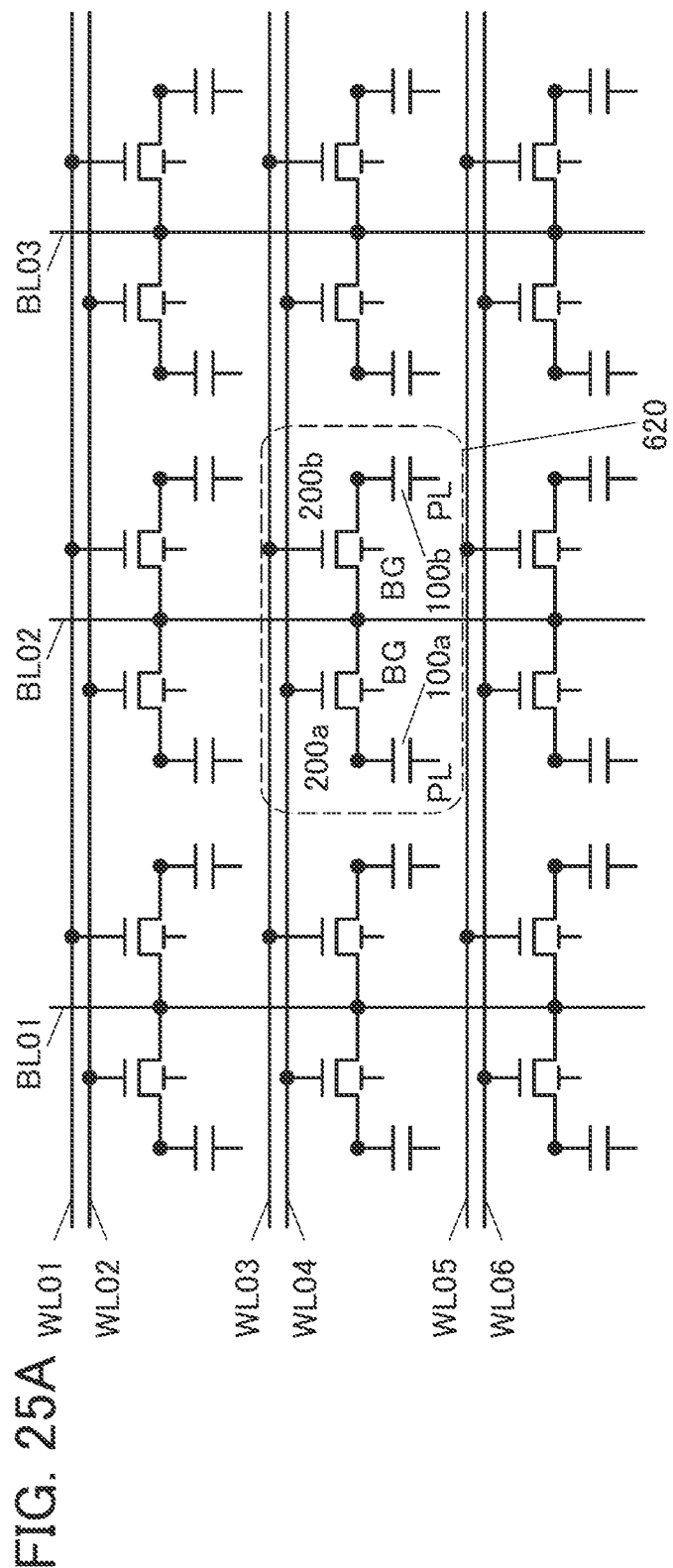
FIGS. 25A and 25B are a circuit diagram and a cross-sectional view of a semiconductor device of one embodiment of the present invention.

FIG. 25A is a circuit diagram showing an embodiment, which is different from that in FIG. 24A, in which the cells 600 in FIGS. 22A to 22C are arranged in a matrix. In FIG. 25A, one of the source and the drain of each of the transistors included in the cells 600 which are adjacent in the row direction are electrically connected to common BLs (BL01, BL02, and BL03). Furthermore, the BLs are also electrically connected to one of the source and the drain of each of the transistors included in the cells 600 arranged in the column direction. In contrast, the first gates of transistors included in the cells 600 which are adjacent in the row direction are electrically connected to different WLs (WL01 to WL06). In addition, the transistors included in the cells 600 may each be provided with a second gate BG. The threshold voltage of the transistor can be controlled by a potential applied to the BG. The first electrode of the capacitor included in the cell 600 is electrically connected to the other of the source and the drain of the transistor. At this time, the first electrode of the capacitor is formed using part of components of the transistor. In addition, the second electrode of the capacitor included in the cell 600 is electrically connected to a PL.

Figure 25B:
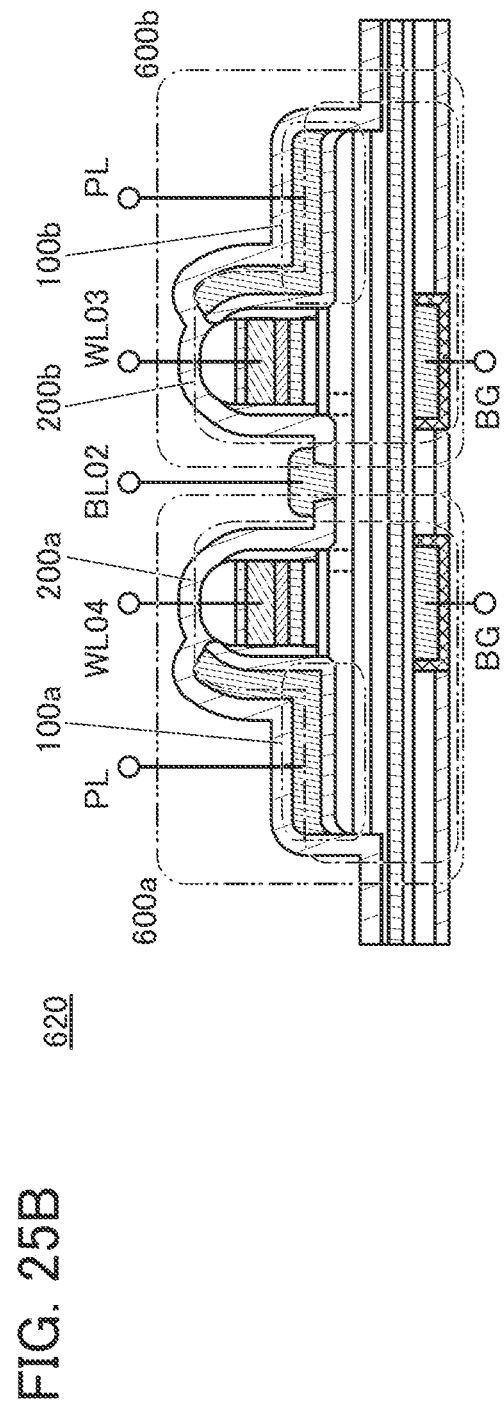

FIG. 25B is a cross-sectional view which illustrates part of a row including a circuit 620 including a cell 600*a* electrically connected to a WL04 and the BL02 and a cell 600*b* electrically connected to the WL03 and the BL02 in FIG. 25A. FIG. 25B illustrates a cross-sectional view of the cell 600*a* and the cell 600*b*.

The cell 600*a* includes a transistor 200*a* and a capacitor 100*a*. The cell 600*b* includes a transistor 200*b* and a capacitor 100*b*.

One of a source and a drain of the transistor 200*a* and one of a source and a drain of the transistor 200*b* are both electrically connected to the BL02.

[Cell 600]

The semiconductor device of one embodiment of the present invention includes the transistor 200, the capacitor 100, and the insulator 280 functioning as an interlayer film. Furthermore, a conductor 252 (a conductor 252*a*, a conductor 252*b*, and a conductor 252*c*) functioning as a plug that is electrically connected to the transistor 200 is included.

The conductors 252 are in contact with inner walls of an opening in the insulator 280. Here, the top surface of the conductor 252 can be substantially level with the top surface of the insulator 280. Note that although the conductors 252 in the transistor 200 each have a two-layer structure, one embodiment of the present invention is not limited thereto. For example, the conductors 252 may have a single-layer structure or a stacked-layer structure of three or more layers.

[Transistor 200]

As illustrated in FIGS. 22A to 22C and FIGS. 26A to 26C, the transistor 200 includes insulators 214 and 216 provided over a substrate (not illustrated); a conductor 205 provided to be embedded in the insulators 214 and 216; an insulator 220 provided over the insulator 216 and the conductor 205; an insulator 222 provided over the insulator 220; an insulator 224 provided over the insulator 222; an oxide 230 (an oxide 230*a*, an oxide 230*b*, and an oxide 230*c*) provided over the insulator 224; an insulator 250 provided over the oxide 230; a conductor 260 (a conductor 260*a*, a conductor 260*b*, and a conductor 260*c*) provided over the insulator 250; an insulator 270 and an insulator 271 provided over the conductor 260; an insulator 272 provided in contact with at least side surfaces of the insulator 250 and the conductor 260; and an insulator 274 provided in contact with the oxide 230 and the insulator 272.

Figure 26A:
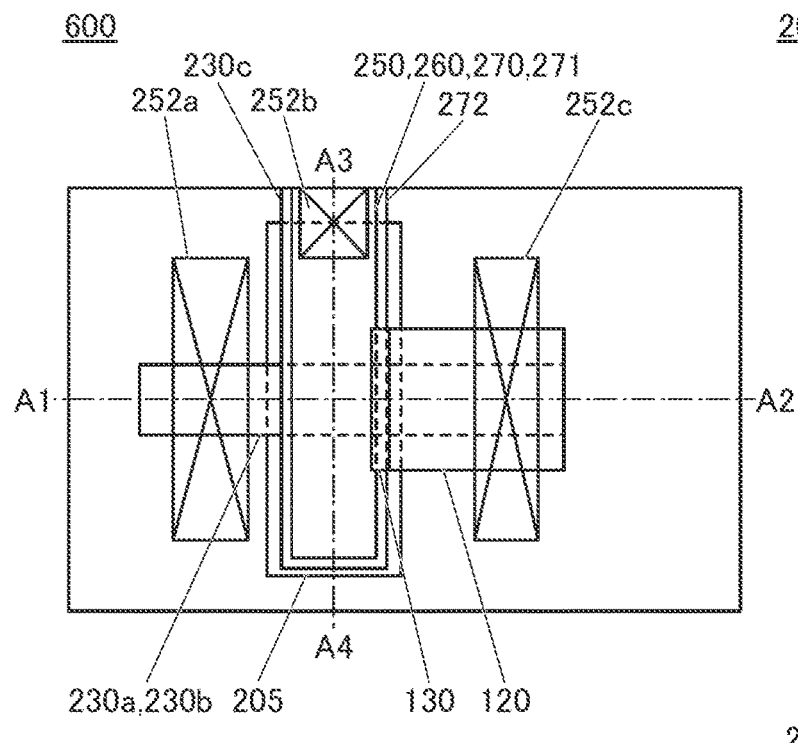
FIGS. 26A to 26C are a top view and cross-sectional views of a semiconductor device of one embodiment of the present invention.
Figure 26C:
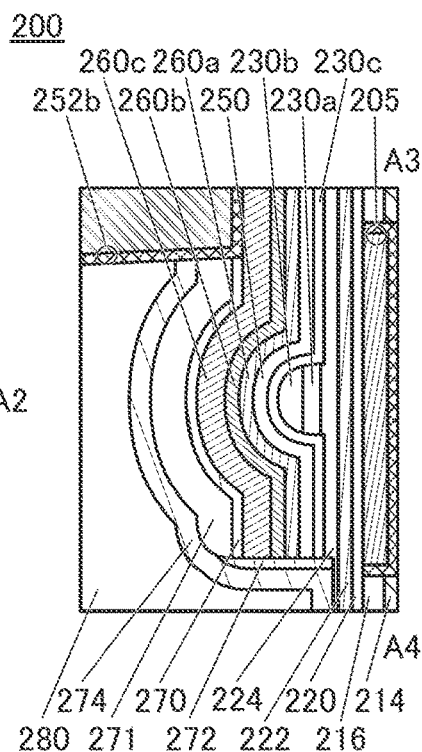
Figure 26B:
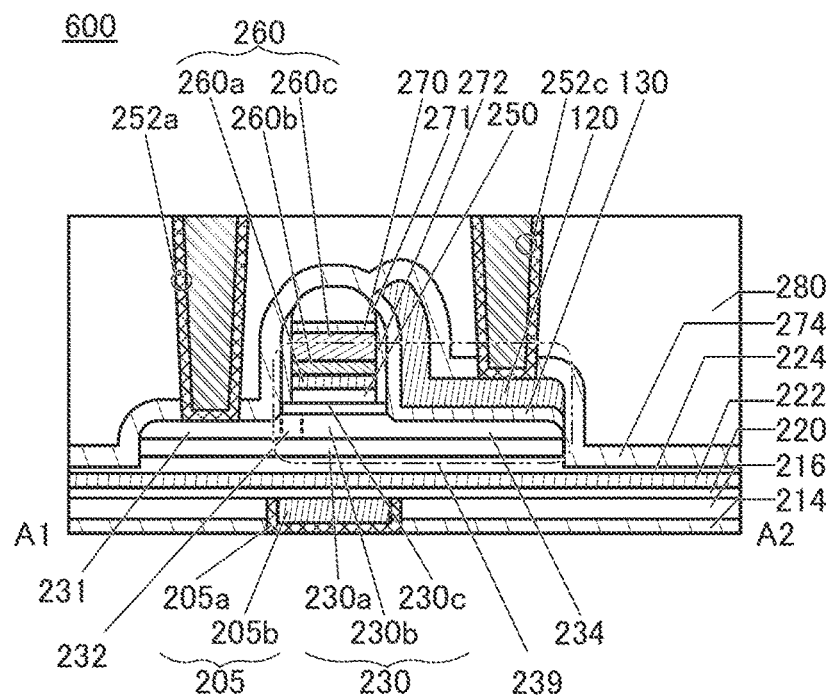

Although the transistor 200 has, as illustrated in FIGS. 26A to 26C, a structure in which the oxide 230*a*, the oxide 230*b*, and the oxide 230*c* are stacked, the present invention is not limited to this structure. For example, the transistor 200 may have a two-layer structure of the oxide 230*a* and the oxide 230*b* or may have a stacked-layer structure of four or more layers. Alternatively, the transistor 200 may have a structure in which only the oxide 230*b* is provided as an oxide or only the oxide 230*b* and the oxide 230*c* are provided as an oxide. Although the conductor 260*a*, the conductor 260*b*, and the conductor 260*c* are stacked in the transistor 200, the present invention is not limited to this structure. For example, the transistor 200 may have a single-layer structure, a two-layer structure, or a stacked-layer structure of four or more layers.

FIG. 27 is an enlarged view illustrating a region 239 including a channel and the vicinity thereof, which is surrounded by a dashed line in FIG. 26B.

As illustrated in FIG. 26B and FIG. 27, the oxide 230 includes a junction region 232 between a region 234 functioning as a channel formation region of the transistor 200 and the first electrode of the capacitor 100 described below and regions 231 functioning as a source region and a drain region. The region 231 functioning as the source region or the drain region has a high carrier density and reduced resistance. The region 234 functioning as the channel formation region has a lower carrier density than the region 231 functioning as the source region or the drain region. Furthermore, a region overlapping with the conductor 120 in the region 234 in which carriers are stored by applying voltage to the conductor 120 can function as the electrode of the capacitor 100.

The junction region 232 has a lower carrier density than the region 231 functioning as the source region or the drain region and has a higher carrier density than the region 234 functioning as the channel formation region. That is, the junction region 232 functions as a junction region between the channel formation region and the source region or the drain region.

The junction region prevents a high-resistance region from being formed between the region 231 functioning as the source region or the drain region and the region 234 functioning as the channel formation region, thereby increasing on-state current of the transistor.

The junction region 232 includes a region overlapping with the conductor 260 serving as a gate electrode and the conductor 120 serving as an electrode of the capacitor. In particular, the region overlapping with the conductor 260 serving as a gate electrode in the junction region 232 sometimes functions as a so-called overlap region (also referred to as an Lov region).

Note that the region 231 is preferably in contact with the insulator 274. The concentration of at least one of a metal element such as indium and impurity elements such as hydrogen and nitrogen in the region 231 is preferably higher than that in each of the junction region 232 and the region 234.

The junction region 232 includes a region overlapping with the insulator 272. The concentration of at least one of a metal element such as indium and impurity elements such as hydrogen and nitrogen in the junction region 232 is preferably higher than that in the region 234. On the other hand, the concentration of at least one of a metal element such as indium and impurity elements such as hydrogen and nitrogen in the junction region 232 is preferably lower than that in the region 231.

The region 234 overlaps with the conductor 260 and the conductor 120. The concentration of at least one of a metal element such as indium and impurity elements such as hydrogen and nitrogen in the region 234 is preferably lower than that in each of the regions 231 and 232.

As illustrated in FIG. 27, it is preferable that the side surfaces of the oxide 230*a* and the oxide 230*b* on the A2 side in the channel length direction be substantially aligned with the side surfaces of the conductor 120 and the insulator 130 on the A2 side in the channel length direction in the top view. However, this embodiment is not limited thereto, and it is possible that the side surfaces of the oxide 230*a* and the oxide 230*b* on the A2 side in the channel length direction extend beyond the side surfaces of the conductor 120 and the insulator 130 on the A2 side in the channel length direction, and the top surfaces of the oxide 230*a* and the oxide 230*b* are partly in contact with the insulator 274. Alternatively, it is possible that the side surfaces of the conductor 120 and the insulator 130 on the A2 side in the channel length direction extend beyond the side surfaces of the oxide 230a and the oxide 230b on the A2 side in the channel length direction, and the conductor 120 and the insulator 130 cover the side surfaces of the oxide 230a and the oxide 230b on the A2 side in the channel length direction.

In the oxide 230, a boundary between the region 231, the junction region 232, and the region 234 cannot be observed clearly in some cases. The concentration of a metal element such as indium and impurity elements such as hydrogen and nitrogen, which is detected in each region, may be gradually changed (such a change is also referred to as gradation) not only between the regions but also in each region. That is, the region closer to the region 234 preferably has a lower concentration of a metal element such as indium and impurity elements such as hydrogen and nitrogen. The concentration of impurity elements in the region 232 is lower than that in the region 231.

Furthermore, in FIG. 26B and FIG. 27, the region 234, the region 231, and the junction region 232 are formed in the oxide 230b; however, the present invention is not limited thereto. For example, these regions may be formed in the oxide 230a or the oxide 230c. Although the boundaries between the regions are indicated substantially perpendicularly to the top surface of the oxide 230 in FIG. 26B and FIG. 27, this embodiment is not limited thereto. For example, the junction region 232 may project to the conductor 260 side in the vicinity of the surface of the oxide 230b, and the junction region 232 may recede to the conductor 252a side in the vicinity of the bottom surface of the oxide 230b.

The oxide 230 includes the oxide 230a, the oxide 230b over the oxide 230a, and the oxide 230c over the oxide 230b. The oxide 230 includes the region 231, the junction region 232, and the region 234. Note that at least part of the region 231 is preferably in contact with the insulator 274. Note that it is preferable that the concentration of at least one of a metal element such as indium, hydrogen, and nitrogen in at least part of the region 231 be higher than that of the region 234.

When the transistor 200 is turned on, the region 231 functions as the source region or the drain region. Furthermore, at least one portion of the region 234, e.g., a region overlapping with the conductor 260 in the region 234, functions as a channel formation region. In addition, at least one portion of the region 234, e.g., a region overlapping with the conductor 120 in the region 234 can function as the electrode of the capacitor 100 by applying voltage to the conductor 120. Here, a region overlapping with the conductor 260 in the region 234 is provided to be sandwiched between the region 231 and the region overlapping with the conductor 120 in the region 234.

As illustrated in FIGS. 26A to 26C, the oxide 230 preferably includes the junction region 232. With this structure, the transistor 200 can have a high on-state current and a low leakage current (off-state current) in an off state.

When the oxide 230b is provided over the oxide 230a, impurities can be prevented from being diffused into the oxide 230b from the components formed below the oxide 230a. Moreover, when the oxide 230b is provided under the oxide 230c, impurities can be prevented from being diffused into the oxide 230b from the components formed above the oxide 230c.

The oxide 230 has a curved surface between the side surface and the top surface. That is, an end portion of the side surface and an end portion of the top surface are preferably curved (hereinafter such a curved shape is also referred to as a rounded shape). The radius of curvature of the curved surface at an end portion of the oxide 230b is greater than or equal to 3 nm and less than or equal to 10 nm, preferably greater than or equal to 5 nm and less than or equal to 6 nm.

The oxide 230 is preferably formed using a metal oxide functioning as an oxide semiconductor (hereinafter, the metal oxide is also referred to as an oxide semiconductor). For example, the metal oxide to be the region 234 preferably has an energy gap of 2 eV or more, preferably 2.5 eV or more. With the use of a metal oxide having such a wide energy gap, the off-state current of the transistor can be reduced.

Here, the region 234 in the oxide 230 is described.

The region 234 preferably has a stacked-layer structure of metal oxides which differ in the atomic ratio of metal elements. Specifically, in the case where the region 234 has the stacked-layer structure of the oxide 230a and 230b, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of the element In to M in the metal oxide used as the oxide 230b is preferably greater than that in the metal oxide used as the oxide 230a. The oxide 230c can be formed using a metal oxide which can be used for the oxide 230a or 230b.

Next, the region 231 and the junction region 232 which are included in the oxide 230 are described.

The region 231 and the junction region 232 are low-resistance regions which are obtained by adding a metal atom such as indium or impurities to a metal oxide formed as the oxide 230. Note that each of the regions has higher conductivity than at least the oxide 230b in the region 234. For addition of impurities to the region 231 and junction region 232, for example, a dopant which is at least one of a metal element such as indium and impurities can be added by plasma treatment, an ion implantation method by which an ionized source gas is subjected to mass separation and then added, an ion doping method by which an ionized source gas is added without mass separation, a plasma immersion ion implantation method, or the like.

That is, when the content of a metal atom such as indium in the region 231 and the junction region 232 in the oxide 230 is increased, the electron mobility can be increased and the resistance can be decreased.

When the insulator 274 containing impurity elements is formed in contact with the oxide 230, impurities can be added to the region 231 and the junction region 232.

That is, when an element that forms an oxygen vacancy or an element trapped by an oxygen vacancy is added to the region 231 and the junction region 232, the resistances of the region 231 and the junction region 232 are reduced. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. Accordingly, the region 231 and the junction region 232 are made to include one or more of the above elements.

For example, as the insulator 274, a film which extracts and absorbs oxygen contained in the region 231 and the junction region 232 may be used. When oxygen is extracted, oxygen vacancies are generated in the region 231 and the junction region 232. Hydrogen, boron, carbon, nitrogen, fluorine, phosphorus, sulfur, chlorine, titanium, a rare gas, or the like is trapped by oxygen vacancies, whereby the resistance of the region 231 and the junction region 232 is reduced.

When the junction region 232 is provided in the transistor 200, high-resistance regions are not formed between the region 231 functioning as the source region and the drain region and the region 234 where a channel is formed, so that the on-state current and the carrier mobility of the transistor can be increased. Since the gate does not overlap with the source and drain regions in the channel length direction by including the junction region 232, formation of unnecessary capacitance can be suppressed. Furthermore, leakage current in an off state can be reduced owing to the junction region 232.

Thus, by appropriately selecting the areas of the junction region 232, a transistor having electrical characteristics necessary for the circuit design can be easily provided.

Note that the side surface of the region 234 on the A2 side in the channel length direction is also in contact with the insulator 274 like the region 231 in some cases. Thus, impurities are added to the vicinity of a region where the region 234 is in contact with the insulator 274 like the region 231 in some cases.

The insulator 274 is provided to cover the insulator 270, the insulator 272, the oxide 230, and the insulator 224.

Moreover, the insulator 274 is preferably formed using an insulating material having a function of inhibiting the penetration of impurities such as water and hydrogen and oxygen. For example, as the insulator 274, silicon nitride, silicon nitride oxide, silicon oxynitride, aluminum nitride, aluminum nitride oxide, or the like is preferably used. When the insulator 274 is formed using any of the above materials, entry of oxygen through the insulator 274 to be supplied to oxygen vacancies in the region 231, which decreases the carrier density, can be prevented. Furthermore, impurities such as water and hydrogen can be prevented from passing through the insulator 274 and excessively enlarging the region 231 to the region 234 side.

Note that in the case where the region 231 and the junction region 232 are provided with formation of the insulator 274, the insulator 274 preferably includes at least one of hydrogen and nitrogen. When an insulator including impurities such as hydrogen and nitrogen is used as the insulator 274, impurities such as hydrogen and nitrogen are added to the oxide 230, so that the region 231, the junction region 232 can be formed in the oxide 230.

The insulator 280 functioning as the interlayer film is preferably provided over the insulator 274. Like the insulator 224 or the like, the concentration of impurities such as water or hydrogen in the insulator 280 is preferably lowered. Note that the insulator 280 may have a stacked-layer structure of such insulators.

Furthermore, the conductors 252a, 252b, and 252c are provided in the opening formed in the insulators 280 and 274. Note that top surfaces of the conductors 252a, 252b, and 252c may be at the same level as the top surface of the insulator 280.

The conductor 252b is in contact with the conductor 260 functioning as the first gate electrode of the transistor 200 through the opening formed in the insulators 270 and 271. The conductor 252c is in contact with a conductor 120 serving as one of electrodes of the capacitor 100 described later.

Furthermore, the conductor 252a is in contact with the region 231 functioning as the source region or the drain region of the transistor 200. Because the region 231 is reduced in resistance, the contact resistance between the conductor 252a and the region 231 is reduced, leading to a large on-state current of the transistor 200.

The conductor 252a is in contact with at least the top surface of the oxide 230. It is preferable that the conductor 252a be in contact with the top surface and the side surface of the oxide 230. It is particularly preferable that the conductor 252a be in contact with one of or both the side surface of the oxide 230 on the A3 side and the side surface of the oxide 230 on the A4 side. The conductor 252a may be in contact with the side surface of the oxide 230 on the A1 side (the A2 side). When the conductor 252a is in contact with not only the top surface of the oxide 230 but also the side surface of the oxide 230, the area where the conductor 252a and the oxide 230 are in contact with each other can be increased without an increase in the area of the top surface of the contact portion, so that the contact resistance between the conductor 252a and the oxide 230 can be reduced. Accordingly, miniaturization of the source electrode and the drain electrode of the transistor can be achieved and, in addition, the on-state current can be increased.

[Capacitor 100]

As illustrated in FIGS. 22A to 22C and FIGS. 26A to 26C, the capacitor 100 and the transistor 200 have the same components. In this embodiment, an example of the capacitor 100 in which part of the region 234 provided in the oxide 230 of the transistor 200 serves as one electrode of the capacitor 100 is shown.

The capacitor 100 includes part of the region 234 of the oxide 230, the insulator 130 over the part of the region 234, and the conductor 120 over the insulator 130. Furthermore, the conductor 120 is preferably provided over the insulator 130 to at least partly overlap with the part of the region 234.

The part of the region 234 of the oxide 230 serve as one electrode of the capacitor 100 and the conductor 120 serves as the other electrode of the capacitor 100. That is, in the region 234, a first region serving as a channel of the transistor 200 and a second region serving as one electrode of the capacitor 100 are provided to be adjacent to each other. The insulator 130 functions as a dielectric of the capacitor 100.

The insulator 280 and the insulator 274 are preferably provided to cover the insulator 130 and the conductor 120.

The insulator 130 may be, for example, a single layer or a stacked layer using aluminum oxide or silicon oxynitride.

Like the conductor 120, the conductor 120 is preferably formed with a conductive material containing tungsten, copper, or aluminum as its main component. Although not illustrated, the conductor 120 may have a stacked-layer structure, and for example, may be a stacked layer of titanium, titanium nitride, and the above-described conductive material.

Here, it is preferable that the side surfaces of the oxide 230a and the oxide 230b on the A2 side in the channel length direction be substantially aligned with the side surfaces of the conductor 120 and the insulator 130 on the A2 side in the channel length direction in the top view. As described above, when the end portion of the transistor 200 and the end portion of the capacitor 100 overlap with each other, the total area of the projected area of the transistor 200 and the projected area of the capacitor 100 can be further reduced.

Furthermore, the conductor 252c is in contact with the conductor 120 functioning as one electrode of the capacitor 100. The conductor 252c can be formed at the same time as the conductors 252a and 252b; thus, the manufacturing process can be shortened.

Embodiment 3

In this embodiment, one embodiment of a semiconductor device will be described with reference to FIG. 28.

[Memory Device 1]

Figure 28:
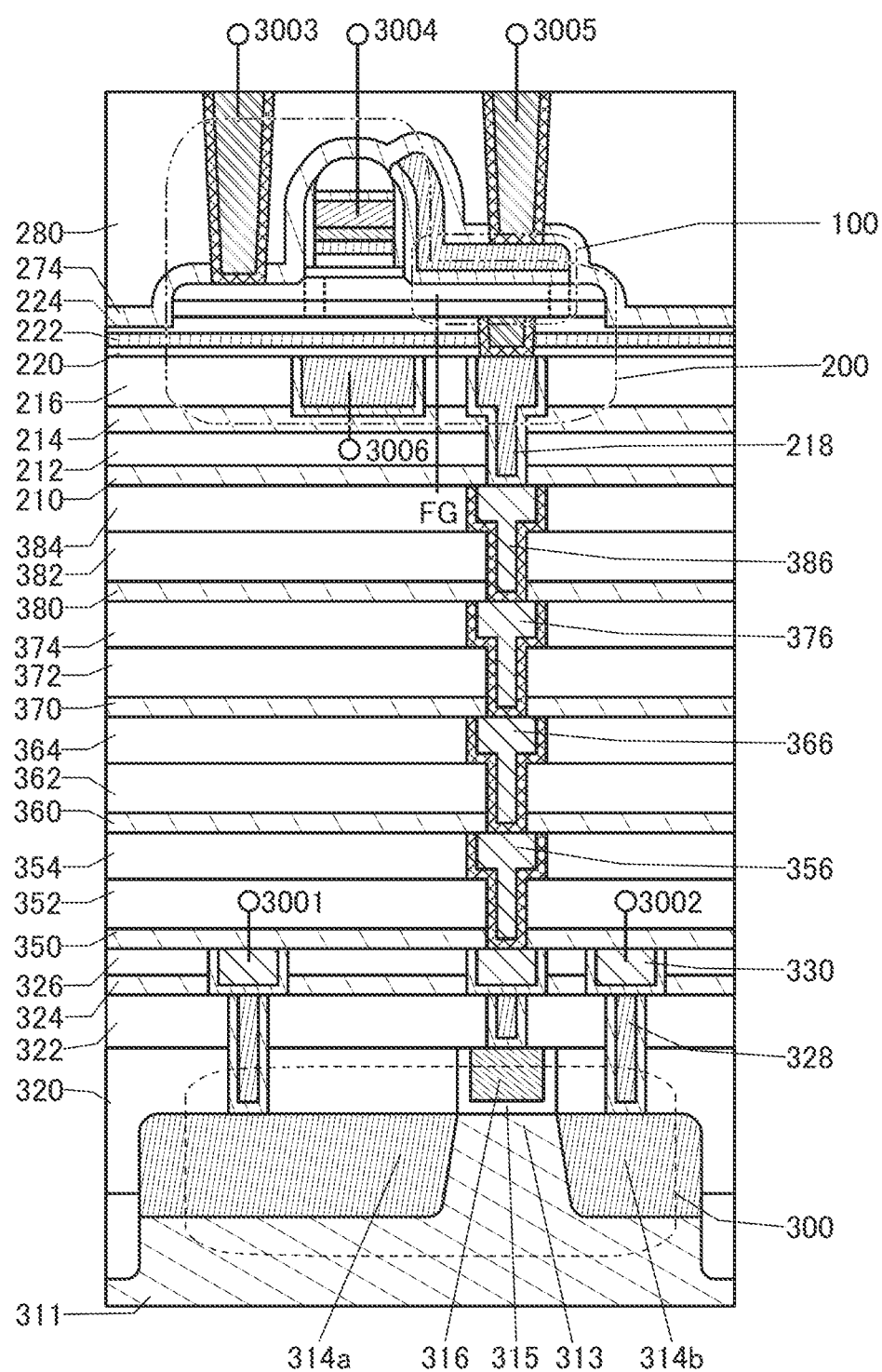
FIG. 28 is a cross-sectional view illustrating a structure of a memory device of one embodiment of the present invention.

A memory device illustrated in FIG. 28 includes a transistor 300 and the cell 600 including the transistor 200 and the capacitor 100.

The transistor 200 is a transistor whose channel is formed in a semiconductor layer containing an oxide semiconductor. Since the off-state current of the transistor 200 is low, a memory device including the transistor 200 can retain stored data for a long time. In other words, such a memory device does not require refresh operation or has an extremely low frequency of the refresh operation, which leads to a sufficient reduction in power consumption of the memory device.

The transistor 200 and the capacitor 100 in the cell 600 have some components in common and thus have a small projected area, which enables miniaturization and high integration.

In FIG. 28, a wiring 3001 is electrically connected to a source of the transistor 300. A wiring 3002 is electrically connected to a drain of the transistor 300. A wiring 3003 is electrically connected to one of the source and the drain of the transistor 200. A wiring 3004 is electrically connected to the first gate of the transistor 200. A wiring 3006 is electrically connected to the second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor device illustrated in FIG. 28 has a feature that the potential of the gate of the transistor 300 can be retained and thus enables writing, retaining, and reading of data as follows.

Writing and retaining of data are described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained in the node FG (retaining).

In the case where the off-state current of the transistor 200 is low, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when a high-level charge is given to the gate of the transistor 300 is lower than an apparent threshold voltage $V_{th\_L}$ at the time when a low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between $V_{th\_H}$ and $V_{th\_L}$, whereby the charge supplied to the node FG can be determined. For example, in the case where a high-level charge is supplied to the node FG in writing and the potential of the wiring 3005 is $V_0$ ($>V_{th\_H}$), the transistor 300 is turned on. Meanwhile, in the case where a low-level charge is supplied to the node FG in writing, the transistor 300 remains off even when the potential of the wiring 3005 is $V_0$ ($<V_{th\_L}$). Thus, the data retained in the node FG can be read by determining the potential of the wiring 3002.

<Structure of Memory Device 1>

The semiconductor device of one embodiment of the present invention includes the transistor 300, the transistor 200, and the capacitor 100 as illustrated in FIG. 28. The transistor 200 is provided above the transistor 300, and the capacitor 100 is provided above the transistor 300 and the transistor 200.

The transistor 300 is provided in and on a substrate 311 and includes a conductor 316, an insulator 315, a semiconductor region 313 that is a part of the substrate 311, and a low-resistance region 314a and a low-resistance region 314b functioning as a source region and a drain region.

The transistor 300 is either a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to the semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like for the conductor. Furthermore, in order to ensure the conductivity and embeddability, it is preferable to use a stacked layer of metal materials such as tungsten and aluminum for the conductor. It is particularly preferable to use tungsten in terms of heat resistance.

Note that the transistor 300 illustrated in FIG. 28 is only an example and the structure of the transistor 300 is not limited to that illustrated in FIG. 28; a transistor appropriate for a circuit configuration or a driving method can be used.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from the substrate 311, the transistor 300, or the like from diffusing to a region where the transistor 200 is provided.

For the film having a barrier property against hydrogen, silicon nitride formed by a CVD method can be used, for example. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. The film that prevents hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$, in the TDS analysis in the range from 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 or less times that of the insulator 324, further preferably 0.6 or less times that of the insulator 324. In the case where a material with a low permittivity is used for an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor serves as a wiring and another part of the conductor serves as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 28, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those for the conductor 328 and the conductor 330.

Note that the insulator 350 is preferably formed using an insulator having a barrier property against hydrogen, as with the insulator 324, for example. Furthermore, the conductor 356 preferably contains a conductor having a barrier property against hydrogen. In particular, the conductor having a barrier property against hydrogen is formed in an opening of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 28, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to those for the conductor 328 and the conductor 330.

Note that the insulator 360 is preferably formed using an insulator having a barrier property against hydrogen, as with the insulator 324, for example. Furthermore, the conductor 366 preferably contains a conductor having a barrier property against hydrogen. In particular, the conductor having a barrier property against hydrogen is formed in an opening of the insulator 360 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 364 and the conductor 366. For example, in FIG. 28, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

Note that the insulator 370 is preferably formed using an insulator having a barrier property against hydrogen, as with the insulator 324, for example. Furthermore, the conductor 376 preferably contains a conductor having a barrier property against hydrogen. In particular, the conductor having a barrier property against hydrogen is formed in an opening of the insulator 370 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 374 and the conductor 376. For example, in FIG. 28, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be formed using a material similar to those for the conductor 328 and the conductor 330.

Note that the insulator 380 is preferably formed using an insulator having a barrier property against hydrogen, as with the insulator 324, for example. Furthermore, the conductor 386 preferably contains a conductor having a barrier property against hydrogen. In particular, the conductor having a barrier property against hydrogen is formed in an opening of the insulator 380 having a barrier property against hydrogen. In such a structure, the transistor 300 and the transistor 200 can be separated by a barrier layer, so that the diffusion of hydrogen from the transistor 300 to the transistor 200 can be prevented.

An insulator 210 and an insulator 212 are stacked sequentially over the insulator 384. A material having a barrier property against oxygen or hydrogen is preferably used for either of the insulators 210 and 212.

The insulator 210 is preferably formed using, for example, a film having a barrier property that prevents hydrogen or impurities from the substrate 311, a region where the transistor 300 is provided, or the like from diffusing to a region where the cell 600 is provided. Therefore, the insulator 210 can be formed using a material similar to that for the insulator 324.

For the film having a barrier property against hydrogen, silicon nitride formed by a CVD method can be used, for example. The diffusion of hydrogen to a semiconductor element including an oxide semiconductor, such as the cell 600, degrades the characteristics of the semiconductor element in some cases. Therefore, a film that prevents hydrogen diffusion is preferably provided between the cell 600 and the transistor 300. The film that prevents hydrogen diffusion is specifically a film from which a small amount of hydrogen is released.

For the film having a barrier property against hydrogen used for the insulator 210, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the cell 600 during and after a manufacturing process of the transistor. In addition, release of oxygen from the oxide contained in the cell 600 can be prevented. Therefore, aluminum oxide is suitably used for a protective film of the cell 600.

The insulator 212 can be formed using a material similar to that for the insulator 320, for example. In the case where a material with a relatively low permittivity is used for an interlayer film, the parasitic capacitance between wirings can be reduced. A silicon oxide film or a silicon oxynitride film can be used for the insulator 212, for example.

A conductor 218, a conductor (the conductor 205) included in the transistor 200, and the like are provided in the insulators 210, 212, 214, and 216. Note that the conductor 218 functions as a plug or a wiring that is electrically connected to the cell 600 or the transistor 300. The conductor 218 can be formed using a material similar to those for the conductors 328 and 330.

In particular, part of the conductor 218 that is in contact with the insulators 210 and 214 is preferably a conductor having a barrier property against oxygen, hydrogen, and water. In such a structure, the transistors 300 and 200 can be separated by a layer having a barrier property against oxygen, hydrogen, and water. As a result, the diffusion of hydrogen from the transistor 300 to the cell 600 can be prevented.

The cell 600 is provided over the insulator 212. Note that the structure of the cell 600 described in the above embodiment can be used as the structure of the cell 600 described here. Note that the cell 600 in FIG. 28 is only an example and the structure of the cell 600 is not limited to that illustrated in FIG. 28; a transistor appropriate for a circuit configuration or a driving method can be used.

The above is the description of the structure example. With the use of the structure, a change in electrical characteristics of a semiconductor device including a transistor containing an oxide semiconductor can be prevented and reliability can be improved. A transistor containing an oxide semiconductor with a high on-state current can be provided. A transistor containing an oxide semiconductor with a low off-state current can be provided. A semiconductor device with low power consumption can be provided.

The structures, the methods, and the like described in this embodiment can be combined as appropriate with any of the structures, the methods, and the like described in the other embodiments.

Embodiment 4

In this embodiment, one embodiment of a semiconductor device that is different from that described in the above embodiment will be described with reference to FIG. 29. Note that in this embodiment, the same materials or components having the same functions as the above embodiment are denoted by the same reference numerals, and the description thereof is omitted in some cases.

[Memory Device 2]

Figure 29:
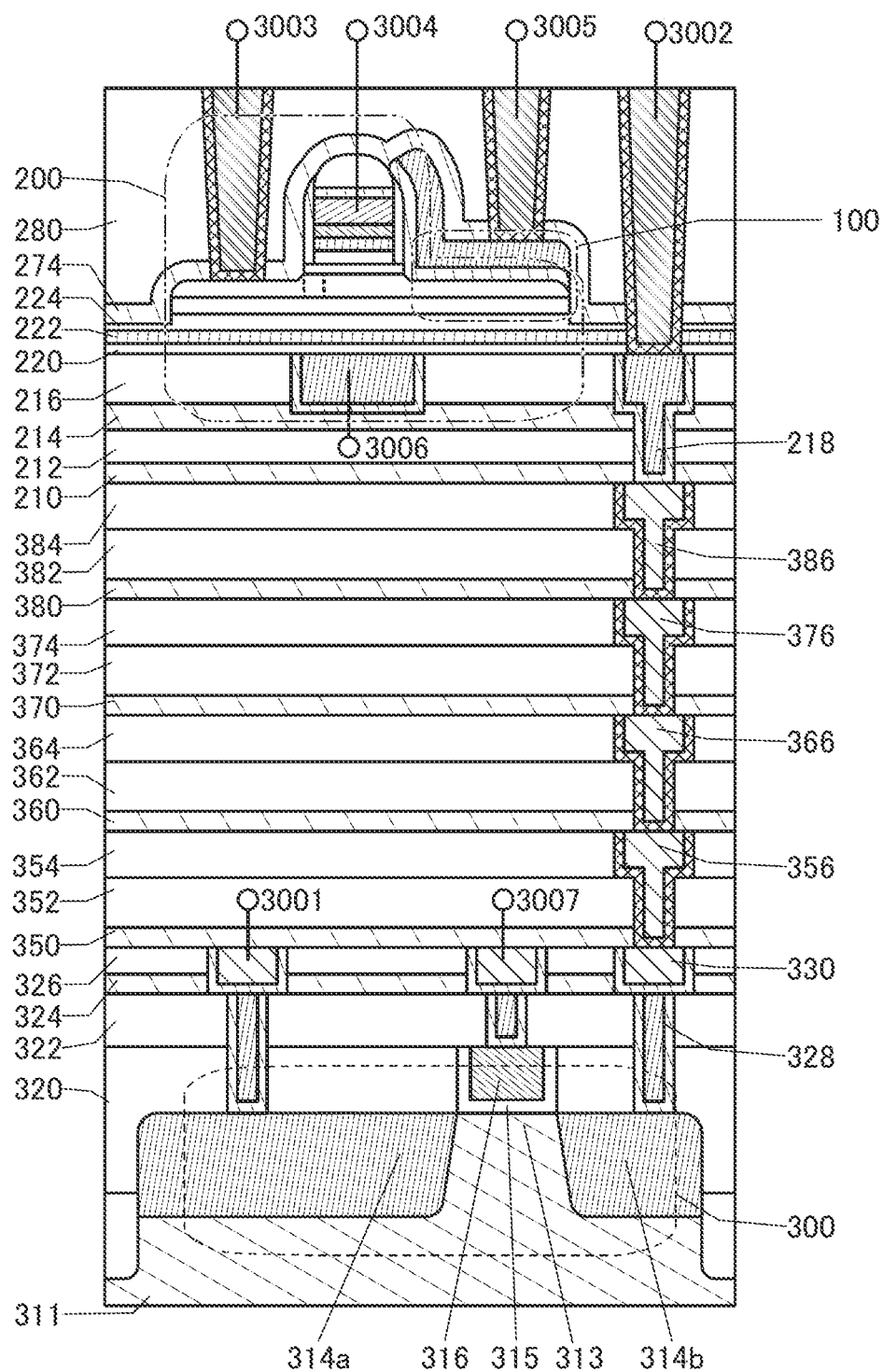
FIG. 29 is a cross-sectional view illustrating a structure of a memory device of one embodiment of the present invention.

A memory device illustrated in FIG. 29 includes the transistor 300 and the cell 600 including the transistor 200 and the capacitor 100.

The transistor 200 is a transistor whose channel is formed in a semiconductor layer containing an oxide semiconductor. Since the off-state current of the transistor 200 is low, a memory device including the transistor 200 can retain stored data for a long time. In other words, such a memory device does not require refresh operation or has an extremely low frequency of the refresh operation, which leads to a sufficient reduction in power consumption of the memory device.

The transistor 200 and the capacitor 100 in the cell 600 have some components in common and thus have a small projected area, which enables miniaturization and high integration.

In FIG. 29, the wiring 3001 is electrically connected to one of the source and the drain of the transistor 300. The wiring 3002 is electrically connected to the other of the source and the drain of the transistor 300. A wiring 3007 is electrically connected to the gate of the transistor 300. The wiring 3003 is electrically connected to one of the source and the drain of the transistor 200. The wiring 3004 is electrically connected to the first gate of the transistor 200. The wiring 3006 is electrically connected to the second gate of the transistor 200. The wiring 3005 is electrically connected to one electrode of the capacitor 100.

The semiconductor device illustrated in FIG. 29 can be used for a memory device including an oxide transistor, such as a DOSRAM described later. Since the potential of the other of the source and the drain (also referred to the other electrode of the capacitor 100) can be retained owing to the low off-state current of the transistor 200, data can be written, retained, and read.

<Structure of Memory Device 2>

The semiconductor device of one embodiment of the present invention includes the transistor 300, the transistor 200, and the capacitor 100 as illustrated in FIG. 29. The transistor 200 is provided above the transistor 300, and the capacitor 100 is provided above the transistor 300 and the transistor 200.

The insulator 320, the insulator 322, the insulator 324, and the insulator 326 are stacked sequentially to cover the transistor 300.

The conductor 328, the conductor 330, and the like that are electrically connected to the transistor 300 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor serves as a wiring and another part of the conductor serves as a plug.

The cell 600 is provided over the insulator 212. Note that the structure of the cell 600 described in the above embodiment can be used as the structure of the cell 600 described here. Note that the cell 600 in FIG. 29 is only an example and the structure of the cell 600 is not limited to that illustrated in FIG. 29; a transistor appropriate for a circuit configuration or a driving method can be used.

Because the conductor 252 is provided in contact with the conductor 218, a wiring connected to the transistor 300 can be extracted above the cell 600. Although the wiring 3002 is extracted above the cell 600 in FIG. 29, the structure is not limited thereto and the wiring 3001, the wiring 3007, or the like can be extracted above the cell 600.

The above is the description of the structure example. With the use of the structure, a change in electrical characteristics of a semiconductor device including a transistor containing an oxide semiconductor can be prevented and reliability can be improved. A transistor containing an oxide semiconductor with a high on-state current can be provided. A transistor containing an oxide semiconductor with a low off-state current can be provided. A semiconductor device with low power consumption can be provided.

The structures, the methods, and the like described in this embodiment can be combined as appropriate with any of the structures, the methods, and the like described in the other embodiments.

Embodiment 5

In this embodiment, NOSRAM is described as an example of a memory device including a transistor in which oxide is used for a semiconductor (hereinafter referred to as an OS transistor) and a capacitor, which is one embodiment of the present invention, with reference to FIG. 30 and FIGS. 31A to 31E. NOSRAM (registered trademark) is an abbreviation of "nonvolatile oxide semiconductor RAM", which indicates RAM including a gain cell (2T or 3T) memory cell. Hereinafter, a memory device including an OS transistor, such as NOSRAM, is referred to as an OS memory in some cases.

A memory device in which OS transistors are used in memory cells (hereinafter referred to as an OS memory) is used in NOSRAM. The OS memory is a memory including at least a capacitor and an OS transistor that controls charge and discharge of the capacitor. The OS memory has excellent retention characteristics because the OS transistor has an extremely low off-state current and thus can function as a nonvolatile memory.

<<NOSRAM>>

Figure 30:
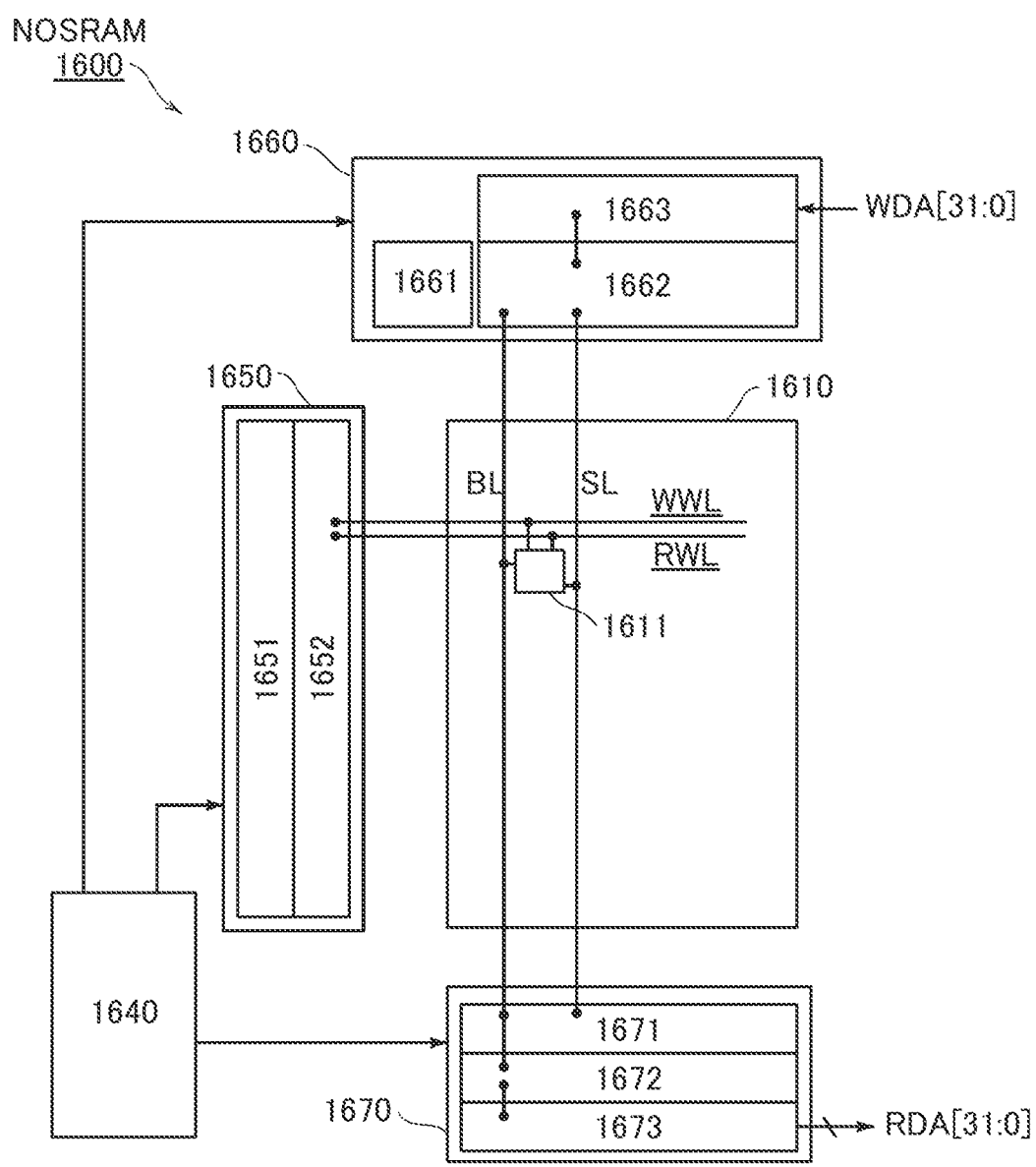
FIG. 30 is a block diagram illustrating a configuration example of a memory device of one embodiment of the present invention.

FIG. 30 shows a configuration example of NOSRAM. NOSRAM 1600 in FIG. 30 includes a memory cell array 1610, a controller 1640, a row driver 1650, a column driver 1660, and an output driver 1670. Note that the NOSRAM 1600 is multilevel NOSRAM in which one memory cell stores multilevel data.

The memory cell array 1610 includes a plurality of memory cells 1611, a plurality of word lines WWL, a plurality of word lines RWL, a plurality of bit lines BL, and a plurality of source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole and writes data WDA[31:0] and reads out data RDA[31:0]. The controller 1640 processes command signals input from the outside (e.g., a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives a source line SL and a bit line BL. The column driver 1660 includes a column decoder 1661, a write driver 1662, and a digital-analog converter circuit (DAC) 1663.

The DAC 1663 converts 3-bit digital data into an analog voltage. The DAC 1663 converts 32-bit data WDA[31:0] into an analog voltage per 3 bits.

The write driver 1662 has a function of precharging the source line SL, a function of bringing the source line SL into an electrically floating state, a function of selecting the source line SL, a function of inputting a writing voltage generated from the DAC 1663 to the selected source line SL, a function of precharging the bit line BL, a function of bringing the bit line BL into an electrically floating state, and the like.

The output driver 1670 includes a selector 1671, an analog-digital converter circuit (ADC) 1672, and an output buffer 1673. The selector 1671 selects a source line SL to be accessed and transmits a voltage of the selected source line SL to the ADC 1672. The ADC 1672 has a function of converting an analog voltage into 3-bit digital data. The voltage of the source line SL is converted into 3-bit data in the ADC 1672, and the output buffer 1673 stores the data output from the ADC 1672.

<Memory Cell>

Figure 31A:
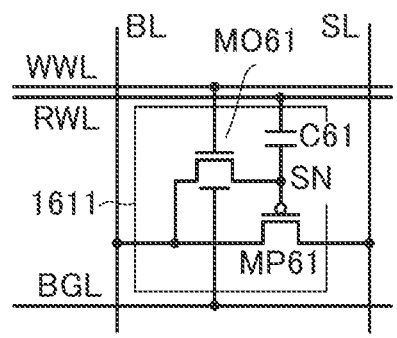
FIGS. 31A to 31E are circuit diagrams each illustrating a configuration example of a memory device of one embodiment of the present invention.

FIG. 31A is a circuit diagram showing a configuration example of the memory cell 1611. The memory cell 1611 is a 2T gain cell and is electrically connected to the word lines WWL and RWL, the bit line BL, the source line SL, and the wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for holding the voltage of the node SN. The node SN is a data holding node and corresponds to a gate of the transistor MP61 here.

The write transistor of the memory cell 1611 is formed using the OS transistor MO61; thus, the NOSRAM 1600 can hold data for a long time.

Figure 31B:
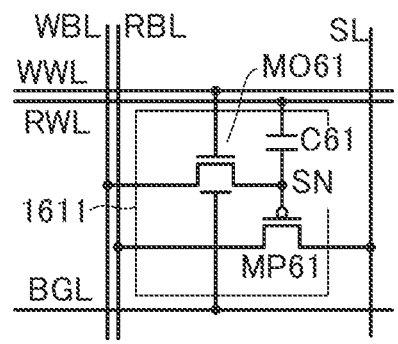

In the example of FIG. 31A, a write bit line and a read bit line are a common bit line; however, as shown in FIG. 31B, a write bit line WBL and a read bit line RBL may be provided.

Figure 31C:
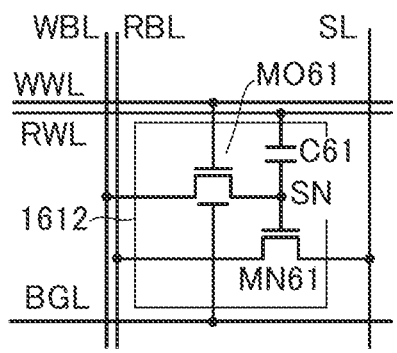
Figure 31D:
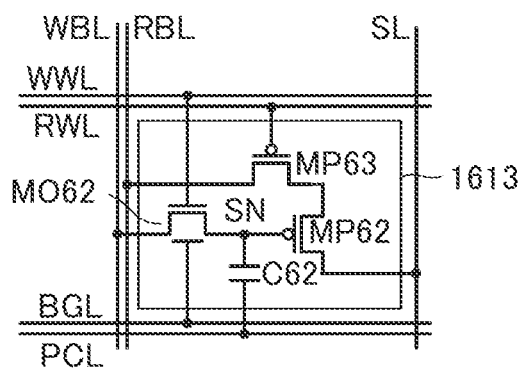
Figure 31E:
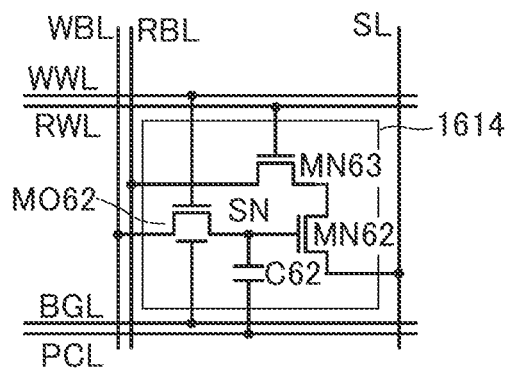

FIGS. 31C to 31E show other configuration examples of the memory cell. FIGS. 31C to 31E show examples where the write bit line and the read bit line are provided; however, as shown in FIG. 31A, the write bit line and the read bit line may be a common bit line.

The memory cell 1612 shown in FIG. 31C is a modification example of the memory cell 1611 where the read transistor is changed into an n-channel transistor (MN61). The transistor MN61 may be an OS transistor or a Si transistor.

In the memory cells 1611 and 1612, the OS transistor MO61 may be an OS transistor with no back gate.

The memory cell 1613 shown in FIG. 31D is a 3T gain cell and is electrically connected to the word lines WWL and RWL, the bit lines WBL and RBL, the source line SL, the wiring BGL, and a wiring PCL. The memory cell 1613 includes a node SN, an OS transistor MO62, a transistor MP62, a transistor MP63, and a capacitor C62. The OS transistor MO62 is a write transistor. The transistor MP62 is a read transistor and the transistor MP63 is a selection transistor.

The memory cell 1614 shown in FIG. 31E is a modification example of the memory cell 1613 where the read transistor and the selection transistor are changed into n-channel transistors (MN62 and MN63). Each of the transistors MN62 and MN63 may be an OS transistor or a Si transistor.

The OS transistors provided in the memory cells 1611 to 1614 may each be a transistor with no back gate or a transistor with a back gate.

There is theoretically no limitation on the number of rewriting operations of the NOSRAM 1600 because data is rewritten by charging and discharging of the capacitor C61; and data can be written to and read from the NOSRAM with low energy. Furthermore, since data can be held for a long time, the refresh rate can be reduced.

In the case where the semiconductor device described in any of the above embodiments is used for the memory cells 1611, 1612, 1613, and 1614, the transistor 200 can be used as the OS transistors MO61 and MO62, the capacitor 100 can be used as the capacitors C61 and C62, and the transistor 300 can be used as the transistors MP61 and MN62. Thus, the area occupied by each set consisting of one transistor and one capacitor in the top view can be reduced, so that the memory device of this embodiment can be highly integrated. As a result, storage capacity per unit area of the memory device of this embodiment can be increased.

The structure described in this embodiment can be used in appropriate combination with any of the structures described in the other embodiments.

Embodiment 6

In this embodiment, a DOSRAM will be described as another example of the memory device of one embodiment of the present invention that includes an OS transistor and a capacitor, with reference to FIG. 32 and FIGS. 33A and 33B. A DOSRAM (registered trademark) stands for "dynamic oxide semiconductor RAM", which is a RAM including a 1T1C (one-transistor/one-capacitor) memory cell. As in the NOSRAM, an OS memory is used in the DOSRAM.

<<DOSRAM 1400>>

Figure 32:
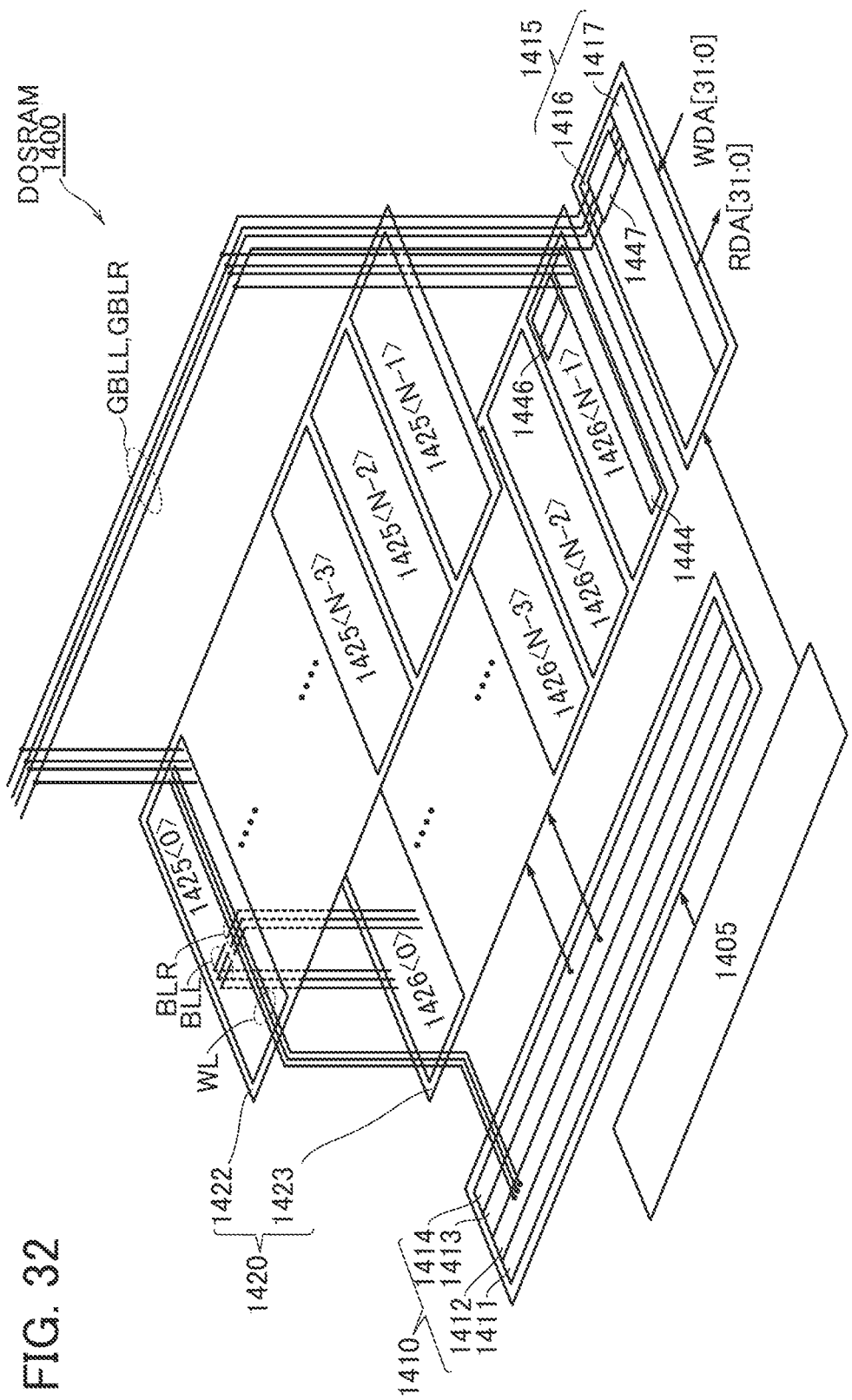
FIG. 32 is a block diagram illustrating a configuration example of a memory device of one embodiment of the present invention.
Figure 33A:
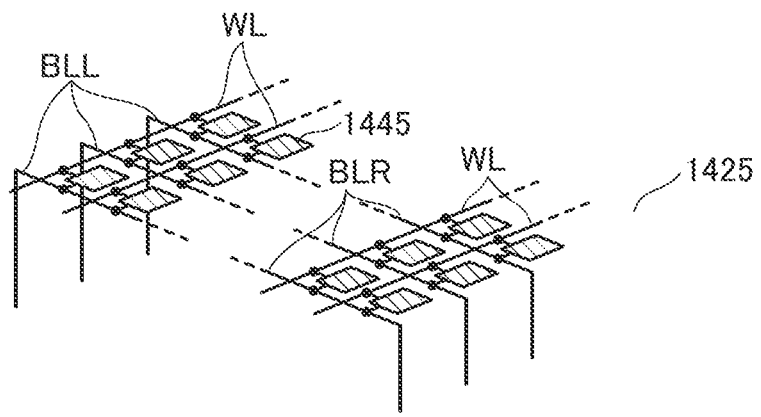
FIGS. 33A and 33B are a block diagram and a circuit diagram illustrating a configuration example of a memory device of one embodiment of the present invention.

FIG. 32 illustrates a configuration example of the DOSRAM. As illustrated in FIG. 32, a DOSRAM 1400 includes a controller 1405, a row circuit 1410, a column circuit 1415, and a memory cell and sense amplifier array 1420 (hereinafter referred to as MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines.

The memory cell array 1422 includes N local memory cell arrays 1425<0> to 1425<N−1>, where N is an integer greater than or equal to 2. FIG. 33A illustrates a configuration example of the local memory cell array 1425. The local memory cell array 1425 includes a plurality of memory cells 1445, a plurality of word lines WL, and a plurality of bit lines BLL and BLR. In the example in FIG. 33A, the local memory cell array 1425 has an open bit-line architecture but may have a folded bit-line architecture.

Figure 33B:
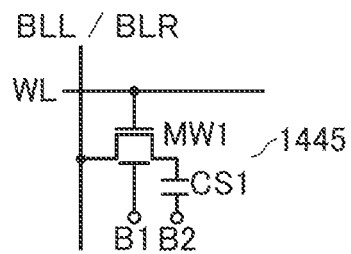

FIG. 33B illustrates a circuit configuration example of each of the memory cells 1445. The memory cells 1445 each include a transistor MW1, a capacitor CS1, and terminals B1 and B2. The transistor MW1 has a function of controlling the charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor CS1. A second terminal of the capacitor CS1 is electrically connected to the terminal B2. A constant voltage (e.g., low power supply voltage) is applied to the terminal B2.

In the case where the semiconductor device described in any of the above embodiments is used in each of the memory cells 1445, the transistor 200 can be used as the transistor MW1, and the capacitor 100 can be used as the capacitor CS1. In this case, the area occupied by each set consisting of one transistor and one capacitor in the top view can be reduced; accordingly, the memory device of this embodiment can be highly integrated. As a result, storage capacity per unit area of the memory device of this embodiment can be increased.

The transistor MW1 includes a back gate, and the back gate is electrically connected to the terminal B1. This makes it possible to change the threshold voltage of the transistor MW1 with a voltage applied to the terminal B1. For example, a fixed voltage (e.g., negative constant voltage) may be applied to the terminal B1; alternatively, the voltage applied to the terminal B1 may be changed in response to the operation of the DOSRAM 1400.

The back gate of the transistor MW1 may be electrically connected to the gate, the first terminal, or the second terminal of the transistor MW1. The transistor MW1 does not necessarily include the back gate.

The sense amplifier array 1423 includes N local sense amplifier arrays 1426<0> to 1426<N−1>. The local sense amplifier arrays 1426 each include one switch array 1444 and a plurality of sense amplifiers 1446. Each of the sense amplifiers 1446 is electrically connected to a bit line pair. The sense amplifiers 1446 each have a function of precharging the corresponding bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair, and two global bit lines that are compared simultaneously by the global sense amplifier are collectively referred to as the global bit line pair. The bit line pair can be referred to as a pair of bit lines, and the global bit line pair can be referred to as a pair of global bit lines. Here, the bit line BLL and the bit line BLR form one bit line pair, and the global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, each of the plurality of local sense amplifier arrays 1426 is driven independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

Each of the global sense amplifiers 1447 is electrically connected to the global bit line pair (GBLL, GBLR). The global sense amplifiers 1447 each have a function of amplifying a voltage difference of the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a column where data is to be written. The local sense amplifier array 1426 amplifies the written data, and then retains the amplified data. In the specified local memory cell array 1425, the word line WL of the row where data is to be written is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified with an address signal. In the specified local memory cell array 1425, the word line WL of a row where data is to be read is selected, and data of the memory cell 1445 is written to the bit line. The local sense amplifier array 1426 detects a voltage difference of the bit line pair of each column as data, and retains the data. The switch array 1444 writes the data of a column specified by the address signal to the global bit line pair; the data is chosen from the data retained at the local sense amplifier array 1426. The global sense amplifier array 1416 determines and retains the data of the global bit line pair. The data retained at the global sense amplifier array 1416 is output to the input/output circuit 1417. Thus, the read operation is completed.

The DOSRAM 1400 has no limitations on the number of rewrites in principle and data can be read and written with low energy consumption, because data is rewritten by charging and discharging the capacitor CS1. A simple circuit configuration of the memory cell 1445 allows a high memory capacity.

The transistor MW1 is an OS transistor. The extremely low off-state current of the OS transistor can inhibit charge leakage from the capacitor CS1. Therefore, the retention time of the DOSRAM 1400 is considerably longer than that of a DRAM. This allows less frequent refresh, which can reduce power needed for refresh operations. Thus, the DOSRAM 1400 is suitably used for a memory device that can rewrite a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in power consumption.

The structure described in this embodiment can be used in appropriate combination with any of the structures described in the other embodiments.

Embodiment 7

In this embodiment, a field-programmable gate array (FPGA) will be described as an example of the semiconductor device of one embodiment of the present invention that includes an OS transistor and a capacitor, with reference to FIGS. 34A to 34C, FIGS. 35A to 35C, FIG. 36, and FIGS. 37A and 37B. In the FPGA of this embodiment, an OS memory is used for a configuration memory and a register. Here, such an FPGA is referred to as an "OS-FPGA".

<<OS-FPGA>>

Figure 34A:
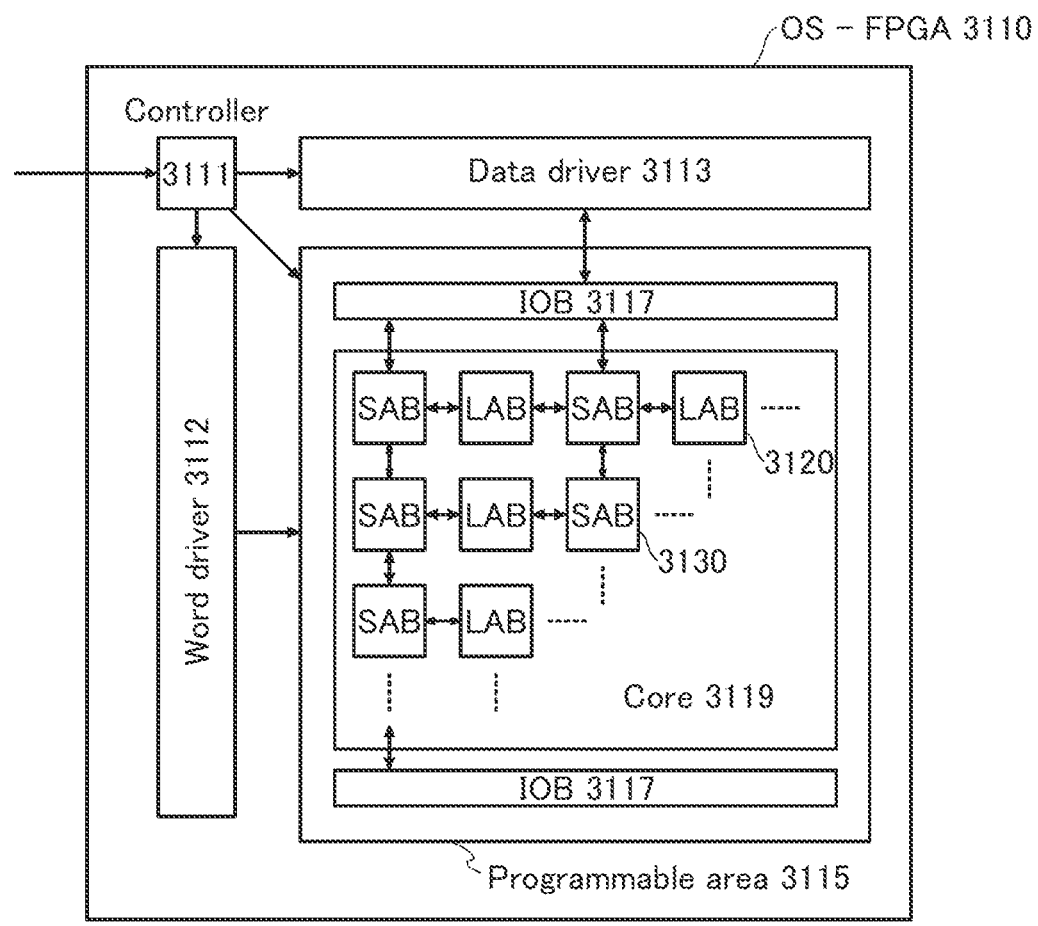
FIGS. 34A to 34C are block diagrams illustrating a configuration example of a semiconductor device of one embodiment of the present invention.

FIG. 34A illustrates a configuration example of an OS-FPGA. An OS-FPGA 3110 illustrated in FIG. 34A is capable of normally-off (NOFF) computing for context switching by a multi-context configuration and fine-grained power gating in each PLE. The OS-FPGA 3110 includes a controller 3111, a word driver 3112, a data driver 3113, and a programmable area 3115.

Figure 34B:
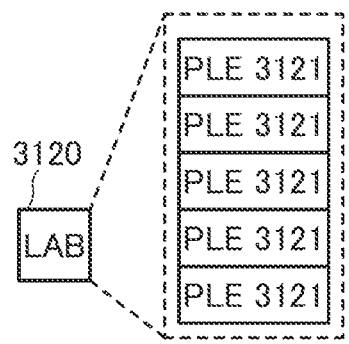
Figure 34C:
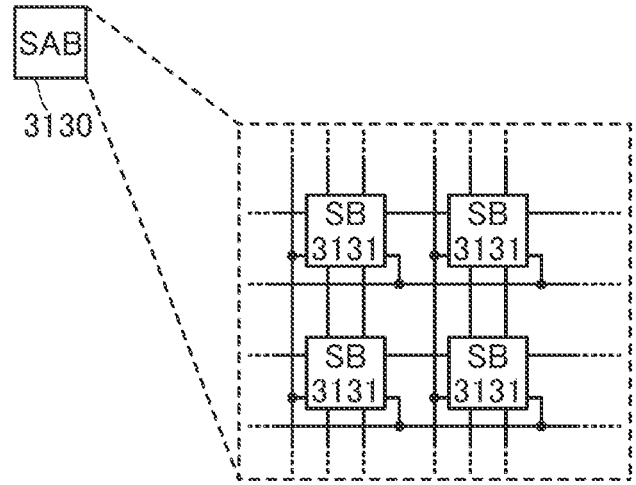

The programmable area 3115 includes two input/output blocks (IOBs) 3117 and a core 3119. The IOBs 3117 each include a plurality of programmable input/output circuits. The core 3119 includes a plurality of logic array blocks (LABs) 3120 and a plurality of switch array blocks (SABs) 3130. Each of the LABs 3120 includes a plurality of PLEs 3121. FIG. 34B illustrates an example in which the LAB 3120 includes five PLEs 3121. As illustrated in FIG. 34C, the SAB 3130 includes a plurality of switch blocks (SBs) 3131 arranged in array. The LAB 3120 is connected to the LABs 3120 in four directions (on the left, right, top, and bottom sides) through its input terminals and the SABs 3130.

Figure 35A:
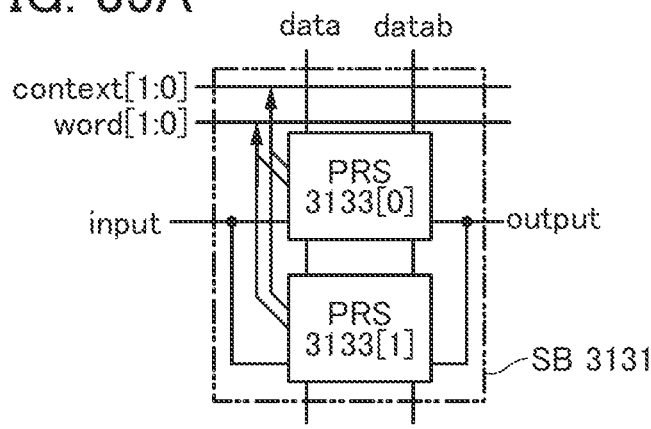
FIGS. 35A and 35B are a block diagram and a circuit diagram illustrating a configuration example of a semiconductor device of one embodiment of the present invention and FIG. 35C is a timing chart showing an operation example of the semiconductor device.

The SB 3131 is described with reference to FIGS. 35A to 35C. To the SB 3131 in FIG. 35A, data, datab, signals context[1:0], and signals word[1:0] are input. The data and the datab are configuration data, and the logics of the data and the datab are complementary to each other. The number of contexts in the OS-FPGA 3110 is two, and the signals context[1:0] are context selection signals. The signals word [1:0] are word line selection signals, and wirings to which the signals word[1:0] are input are each a word line.

The SB 3131 includes a programmable routing switch (PRS) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 35B:
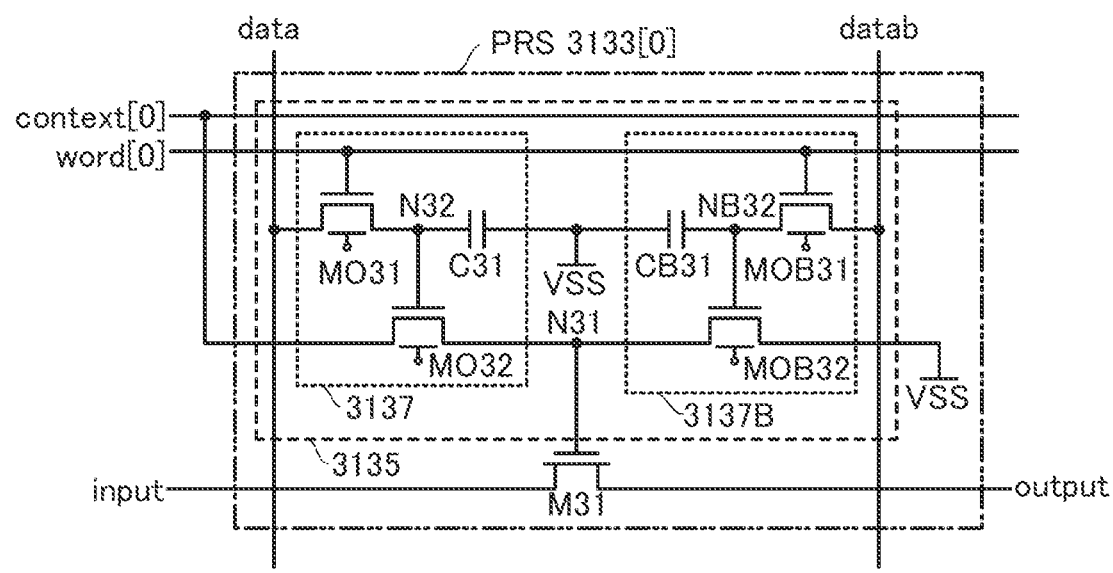
Figure 35C:
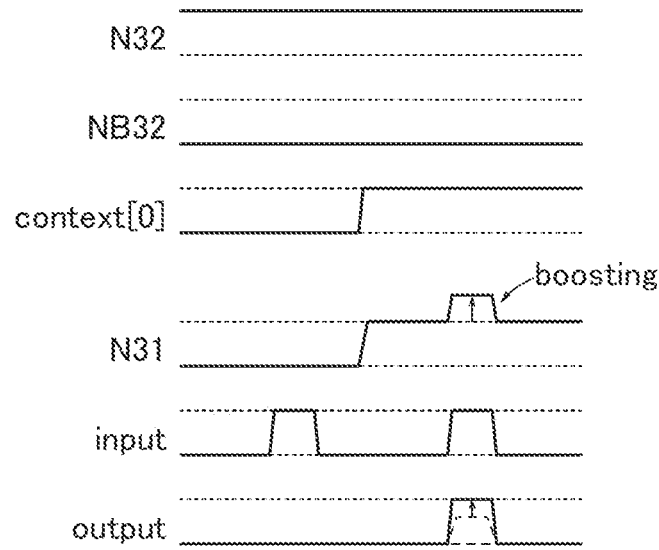

FIG. 35B illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

In the case where the semiconductor device described in any of the above embodiments is used in the SAB 3130, the transistor 200 can be used as each of the OS transistors MO31 and MOB31, and the capacitor 100 can be used as each of the capacitors C31 and CB31. In this case, the area occupied by each set consisting of one transistor and one capacitor in the top view can be reduced; accordingly, the semiconductor device of this embodiment can be highly integrated.

The OS transistors MO31, MO32, MOB31, and MOB32 each include a back gate, and these back gates are electrically connected to power supply lines that each supply a fixed voltage.

A gate of the Si transistor M31, a gate of the OS transistor MO32, and a gate of the OS transistor MOB32 correspond to a node N31, a node N32, and a node NB32, respectively. The node N32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

A logic of data that the memory circuit 3137 retains and a logic of data that the memory circuit 3137B retains are complementary to each other. Thus, either the OS transistor MO32 or the OS transistor MOB32 is turned on.

The operation example of the PRS 3133[0] is described with reference to FIG. 35C. In the PRS 3133[0], in which configuration data has already been written, the node N32 is at "H", whereas the node NB32 is at "L".

The PRS 3133[0] is inactivated while the signal context [0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is activated while the signal context[0] is at "H". When the signal context[0] is transferred to "H", the gate of the Si transistor M31 is transferred to "H" by the configuration data stored in the CM 3135.

While the PRS 3133[0] is active, when the potential of the input terminal is changed to "H", the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 36:
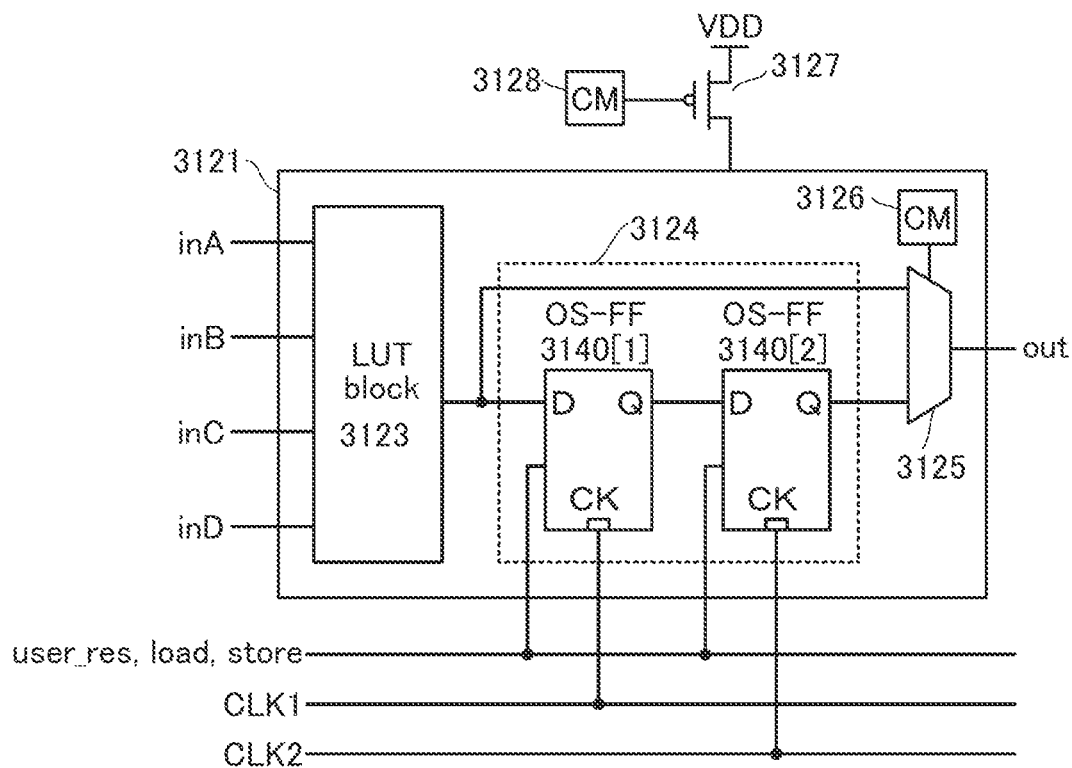
FIG. 36 is a block diagram illustrating a configuration example of a semiconductor device of one embodiment of the present invention.

FIG. 36 illustrates a configuration example of the PLE 3121. The PLE 3121 includes a lookup table (LUT) block 3123, a register block 3124, a selector 3125, and a CM 3126. The LUT block 3123 is configured to select and output data in the LUT block in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with configuration data stored in a CM 3128. Fine-grained power gating can be performed by providing the power switch 3127 for each PLE 3121. The PLE 3121 that is not used after context switching can be power gated owing to the fine-grained power gating function; thus, standby power can be effectively reduced.

The register block 3124 is formed by nonvolatile registers to achieve NOFF computing. The nonvolatile registers in the PLE 3121 are each a flip-flop provided with an OS memory (hereinafter referred to as OS-FF).

Figure 37A:
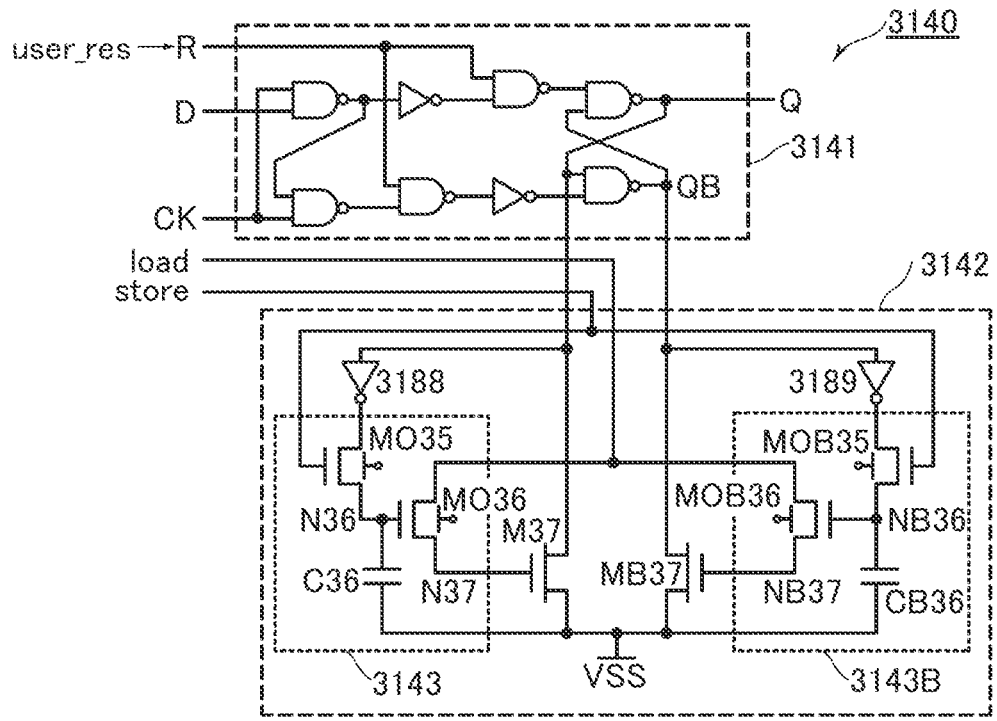
FIG. 37A is a circuit diagram illustrating a configuration example of a semiconductor device of one embodiment of the present invention and FIG. 37B is a timing chart showing an operation example of the semiconductor device.

The register block 3124 includes an OS-FF 3140[1] and an OS-FF 3140[2]. A signal user_res, a signal load, and a signal store are input to the OS-FFs 3140[1] and 3140[2]. A clock signal CLK1 is input to the OS-FF 3140[1] and a clock signal CLK2 is input to the OS-FF 3140[2]. FIG. 37A illustrates a configuration example of the OS-FF 3140.

The OS-FF 3140 includes a FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 3142 can function as a backup circuit of the FF 3141. The shadow register 3142 backs up data of the node Q and data of the node QB in response to the signal store and writes back the backed up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

In the case where the semiconductor device described in any of the above embodiments is used in the LAB 3120, the transistor 200 can be used as each of the OS transistors MO35 and MOB35, and the capacitor 100 can be used as each of the capacitors C36 and CB36. In this case, the area occupied by each set consisting of one transistor and one capacitor in the top view can be reduced; accordingly, the semiconductor device of this embodiment can be highly integrated.

The OS transistors MO35, MO36, MOB35, and MOB36 each include a back gate, and these back gates are electrically connected to power supply lines that each supply a fixed voltage.

Figure 37B:
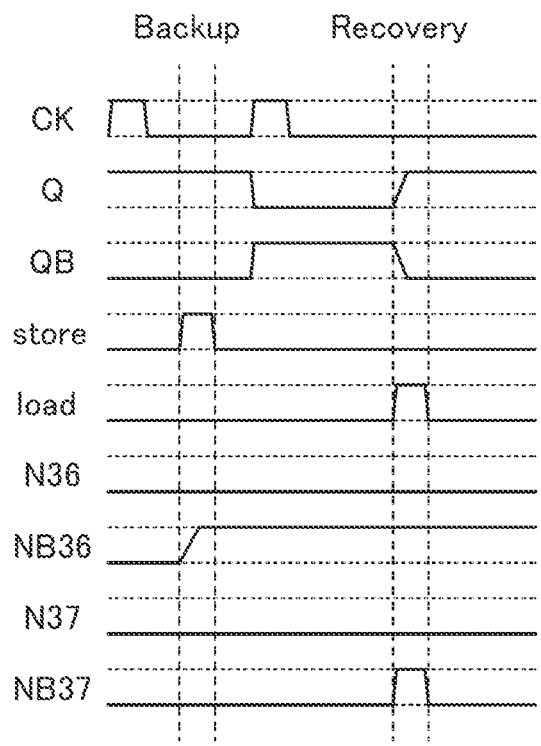

An example of an operation method of the OS-FF 3140 is described with reference to FIG. 37B.

(Backup)

When the signal store at "H" is input to the OS-FF 3140, the shadow register 3142 backs up data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the node Q and the data of the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is restored to a state at the backup operation.

A combination of the fine-grained power gating and backup/recovery operation of the OS-FF 3140 allows power consumption of the OS-FPGA 3110 to be effectively reduced.

A possible error in a memory circuit is a soft error due to the entry of radiation. The soft error is a phenomenon in which a malfunction such as inversion of data stored in a memory is caused by electron-hole pair generation when a transistor is irradiated with α rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory including an OS transistor has a high soft-error tolerance. Therefore, the OS-FPGA 3110 including an OS memory can have high reliability.

The structure described in this embodiment can be used in appropriate combination with any of the structures described in the other embodiments.

Embodiment 8

In this embodiment, an AI system in which the semiconductor device of any of the above-described embodiments is used will be described with reference to FIG. 38.

Figure 38:
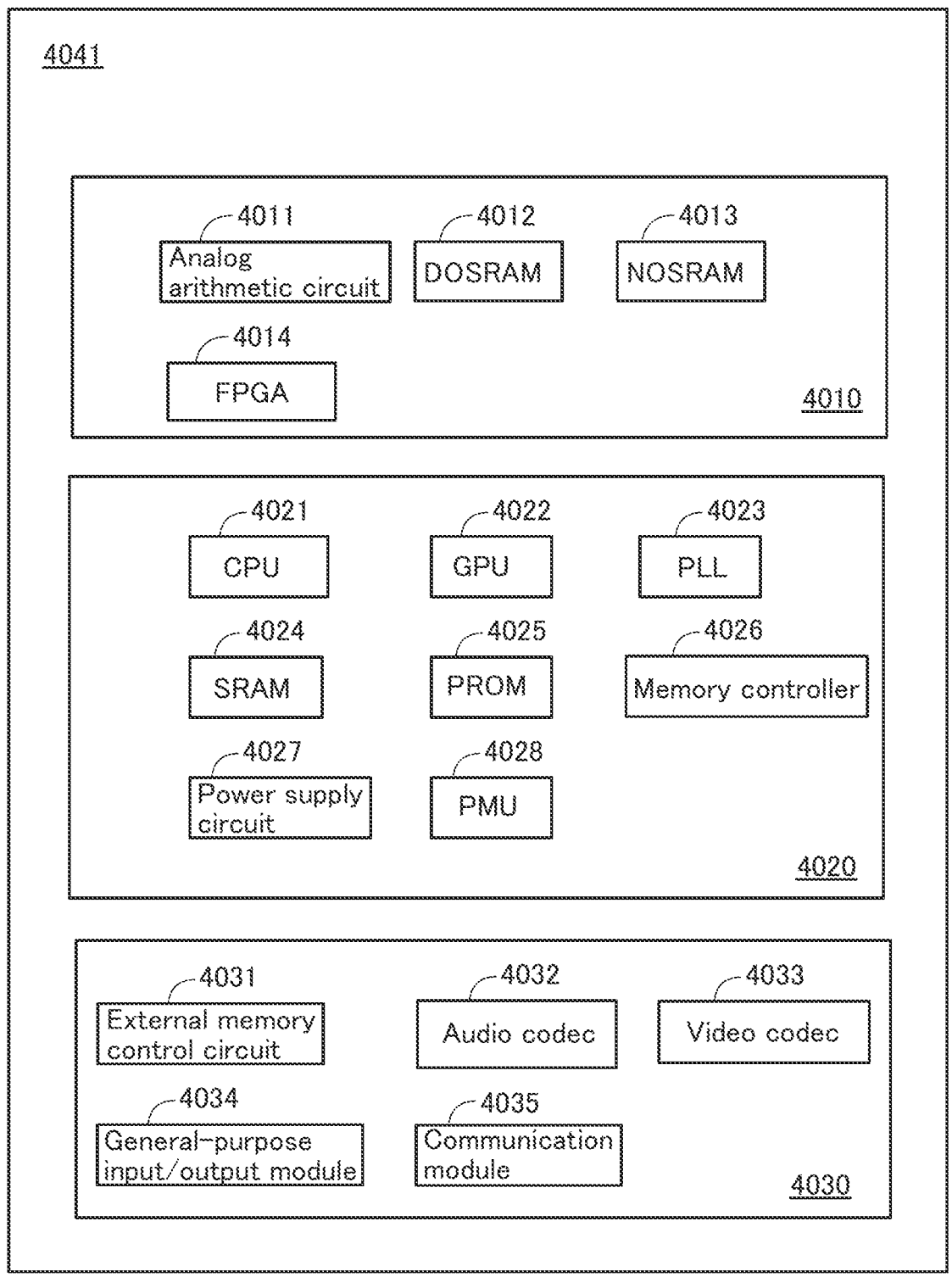
FIG. 38 is a block diagram illustrating a structure example of an AI system of one embodiment of the present invention.

FIG. 38 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400, the NOSRAM 1600, and the OS-FPGA 3110 described in the above embodiments can be used as the DOSRAM 4012, the NOSRAM 4013, and the FPGA 4014, respectively.

The control portion 4020 includes a central processing unit (CPU) 4021, a graphics processing unit (GPU) 4022, a phase locked loop (PLL) 4023, a static random access memory (SRAM) 4024, a programmable read only memory (PROM) 4025, a memory controller 4026, a power supply circuit 4027, and a power management unit (PMU) 4028.

The input/output portion 4030 includes an external memory control circuit 4031, an audio codec 4032, a video codec 4033, a general-purpose input/output module 4034, and a communication module 4035.

The arithmetic portion 4010 can perform neural network learning or neural network inference.

The analog arithmetic circuit 4011 includes an analog/digital (A/D) converter circuit, a digital/analog (D/A) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM including an OS transistor which temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data has to be stored piece by piece because of the circuit area limitation and small storage capacity of the SRAM. The DOSRAM 4012 has a larger storage capacity than an SRAM because memory cells of the DOSRAM can be highly integrated even in a limited circuit area. Therefore, the DOSRAM 4012 can efficiently store the input data.

The NOSRAM 4013 is a nonvolatile memory including an OS transistor. The NOSRAM 4013 consumes less power in writing data than the other nonvolatile memories such as a flash memory, a resistive random access memory (ReRAM), and a magnetoresistive random access memory (MRAM). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Because the NOSRAM 4013 can store analog data as well as digital data, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption.

Furthermore, the NOSRAM 4013 enables a longer bit line than the DOSRAM 4012 and thus can have an increased storage capacity.

The FPGA 4014 is an FPGA including an OS transistor. In the FPGA of this embodiment, an OS memory can be used for a configuration memory and a register. Here, such an FPGA is referred to as an "OS-FPGA". By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with a hardware. The connection of the neural network with a hardware enables higher speed performance.

The FPGA 4014 is an OS-FPGA. An OS-FPGA can have a smaller memory area than an FPGA formed using an SRAM. Thus, adding a context switching function only causes a small increase in area. Moreover, an OS-FPGA can transmit data and parameters at high speed by utilizing the boosting.

In the AI system 4041, the analog arithmetic circuit 4011, the DOSRAM 4012, the NOSRAM 4013, and the FPGA 4014 can be provided on one die (chip). Thus, the AI system 4041 can perform calculation of the neural network quickly with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 need not necessarily include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

In the AI system 4041, an operation can be performed using a deep neural network (DNN), a convolutional neural network (CNN), a recurrent neural network (RNN), an autoencoder, a deep Boltzmann machine (DBM), a deep belief network (DBN), or the like in accordance with the problem that is desired to be solved. The PROM 4025 can store programs for performing the operation. Some or all of the programs may be stored in the NOSRAM 4013.

Most of the existing programs used as libraries are designed on the premise that the programs are processed by a GPU. Therefore, the AI system 4041 preferably includes the GPU 4022. The AI system 4041 can execute the bottle-neck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may include an OS memory. In this case, storing a reference potential in the OS memory can reduce the power consumption of the power supply circuit 4027.

The PMU 4028 is configured to temporarily stop the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped. As a result, the AI system 4041 can save the power.

The PLL 4023 is configured to generate a clock. The AI system 4041 performs an operation on the basis of the clock generated by the PLL 4023. The PLL 4023 preferably includes an OS memory. When an OS memory is included in the PLL 4023, an analog potential with which the clock oscillation frequency is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, quick data transmission can be achieved.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external storage device such as a hard disk drive (HDD) or a solid state drive (SSD) in many cases. Therefore, the AI system 4041 preferably includes the external memory control circuit 4031 functioning as an interface with the external storage device.

Because audio and video are often subjects of the learning and inference using the neural network, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a universal serial bus (USB), an inter-integrated circuit (I2C), or the like, for example.

The AI system 4041 can perform learning or make an inference using data obtained via the Internet. For this reason, the AI system 4041 preferably includes the communication module 4035.

The analog arithmetic circuit 4011 may include a multi-level flash memory as an analog memory. However, the flash memory has a limit on the number of rewriting times. In addition, the multi-level flash memory is extremely difficult to embed; in other words, the arithmetic circuit and the memory are difficult to form on the same die.

Alternatively, the analog arithmetic circuit 4011 may include a ReRAM as an analog memory. However, the ReRAM has a limit on the number of rewriting times and also has a problem in storage accuracy. Moreover, because the ReRAM is a two-terminal element, the complicated circuit design is necessary for separating data writing and data reading.

Further alternatively, the analog arithmetic circuit 4011 may include an MRAM as an analog memory. However, the MRAM has a problem in storage capacity because of its low magnetoresistive ratio.

In consideration of the above, an OS memory is preferably used as an analog memory in the analog arithmetic circuit 4011.

The structure described in this embodiment can be used in appropriate combination with any of the structures described in the other embodiments.

Embodiment 9

<Application Example of AI System>

In this embodiment, application examples of the AI system described in the above embodiment will be described with reference to FIGS. 39A and 39B.

Figure 39A:
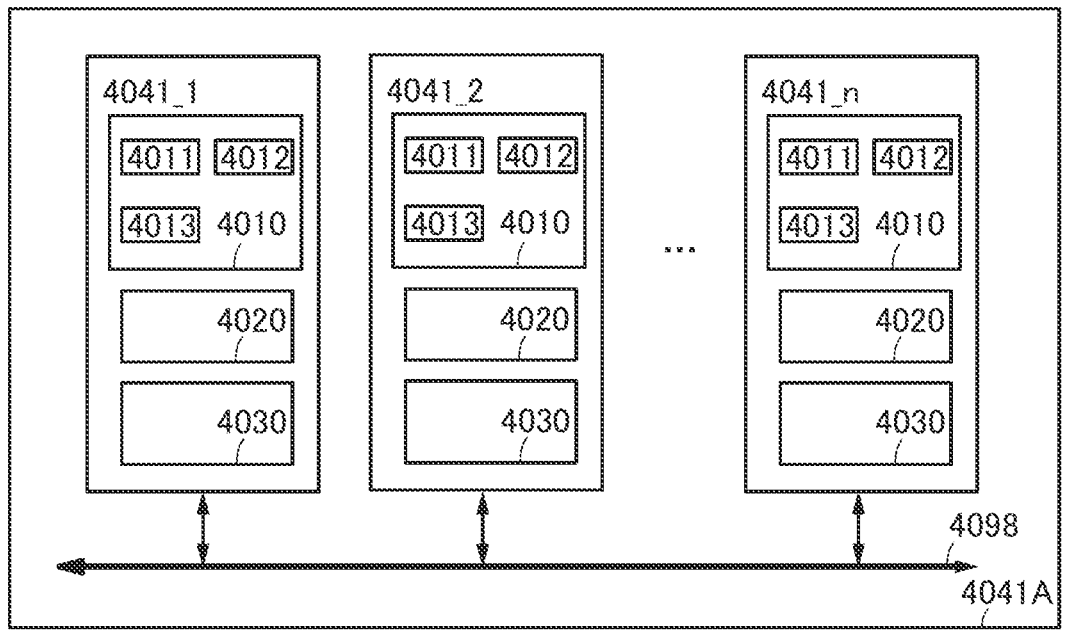
FIGS. 39A and 39B are block diagrams each illustrating an application example of an AI system of one embodiment of the present invention.

FIG. 39A illustrates an AI system 4041A in which the AI systems 4041 described with FIG. 38 are arranged in parallel and a signal can be transmitted between the systems via a bus line.

The AI system 4041A illustrated in FIG. 39A includes AI systems 4041_1 to 4041_*n* (n is a natural number). The AI systems 4041_1 to 4041_*n* are connected to each other via a bus line 4098.

Figure 39B:
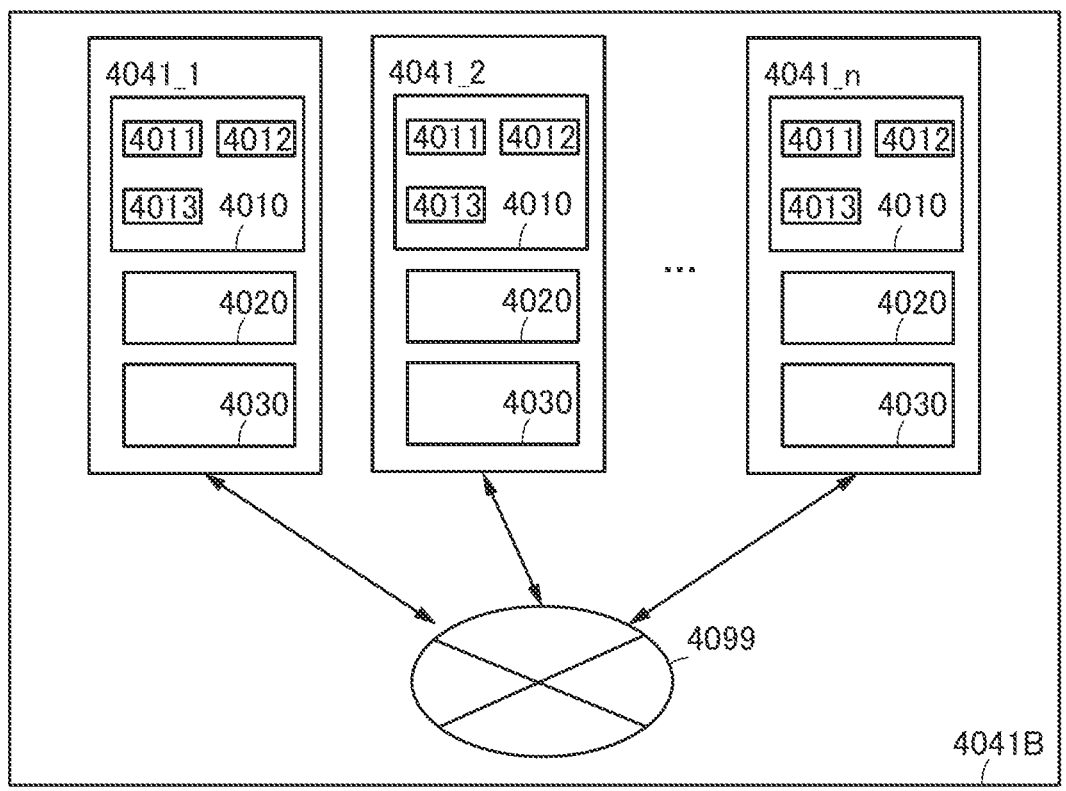

FIG. 39B illustrates an AI system 4041B in which the AI systems 4041 described with FIG. 38 are arranged in parallel as in FIG. 39A and a signal can be transmitted between the systems via a network.

The AI system 4041B illustrated in FIG. 39B includes the AI systems 4041_1 to 4041_*n*. The AI systems 4041_1 to 4041_*n* are connected to each other via a network 4099.

A communication module is provided in each of the AI systems 4041_1 to 4041_*n*; such a configuration enables wireless or wired communication via the network 4099. A communication module can communicate via an antenna. Communication can be performed when an electronic device is connected to a computer network such as the Internet (infrastructure of the World Wide Web, WWW), an intranet, an extranet, a personal area network (PAN), a local area network (LAN), a campus area network (CAN), a metropolitan area network (MAN), a wide area network (WAN), or a global area network (GAN), for example. In the case of performing wireless communication, it is possible to use, as a communication protocol or a communication technology, a communications standard such as Long-Term Evolution (LTE), Global System for Mobile Communication (GSM: registered trademark), Enhanced Data Rates for GSM Evolution (EDGE), Code Division Multiple Access 2000 (CDMA2000), or W-CDMA (registered trademark), or a communications standard developed by IEEE such as Wi-Fi (registered trademark), Bluetooth (registered trademark), or ZigBee (registered trademark).

With the configuration illustrated in FIG. 39A or FIG. 39B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning requires a smaller amount of arithmetic processing. As a result, recognition accuracy can be increased. With the use of data obtained with each AI system, biological information that irregularly changes should be able to be collectively grasped instantly.

The structure described in this embodiment can be used in appropriate combination with any of the structures described in the other embodiments.

Embodiment 10

In this embodiment, an example of an IC incorporating the AI system described in the above embodiment will be described.

In the AI system described in the above embodiment, a digital processing circuit (e.g., a CPU) that includes a Si transistor and an OS-FPGA, an OS memory (e.g., a DOSRAM or a NOSRAM), and an analog arithmetic circuit that include OS transistors can be integrated into one die.

Figure 40:
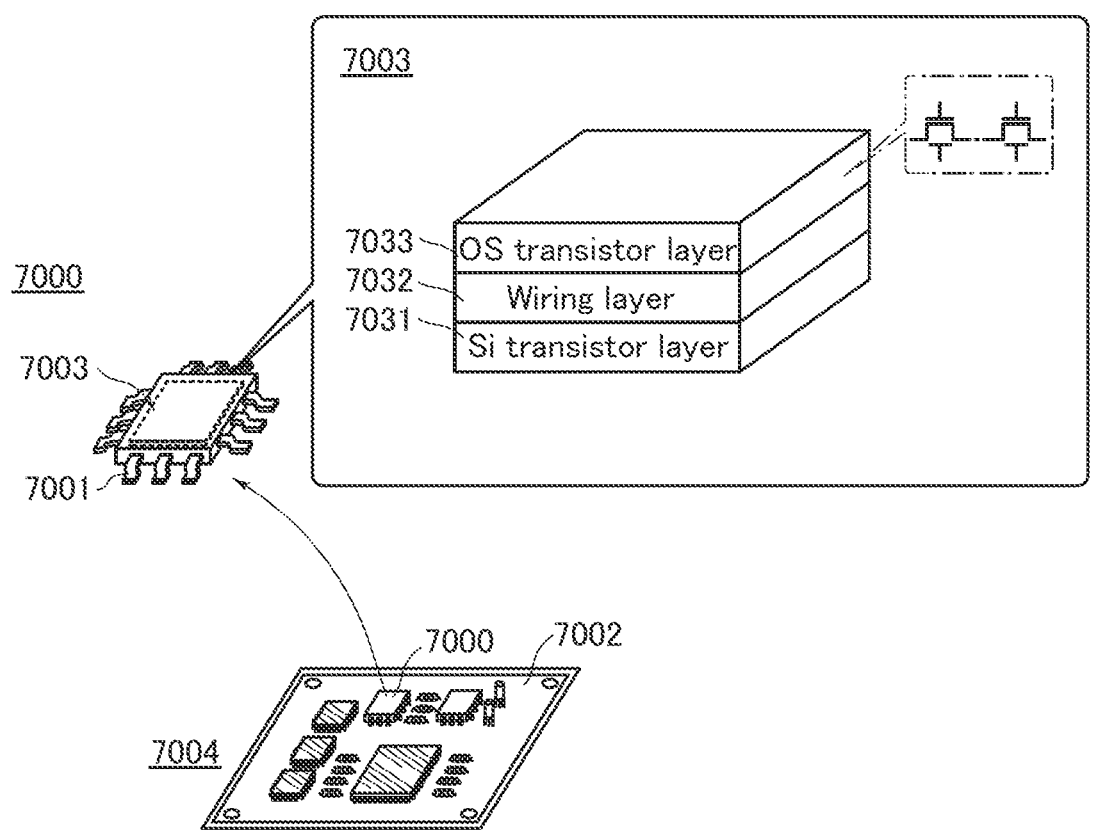
FIG. 40 is a schematic perspective view illustrating a structure example of an IC incorporating an AI system of one embodiment of the present invention.

FIG. 40 illustrates the example of the IC incorporating the AI system. An AI system IC 7000 illustrated in FIG. 40 includes a lead 7001 and a circuit portion 7003. The AI system IC 7000 is mounted on a printed circuit board 7002, for example. A plurality of such IC chips are combined and electrically connected to each other on the printed circuit board 7002; thus, a circuit board on which electronic components are mounted (a circuit board 7004) is formed. In the circuit portion 7003, the circuits described in the above embodiment are provided on one die. The circuit portion 7003 has a stacked-layer structure that is broadly divided into a Si transistor layer 7031, a wiring layer 7032, and an OS transistor layer 7033. Since the OS transistor layer 7033 can be stacked over the Si transistor layer 7031, the size of the AI system IC 7000 can be easily reduced.

Although a Quad Flat Package (QFP) is used as a package of the AI system IC 7000 in FIG. 40, the package is not limited thereto.

The digital processing circuit (e.g., a CPU) and the OS-FPGA, the OS memory (e.g., a DOSRAM or a NOSRAM), and the analog arithmetic circuit that include OS transistors can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with any of the structures described in the other embodiments.

Embodiment 11

<Electronic Device>

The semiconductor device of one embodiment of the present invention can be used for a variety of electronic devices. FIGS. 41A to 41F each illustrate a specific example of an electronic device including the semiconductor device of one embodiment of the present invention.

Figure 41A:
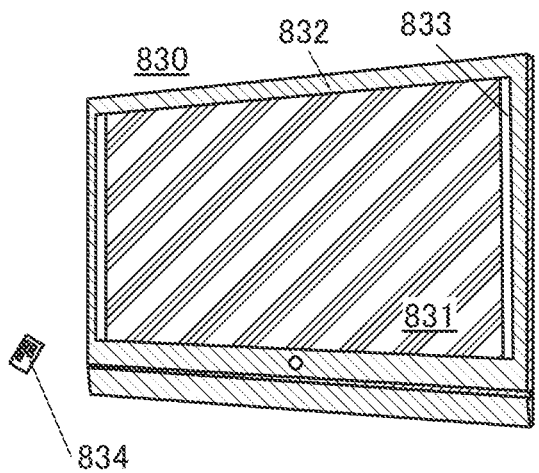
FIGS. 41A to 41F each illustrate an electronic device of one embodiment of the present invention.

FIG. 41A illustrates a monitor 830. The monitor 830 includes a display portion 831, a housing 832, a speaker 833, and the like. The monitor 830 can also include an LED lamp, operation keys (including a power switch or an operation switch), a connection terminal, a variety of sensors, a microphone, and the like. The monitor 830 can be controlled with a remote controller 834.

The monitor 830 can function as a television device by receiving airwaves.

The monitor 830 can receive airwaves such as a ground wave or a satellite wave, airwaves for analog broadcasting or digital broadcasting, airwaves for image-and-sound broadcasting or sound-only broadcasting, or the like. For example, the monitor 830 can receive airwaves transmitted in a certain frequency band in a UHF band (higher than or equal to 300 MHz and lower than or equal to 3 GHz) or a VHF band (higher than or equal to 30 MHz and lower than or equal to 300 MHz). With the use of a plurality of pieces of data received in a plurality of frequency bands, the transfer rate can be increased and more information can thus be obtained. Accordingly, the display portion 831 can display an image with a resolution higher than the full high definition, such as 4K2K, 8K4K, 16K8K, or more.

An image to be displayed on the display portion 831 may be generated using broadcasting data transmitted with a technology for transmitting data via a computer network such as the Internet, a local area network (LAN), or Wi-Fi (registered trademark). In that case, the monitor 830 does not necessarily include a tuner.

The monitor 830 can be used as a computer monitor when connected to a computer. Several people can see the monitor 830 connected to a computer at the same time; thus, the monitor 830 is suitably used for a conference system. The monitor 830 can also be used for a videoconference system by displaying data in a computer via a network or being connected to a network.

Alternatively, the monitor 830 can be used as a digital signage.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the monitor 830, image processing such as noise removal, grayscale conversion, color tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Figure 41B:
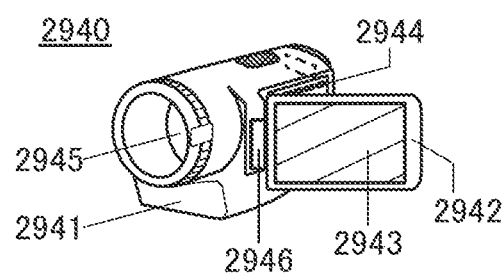

A video camera 2940 illustrated in FIG. 41B includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housings 2941 and 2942 can be changed with the joint 2946. Depending on the angle between the housings 2941 and 2942, the orientation of an image displayed on the display portion 2943 can be changed or an image can be displayed or undisplayed.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the video camera 2940, imaging appropriate for the surroundings of the video camera 2940 can be performed. Specifically, imaging can be performed with optimal exposure for the surrounding brightness. In the case of performing imaging with backlighting or imaging under mixed brightness conditions (e.g., indoors and outdoors), high-dynamic-range (HDR) imaging can be performed.

Furthermore, the AI system can learn user's habit and assist the user in performing imaging. Specifically, the AI system can learn user's camera shaking habit and cancel the camera shaking during imaging, so that blurring of the obtained image associated with camera shaking can be reduced as much as possible. In the case of using a zoom function during imaging, the orientation of a lens or the like can be controlled such that a subject is positioned at the center of an image all the time.

Figure 41C:
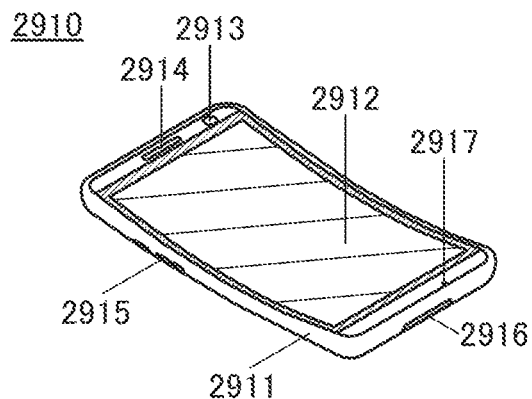

An information terminal 2910 illustrated in FIG. 41C includes a housing 2911, a display portion 2912, a microphone 2917, a speaker portion 2914, a camera 2913, an external connection portion 2916, operation switches 2915, and the like. A touch screen and a display panel formed using flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

A memory device including the semiconductor device of one embodiment of the present invention can hold control data, a control program, or the like of the information terminal 2910 for a long time, for example.

When an AI system including the semiconductor device of one embodiment of the present invention is used for the image processing portion of the information terminal 2910, image processing such as noise removal, grayscale conversion, tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the information terminal 2910. The information terminal 2910 incorporating the AI system can predict touch input from the motion of user's fingers, eyes, or the like.

Figure 41D:
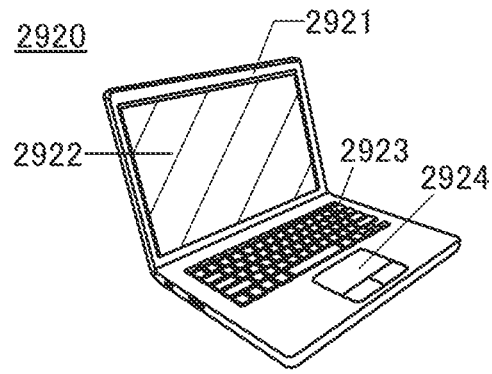

A notebook personal computer 2920 illustrated in FIG. 41D includes a housing 2921, a display portion 2922, a keyboard 2923, a pointing device 2924, and the like. The notebook personal computer 2920 also includes an antenna, a battery, and the like inside the housing 2921.

A memory device including the semiconductor device of one embodiment of the present invention can hold control data, a control program, or the like of the notebook personal computer 2920 for a long time, for example.

When an AI system including the semiconductor device of one embodiment of the present invention is used for the image processing portion of the notebook personal computer 2920, image processing such as noise removal, grayscale conversion, tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the notebook personal computer 2920. The notebook personal computer 2920 incorporating the AI system can predict touch input to the display portion 2922, from the motion of user's finger, eyes, or the like. In texting, the AI system predicts input from the past input text, the context, or a diagram such as a photograph, to assist conversion. Accordingly, input mistakes and conversion mistakes can be reduced as much as possible.

Figure 41E:
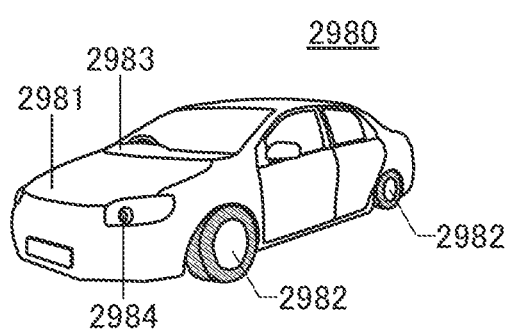
Figure 41F:
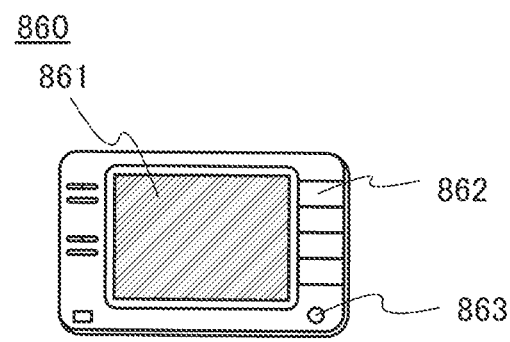

FIG. 41E is an external view illustrating an example of an automobile. FIG. 41F illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that the navigation device 860 be incorporated into and linked to the automobile 2980.

A memory device including the semiconductor device of one embodiment of the present invention can hold control data, a control program, or the like of the automobile 2980 or the navigation device 860 for a long time, for example. When an AI system including the semiconductor device of one embodiment of the present invention is used for a control device or the like of the automobile 2980, the AI system can learn driver's driving skill and habit and assist the driver in safe driving or driving involving efficient use of fuel such as gasoline or a battery. To assist the driver in safe driving, the AI system learns not only driver's driving skill and habit, but also learns the behavior of the automobile 2980 such as the speed and movement, road information saved in the navigation device 860, and the like complexly; thus, lane departure and collision with other automobiles, pedestrians, objects, and the like can be prevented. Specifically, when there is a sharp curve ahead, the navigation device 860 transmits the road information to the automobile 2980 so that the speed of the automobile 2980 can be controlled and steering can be assisted.

This embodiment can be implemented in an appropriate combination with any of the structures described in the other embodiments.

REFERENCE NUMERALS

100: capacitor, 100a: capacitor, 100b: capacitor, 120: conductor, 120A: conductive film, 130: insulator, 130A: insulating film, 161: memory cell, 200: transistor, 200a: transistor, 200b: transistor, 205: conductor, 205a: conductor, 205b: conductor, 207: conductor, 210: insulator, 212: insulator, 214: insulator, 216: insulator, 218: conductor, 220: insulator, 222: insulator, 224: insulator, 230: oxide, 230a: oxide, 230A: oxide film, 230b: oxide, 230B: oxide film, 230c: oxide, 230C: oxide film, 231: region, 231a: region, 231b: region, 232: junction region, 232a: junction region, 232b: junction region, 234: region, 239: region, 250: insulator, 250A: insulating film, 252: conductor, 252a: conductor, 252b: conductor, 252c: conductor, 252d: conductor, 260: conductor, 260a: conductor, 260A: conductive film, 260b: conductor, 260B: conductive film, 260c: conductor, 260C: conductive film, 270: insulator, 270A: insulating film, 271: insulator, 271A: insulating film, 272: insulator, 272A: insulating film, 274: insulator, 280: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 600: cell, 600a: cell, 600b: cell, 610: circuit, 620: circuit.

This application is based on Japanese Patent Application Serial No. 2017-027571 filed with Japan Patent Office on Feb. 17, 2017, and Japanese Patent Application Serial No. 2017-027739 filed with Japan Patent Office on Feb. 17, 2017, the entire contents of which are hereby incorporated by reference.

The invention claimed is:

1. A semiconductor device comprising:
   a first oxide comprising:
      a first region and a second region adjacent to each other; and
      a third region and a fourth region with the first region and the second region sandwiched between the third region and the fourth region;
   a second oxide over the first region;
   a first insulator over the second oxide;
   a first conductor over the first insulator;
   a second insulator over the second oxide and on side surfaces of the first insulator and the first conductor;
   a third insulator over the second region and on a side surface of the second insulator;
   a second conductor over the second region with the third insulator positioned between the second region and the second conductor and on the side surface of the second insulator with the third insulator positioned between the side surface of the second insulator and the second conductor; and
   a fourth insulator covering the first oxide, the second oxide, the first insulator, the first conductor, the second insulator, the third insulator, and the second conductor and in contact with the third region and the fourth region.

2. The semiconductor device according to claim 1, wherein the first oxide is over a third conductor, and wherein a bottom surface of the fourth region is in contact with a top surface of the third conductor.

3. The semiconductor device according to claim 1, wherein the first oxide comprises In, an element M, and Zn, and wherein the element M is Al, Ga, Y, or Sn.

4. The semiconductor device according to claim 1,
wherein the second oxide comprises In, an element M, and Zn, and
wherein the element M is Al, Ga, Y, or Sn.

5. The semiconductor device according to claim 1,
wherein the second insulator comprises an oxide comprising one of or both aluminum and hafnium.

6. A semiconductor device comprising:
a transistor;
a capacitor;
a first oxide comprising:
   a first region and a second region adjacent to each other; and
   a third region and a fourth region with the first region and the second region sandwiched between the third region and the fourth region;
a second oxide over the first region;
a first insulator over the second oxide;
a first conductor over the first insulator;
a second insulator over the second oxide and on side surfaces of the first insulator and the first conductor;
a third insulator over the second region and on a side surface of the second insulator;
a second conductor over the second region with the third insulator positioned between the second region and the second conductor and on the side surface of the second insulator with the third insulator positioned between the side surface of the second insulator and the second conductor; and
a fourth insulator covering the first oxide, the second oxide, the first insulator, the first conductor, the second insulator, the third insulator, and the second conductor and in contact with the third region and the fourth region,
wherein part of the first region serves as a channel formation region of the transistor,
wherein the first insulator serves as a gate insulating film of the transistor,
wherein the first conductor serves as a gate electrode of the transistor,
wherein the second region serves as a first electrode of the capacitor,
wherein the third insulator serves as a dielectric of the capacitor, and
wherein the second conductor serves as a second electrode of the capacitor.

7. The semiconductor device according to claim 6,
wherein the fourth region is adjacent to the second region,
wherein the third region serves as one of a source and a drain of the transistor, and
wherein the second region and the fourth region serve as the other of the source and the drain of the transistor.

8. The semiconductor device according to claim 6,
wherein the first oxide is over a third conductor, and
wherein a bottom surface of the fourth region is in contact with a top surface of the third conductor.

9. The semiconductor device according to claim 6,
wherein the first oxide comprises In, an element M, and Zn, and
wherein the element M is Al, Ga, Y, or Sn.

10. The semiconductor device according to claim 6,
wherein the second oxide comprises In, an element M, and Zn, and
wherein the element M is Al, Ga, Y, or Sn.

11. The semiconductor device according to claim 6,
wherein the second insulator comprises an oxide comprising one of or both aluminum and hafnium.

12. A semiconductor device comprising:
a first oxide comprising:
   a first region; and
   a second region and a third region with the first region sandwiched between the second region and the third region;
a second oxide over the first region;
a first insulator over the second oxide;
a first conductor over the first insulator;
a second insulator over the second oxide and on side surfaces of the first insulator and the first conductor;
a third insulator over the second region and on a side surface of the second insulator;
a second conductor over the second region with the third insulator positioned between the second region and the second conductor and on the side surface of the second insulator with the third insulator positioned between the side surface of the second insulator and the second conductor; and
a fourth insulator covering the first oxide, the second oxide, the first insulator, the first conductor, the second insulator, the third insulator, and the second conductor and in contact with the third region.

13. The semiconductor device according to claim 12,
wherein a carrier density of the first region is lower than a carrier density of the third region.

14. The semiconductor device according to claim 12,
wherein the first oxide comprises In, an element M, and Zn, and
wherein the element M is Al, Ga, Y, or Sn.

15. The semiconductor device according to claim 12,
wherein the second oxide comprises In, an element M, and Zn, and
wherein the element M is Al, Ga, Y, or Sn.

16. The semiconductor device according to claim 12,
wherein the second insulator comprises an oxide comprising one of or both aluminum and hafnium.

17. A semiconductor device comprising:
a transistor;
a capacitor;
a first oxide comprising:
   a first region; and
   a second region and a third region with the first region sandwiched between the second region and the third region;
a second oxide over the first region;
a first insulator over the second oxide;
a first conductor over the first insulator;
a second insulator over the second oxide and on side surfaces of the first insulator and the first conductor;
a third insulator over the second region and on a side surface of the second insulator;
a second conductor over the second region with the third insulator positioned between the second region and the second conductor and on the side surface of the second insulator with the third insulator positioned between the side surface of the second insulator and the second conductor; and
a fourth insulator covering the first oxide, the second oxide, the first insulator, the first conductor, the second insulator, the third insulator, and the second conductor and in contact with the third region,
wherein part of the first region serves as a channel formation region of the transistor,
wherein the first insulator serves as a gate insulating film of the transistor, wherein the first conductor serves as a gate electrode of the transistor,
wherein the second region serves as a first electrode of the capacitor,
wherein the third insulator serves as a dielectric of the capacitor, and
wherein the second conductor serves as a second electrode of the capacitor.

18. The semiconductor device according to claim 17,
wherein a carrier density of the first region is lower than a carrier density of the third region.

19. The semiconductor device according to claim 17,
wherein the first oxide comprises In, an element M, and Zn, and
wherein the element M is Al, Ga, Y, or Sn.

20. The semiconductor device according to claim 17,
wherein the second oxide comprises In, an element M, and Zn, and
wherein the element M is Al, Ga, Y, or Sn.

21. The semiconductor device according to claim 17,
wherein the second insulator comprises an oxide comprising one of or both aluminum and hafnium.

* * * * *